US011367783B2

(12) United States Patent
Yeh

(10) Patent No.: US 11,367,783 B2
(45) Date of Patent: Jun. 21, 2022

(54) METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventor: Ling-Yen Yeh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/104,642

(22) Filed: Aug. 17, 2018

(65) Prior Publication Data
US 2020/0058772 A1 Feb. 20, 2020

(51) Int. Cl.
*H01L 29/06* (2006.01)
*H01L 29/66* (2006.01)
(Continued)

(52) U.S. Cl.
CPC .... *H01L 29/66818* (2013.01); *H01L 21/3081* (2013.01); *H01L 21/3085* (2013.01); *H01L 29/0673* (2013.01); *H01L 29/42392* (2013.01); *H01L 29/7853* (2013.01); *H01L 21/02238* (2013.01); *H01L 21/02252* (2013.01); *H01L 21/02255* (2013.01); *H01L 21/30604* (2013.01); *H01L 21/311* (2013.01)

(58) Field of Classification Search
CPC ......... H01L 29/66818; H01L 29/66795; H01L 29/42392; H01L 29/7853; H01L 29/0673; H01L 29/0669
See application file for complete search history.

(56) References Cited

U.S. PATENT DOCUMENTS 8,969,148 B2 * 3/2015 Vinet .................... B82Y 10/00
438/197
9,324,869 B1 * 4/2016 Yan ..................... H01L 29/7853
(Continued)

FOREIGN PATENT DOCUMENTS

CN 104078324 A 10/2014
CN 106033769 A 10/2016
(Continued)

OTHER PUBLICATIONS

Ng, R. M. Y. et al. Vertically Stacked Silicon Nanowire Transistors Fabricated by Inductive Plasma Etching and Stress-Limited Oxidation,; IEEE Electron Device Letters, vol. 30, No. 5. May 2009; pp. 520-522.
(Continued)

*Primary Examiner* — Michele Fan
(74) *Attorney, Agent, or Firm* — McDermott Will & Emery LLP

(57) ABSTRACT

In a method of manufacturing a semiconductor device, a fin structure is formed over a substrate. The fin structure is sculpted to have a plurality of non-etched portions and a plurality of etched portions having a narrower width than the plurality of non-etched portions. The sculpted fin structure is oxidized so that a plurality of nanowires are formed in the plurality of non-etched portions, respectively, and the plurality of etched portions are oxidized to form oxides. The plurality of nanowires are released by removing the oxides.

20 Claims, 47 Drawing Sheets

(51) Int. Cl.
*H01L 29/78* (2006.01)
*H01L 21/308* (2006.01)
*H01L 29/423* (2006.01)
H01L 21/311 (2006.01)
H01L 21/306 (2006.01)
H01L 21/02 (2006.01)

(56) References Cited

U.S. PATENT DOCUMENTS

| | | | |
|---|---|---|---|
| 9,508,795 B2* | 11/2016 | Wong | H01L 29/0673 |
| 9,530,841 B1 | 12/2016 | Yang | |
| 9,601,379 B1 | 3/2017 | Pawlak et al. | |
| 2007/0075372 A1 | 4/2007 | Terashima et al. | |
| 2012/0138886 A1* | 6/2012 | Kuhn | B82Y 10/00 257/9 |
| 2012/0319178 A1* | 12/2012 | Chang | B82Y 10/00 257/287 |
| 2013/0234215 A1 | 9/2013 | Okano | |
| 2015/0104918 A1* | 4/2015 | Liu | H01L 29/42392 438/283 |
| 2015/0228480 A1 | 8/2015 | Yin et al. | |
| 2015/0236051 A1* | 8/2015 | Loubet | H01L 27/1211 257/347 |
| 2015/0340490 A1* | 11/2015 | An | H01L 29/785 257/401 |
| 2015/0372104 A1 | 12/2015 | Liu et al. | |
| 2016/0071945 A1* | 3/2016 | Wang | H01L 29/42392 257/347 |
| 2016/0111544 A1* | 4/2016 | Cheng | H01L 29/7853 257/192 |
| 2016/0233317 A1 | 8/2016 | Yin et al. | |
| 2016/0268376 A1 | 9/2016 | Shih | |
| 2017/0104061 A1* | 4/2017 | Peng | H01L 29/78696 |
| 2017/0104062 A1 | 4/2017 | Bi et al. | |
| 2017/0117360 A1 | 4/2017 | Ando et al. | |
| 2017/0133377 A1* | 5/2017 | Glass | H01L 29/66545 |
| 2017/0154973 A1 | 6/2017 | Ching et al. | |
| 2017/0162579 A1* | 6/2017 | Choi | H01L 27/10802 |
| 2017/0194479 A1 | 7/2017 | Lee et al. | |
| 2017/0271514 A1* | 9/2017 | Kittl | H01L 29/7848 |
| 2018/0163130 A1* | 6/2018 | Kim | H01L 29/66 |
| 2018/0182868 A1* | 6/2018 | Chan | H01L 29/775 |
| 2018/0212066 A1 | 7/2018 | Cheng et al. | |
| 2019/0115424 A1* | 4/2019 | Park | H01L 29/0642 |

FOREIGN PATENT DOCUMENTS

| | | |
|---|---|---|
| CN | 103730366 B | 7/2018 |
| KR | 10-2017-0082302 A | 7/2017 |
| TW | 201724278 A | 7/2017 |
| TW | 201725630 A | 7/2017 |
| TW | 201729348 A | 8/2017 |
| TW | 201820634 A | 6/2018 |

OTHER PUBLICATIONS

Sacchetto, D. et al. "Fabrication and Characterization of Vertically Stacked Gate-All-Around Si Nanowire FET Arrays," IEEE; 2009 Proceedings of the European Solid State Device Research Conference, Sep. 14-18, 2009, Athens, Greece; pp. 245-248; available at https://ieeexplore.ieee.org/abstract/document/5331516.

German Office Action issued in German Patent Application No. 10 2018 122 810.4, dated Apr. 26, 2019.

Non-Final Office Action issued in related U.S. Appl. No. 16/203,378, dated Oct. 22, 2019.

Non-Final Office Action issued in related U.S. Appl. No. 16/203,378, dated Aug. 10, 2020.

* cited by examiner

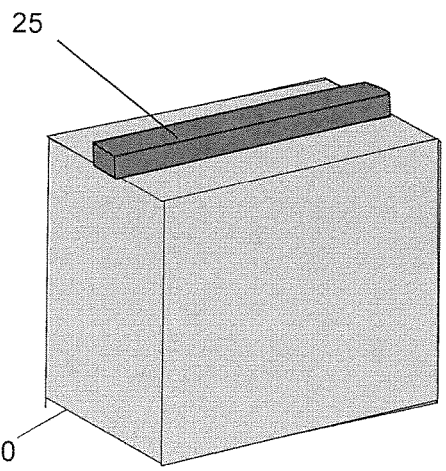
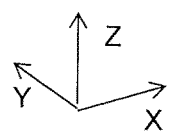
FIG. 1
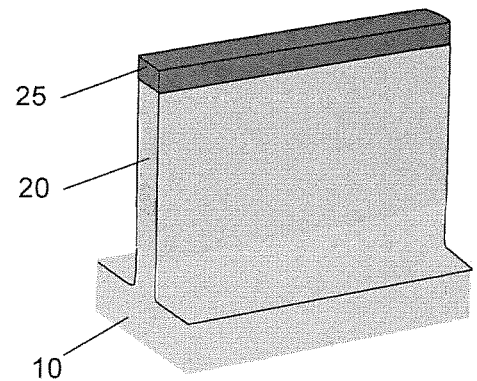
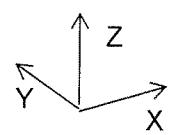
FIG. 2
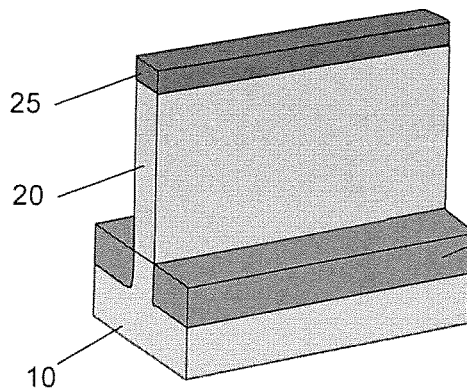
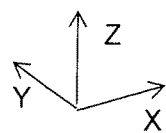
FIG. 3
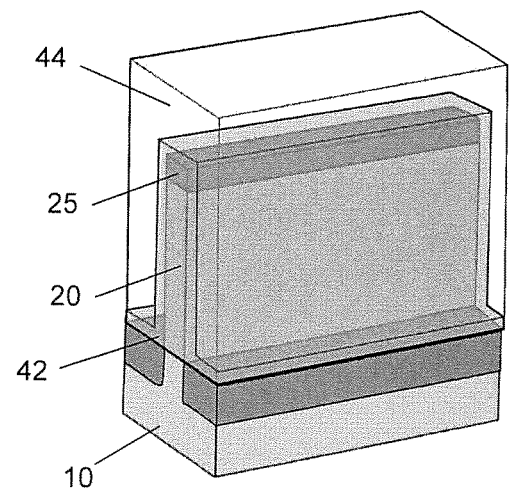
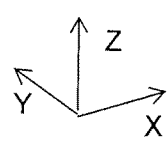
FIG. 4

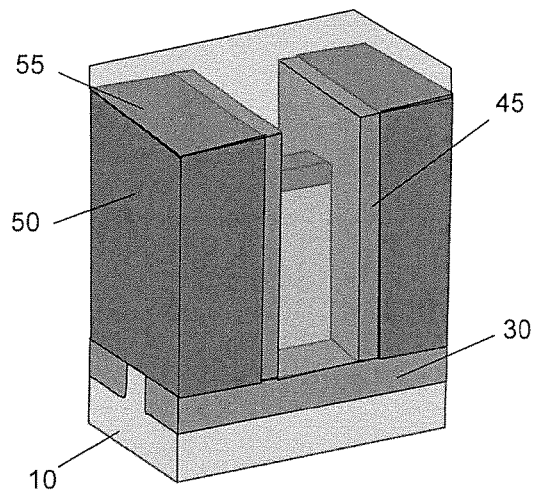
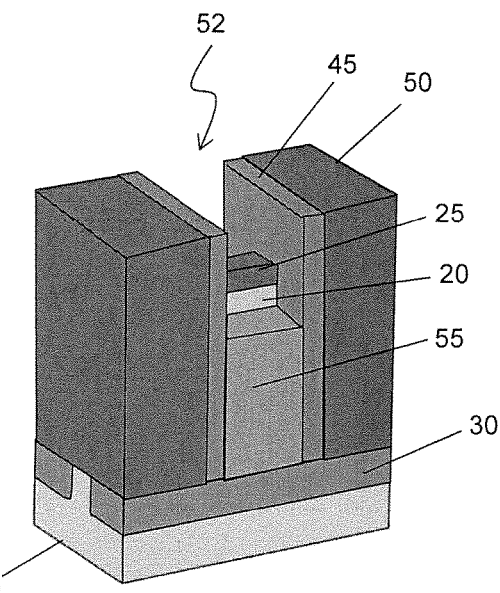
FIG. 11A
FIG. 12A
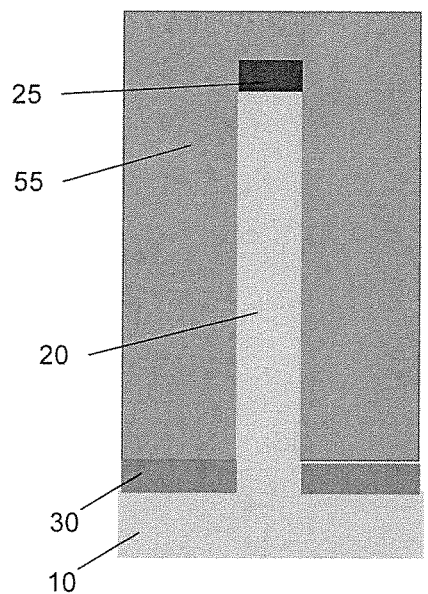
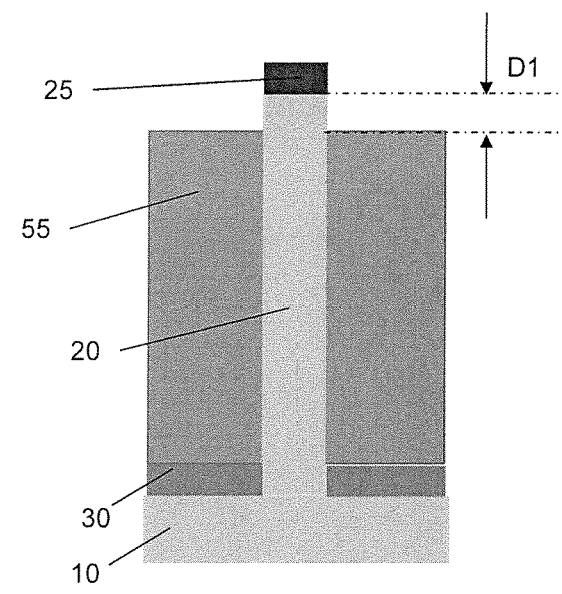
FIG. 11B
FIG. 12B

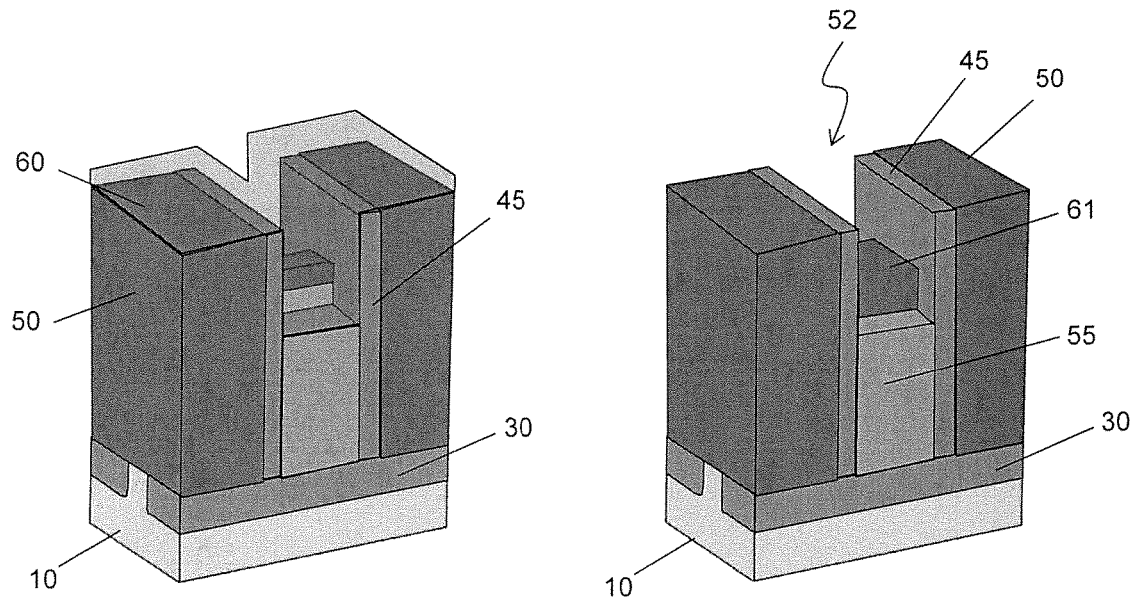
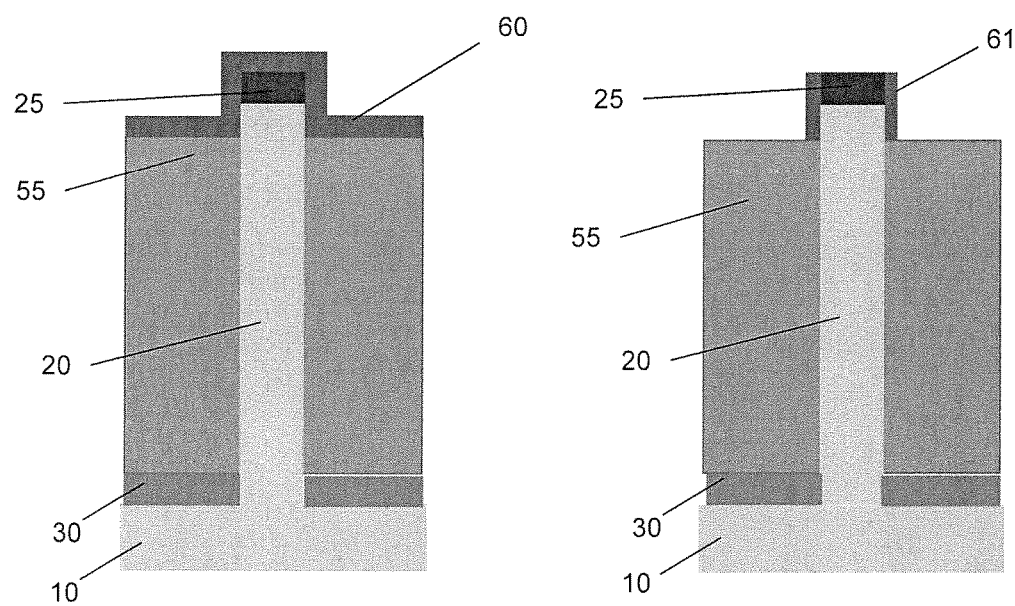
FIG. 13A  FIG. 14A
FIG. 13B  FIG. 14B

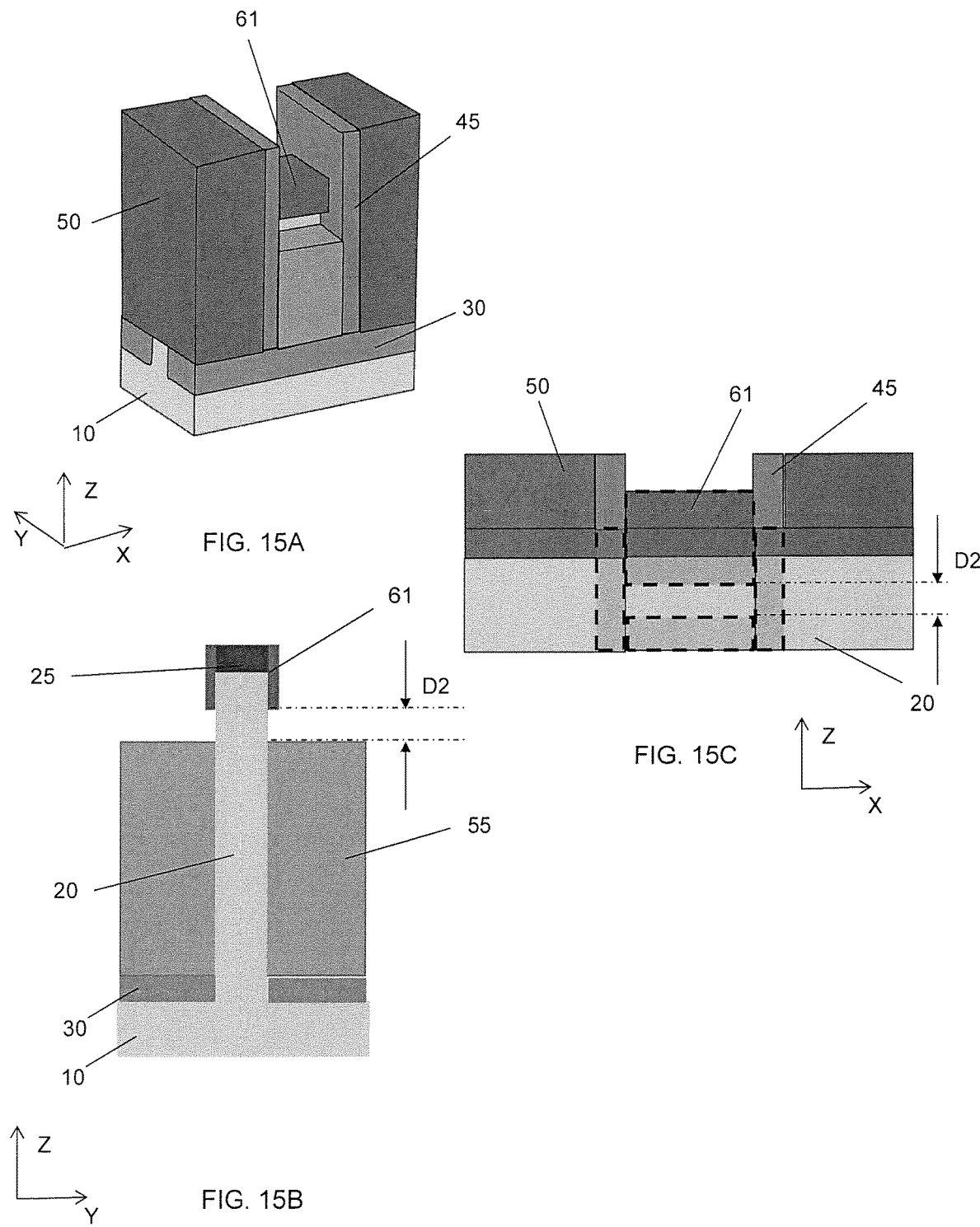

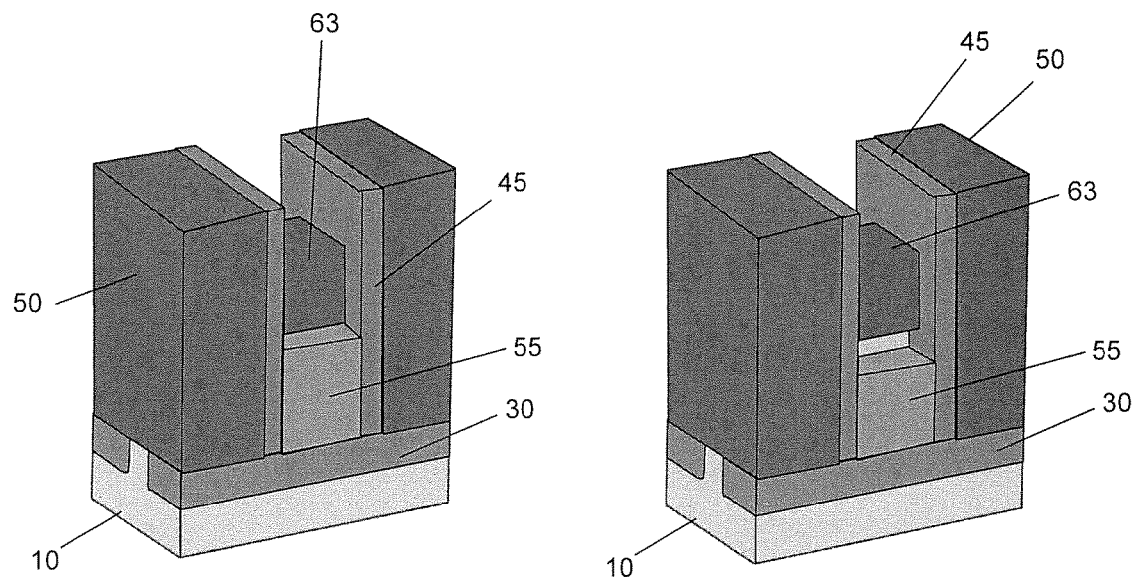
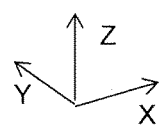 FIG. 19A  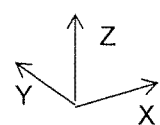 FIG. 20A
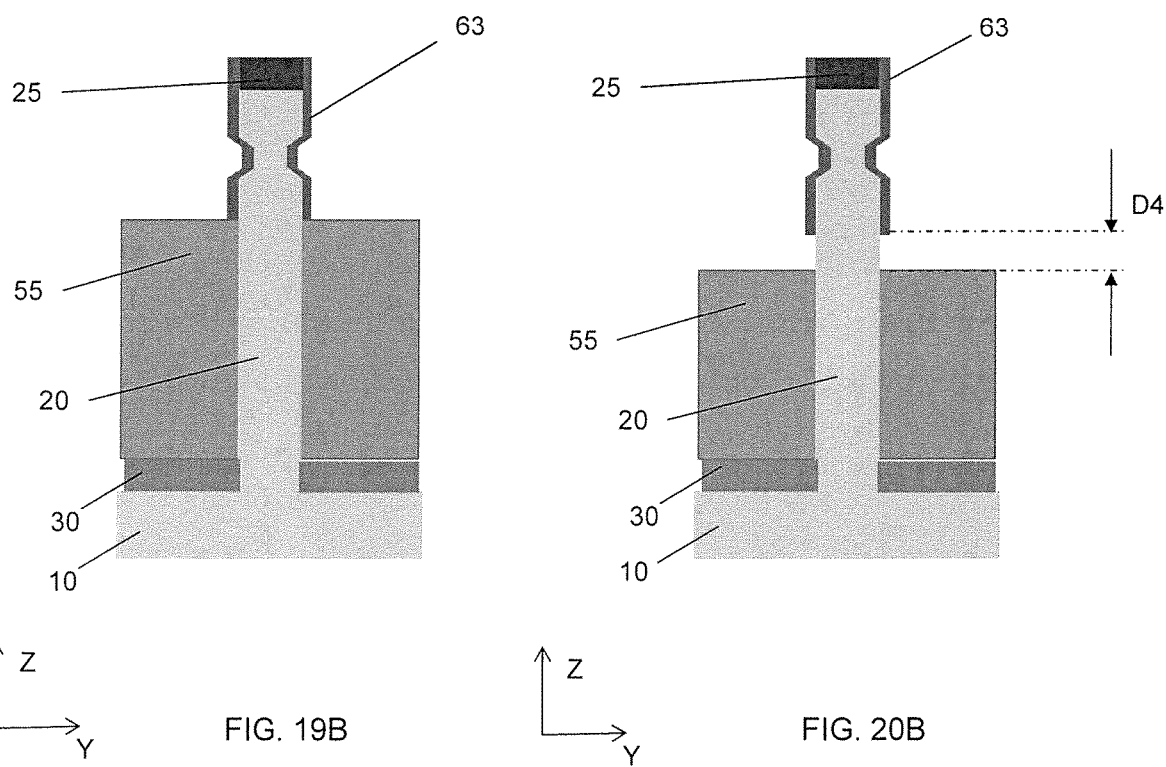
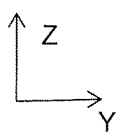 FIG. 19B  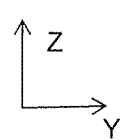 FIG. 20B

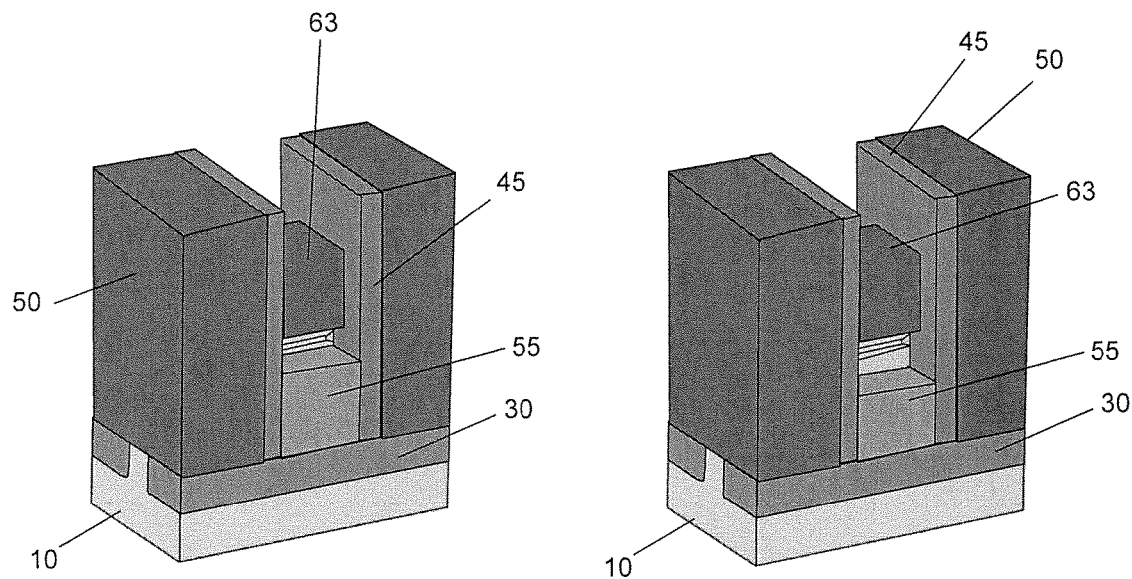
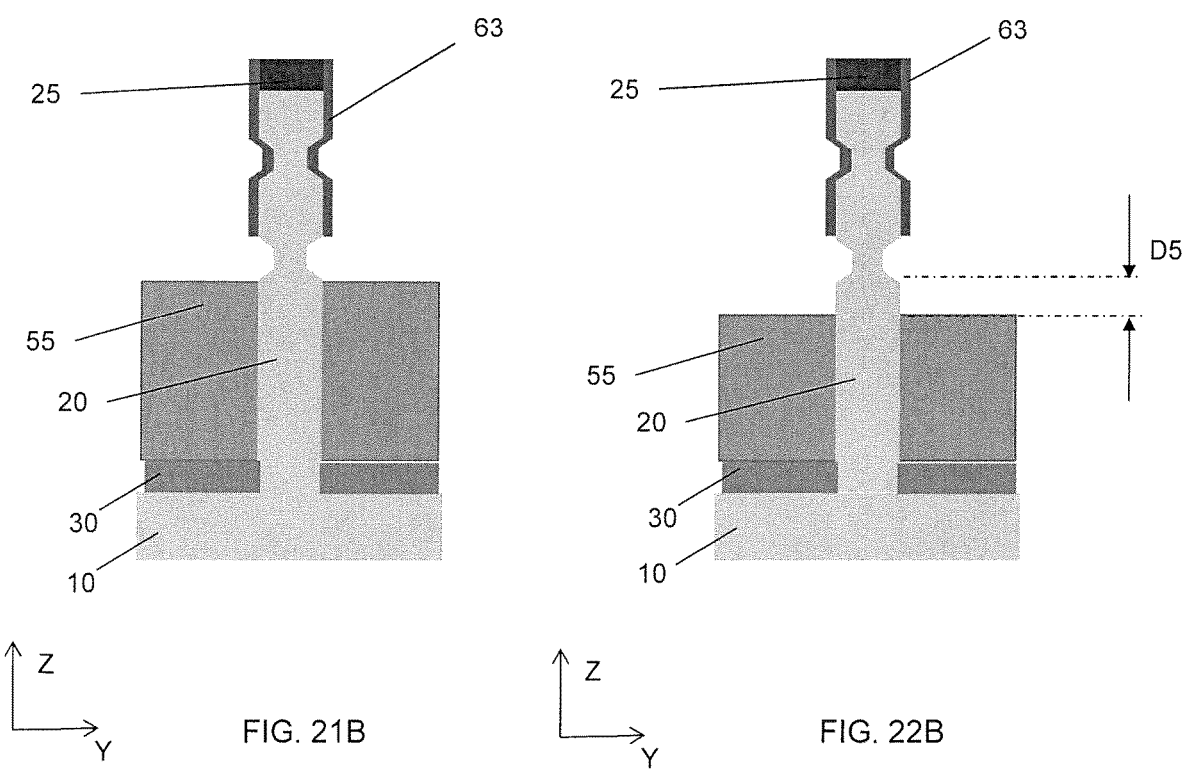

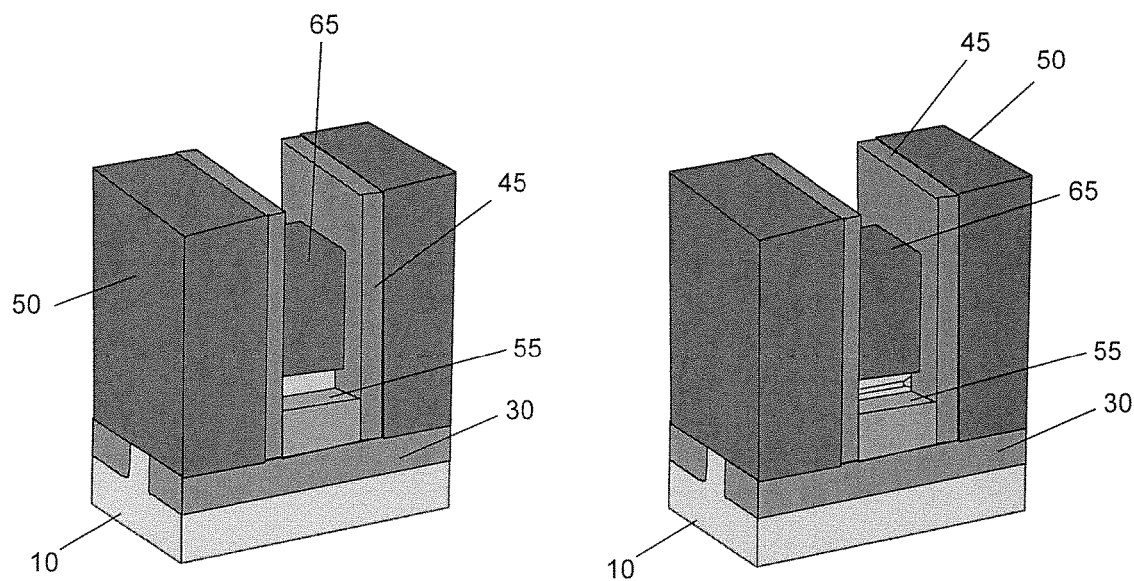
FIG. 25A
FIG. 26A
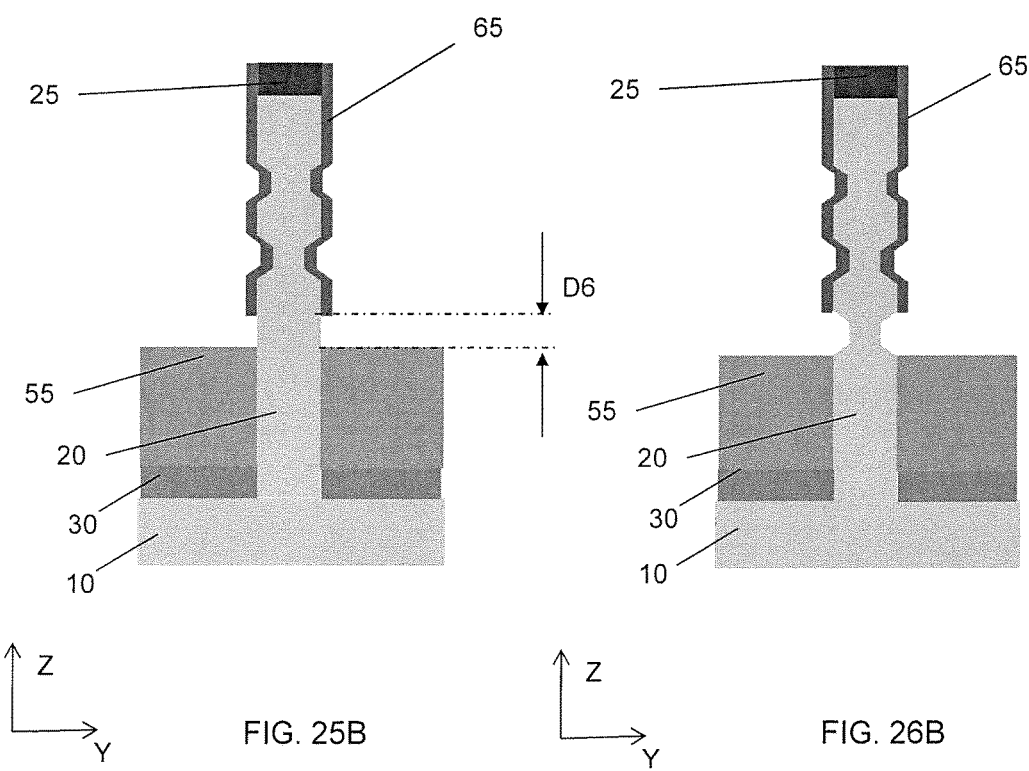
FIG. 25B
FIG. 26B

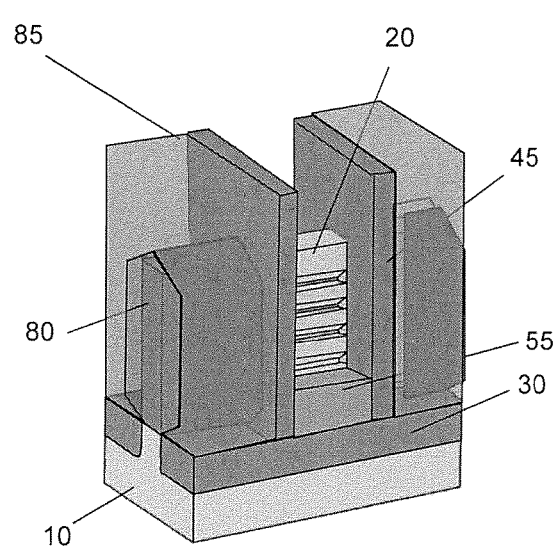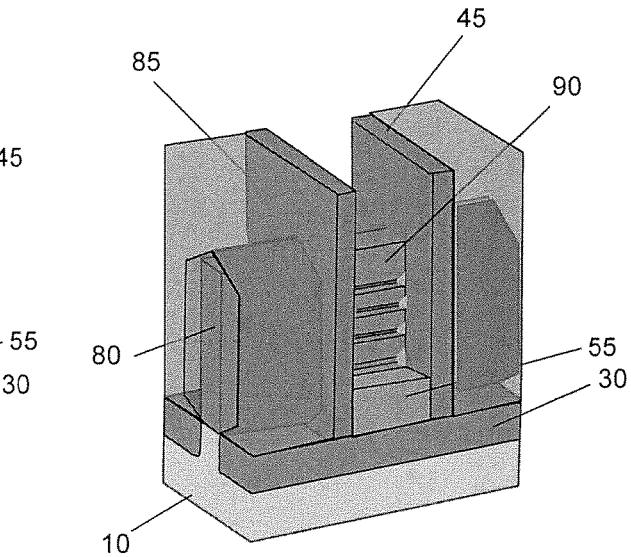
FIG. 31A  FIG. 32A
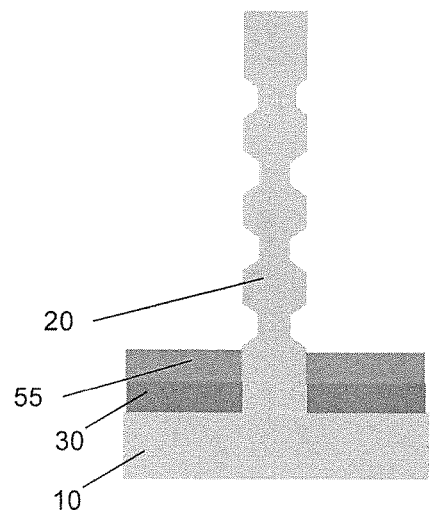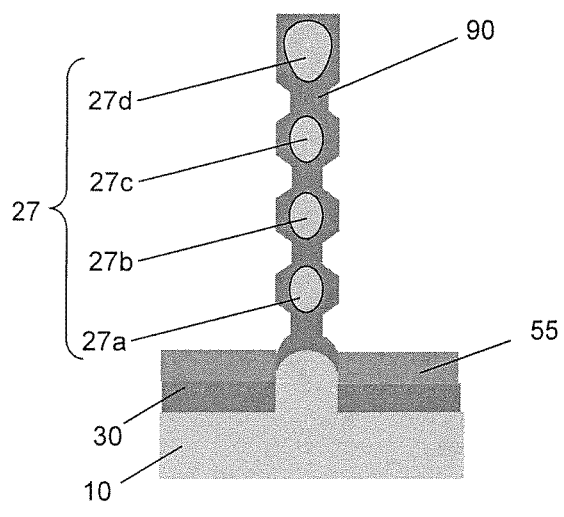
FIG. 31B  FIG. 32B

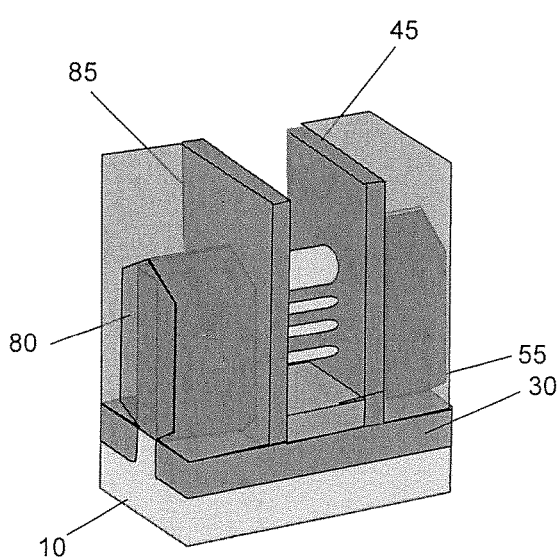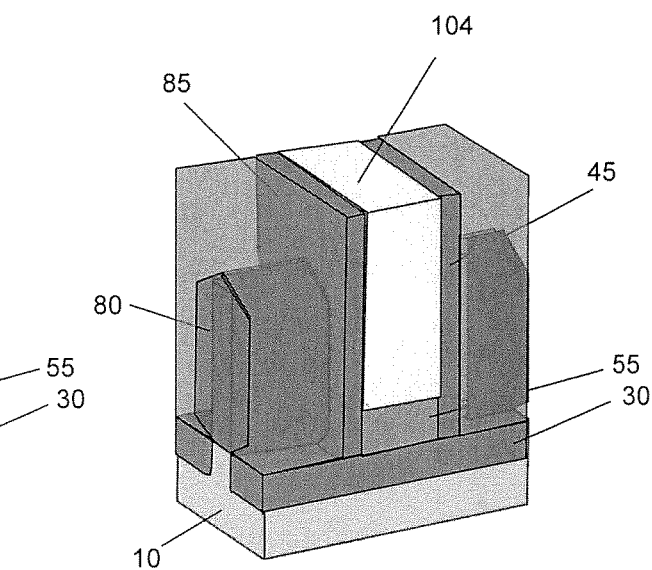
FIG. 33A        FIG. 34A
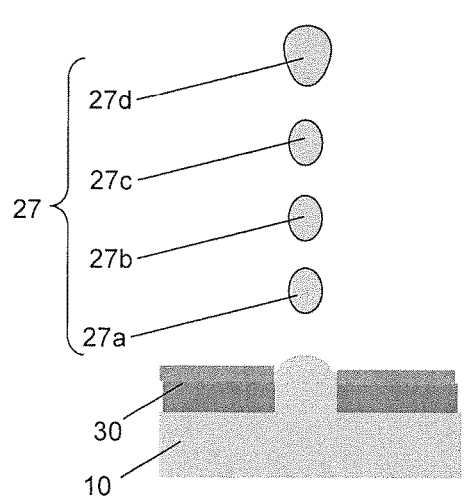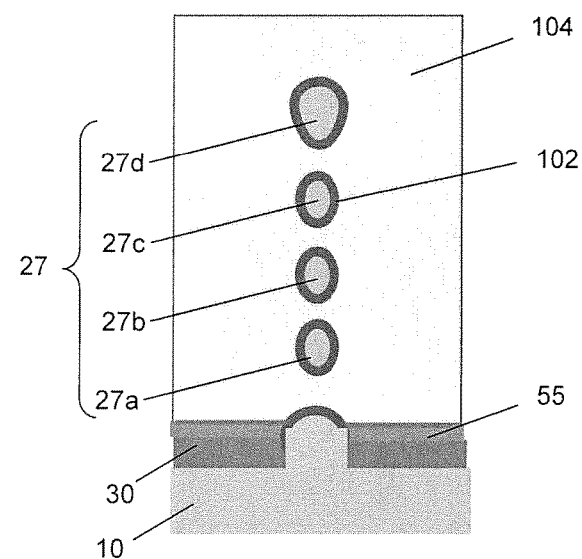
FIG. 33B        FIG. 34B

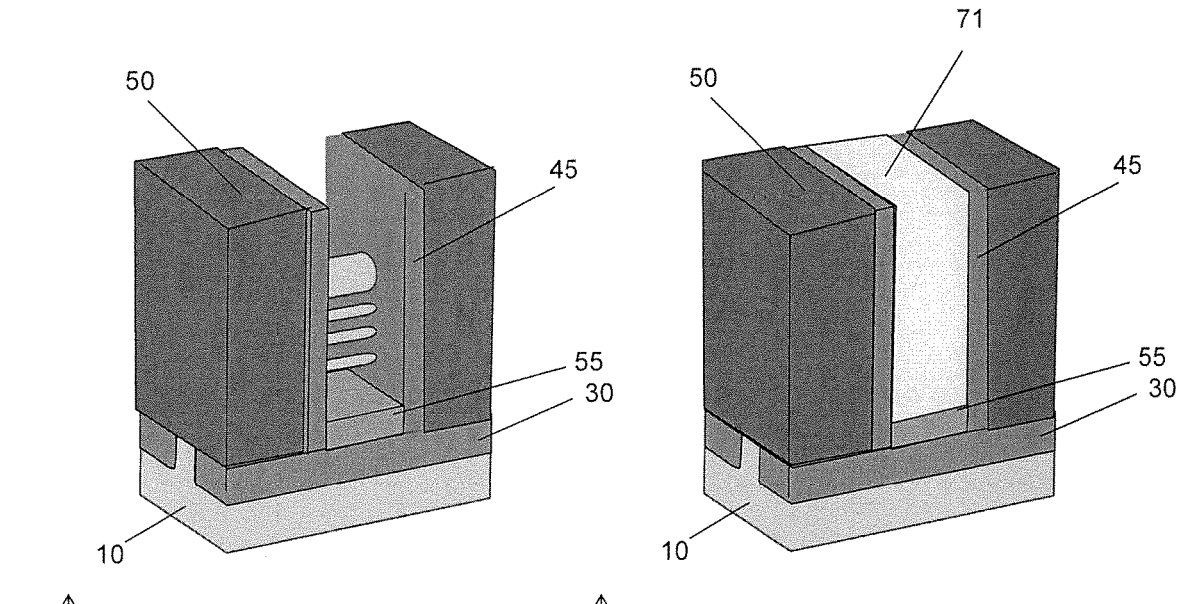
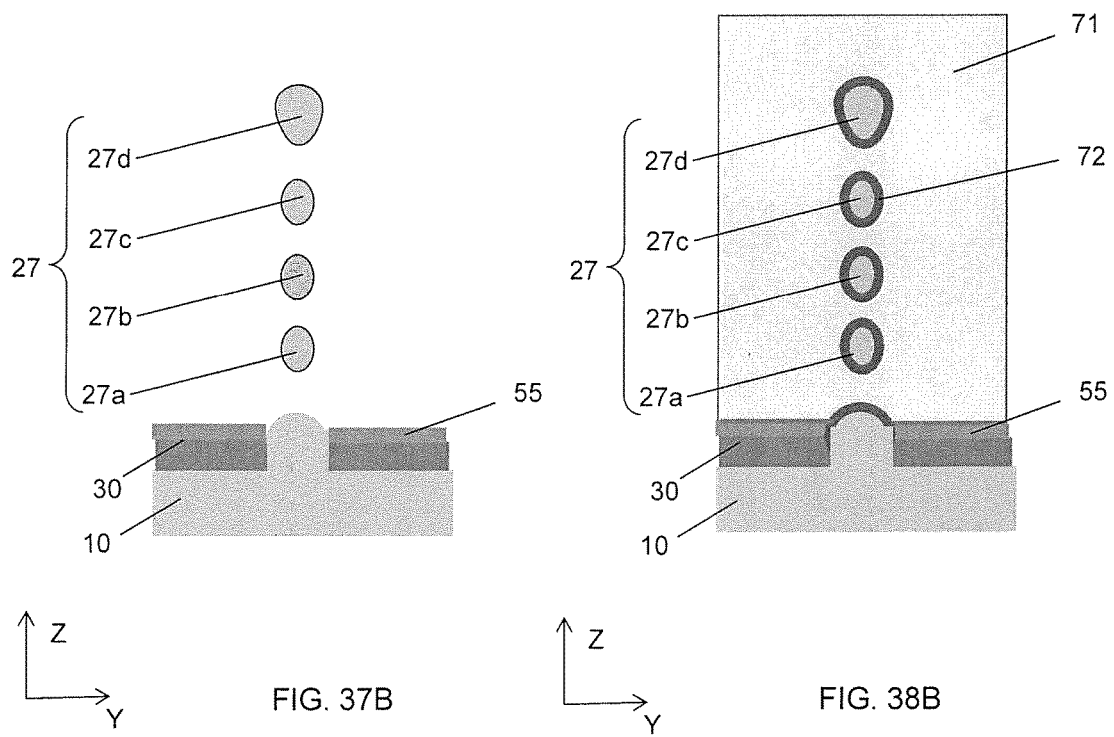

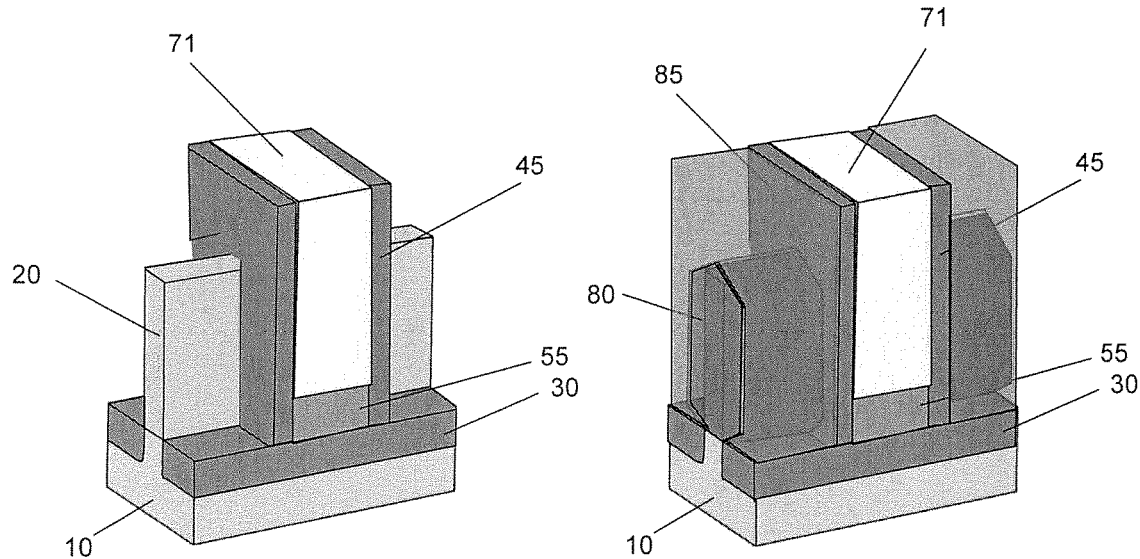
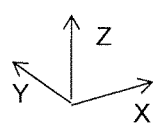 FIG. 39A 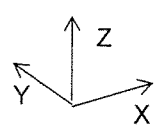 FIG. 40A
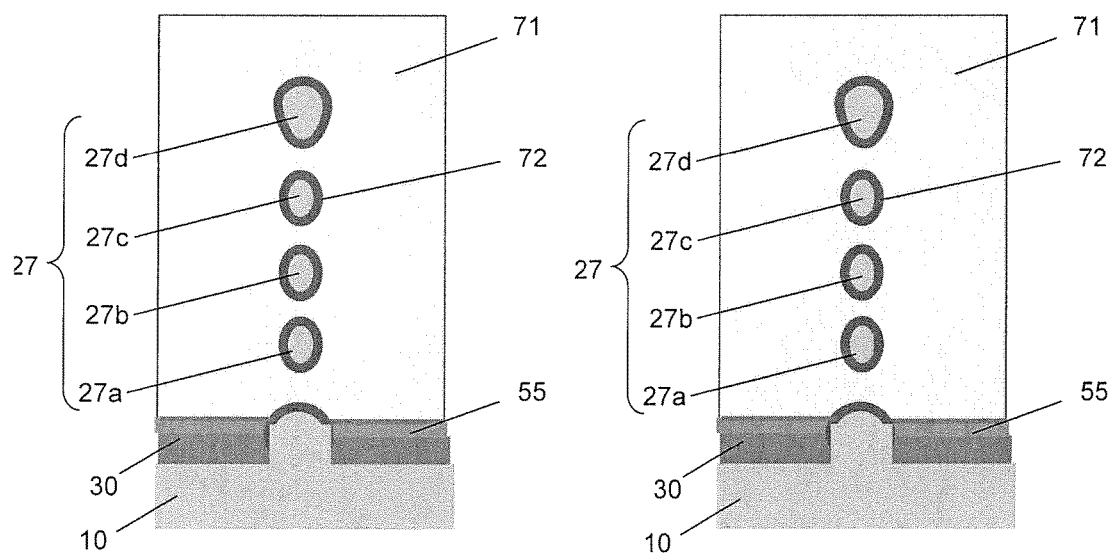
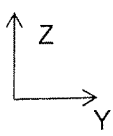 FIG. 39B 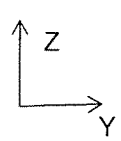 FIG. 40B

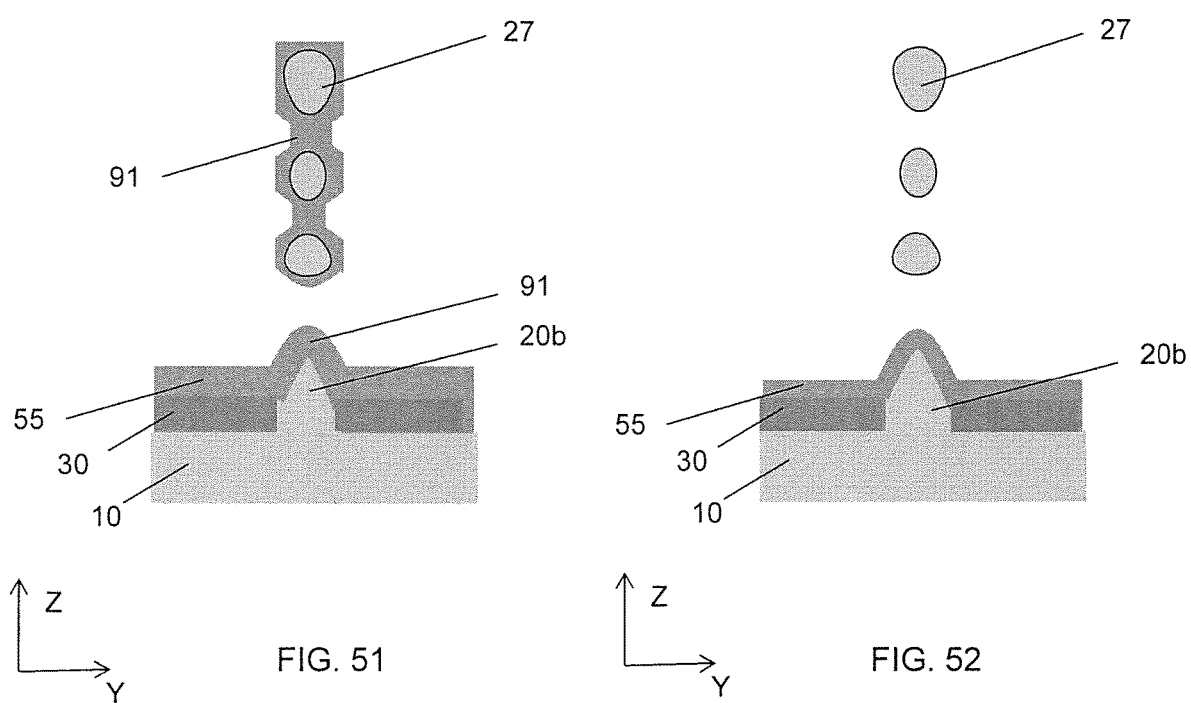

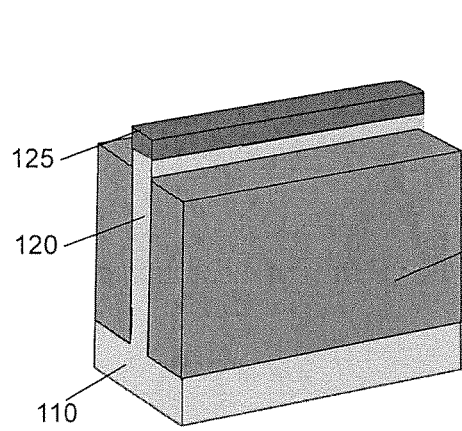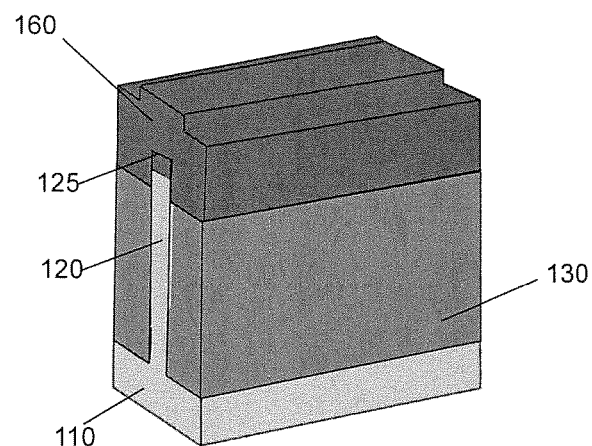
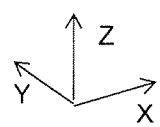 FIG. 55A  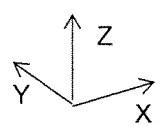 FIG. 56A
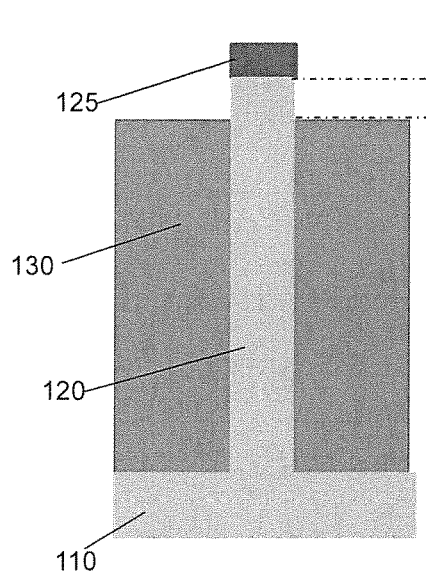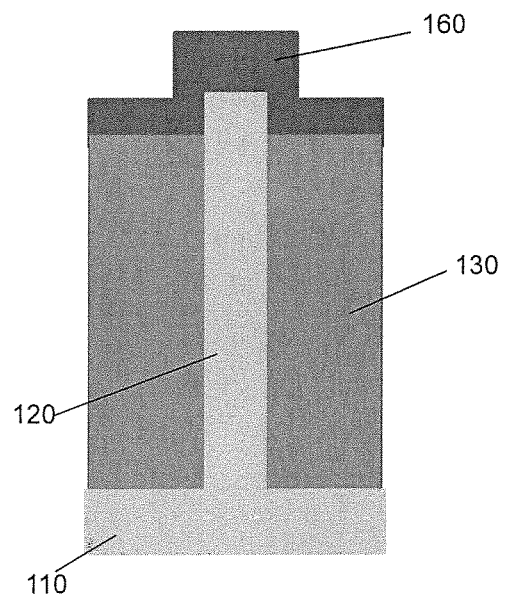
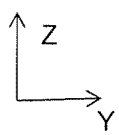 FIG. 55B  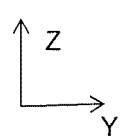 FIG. 56B

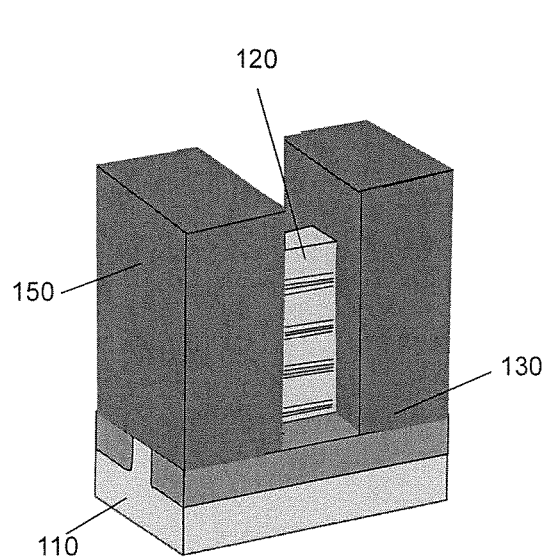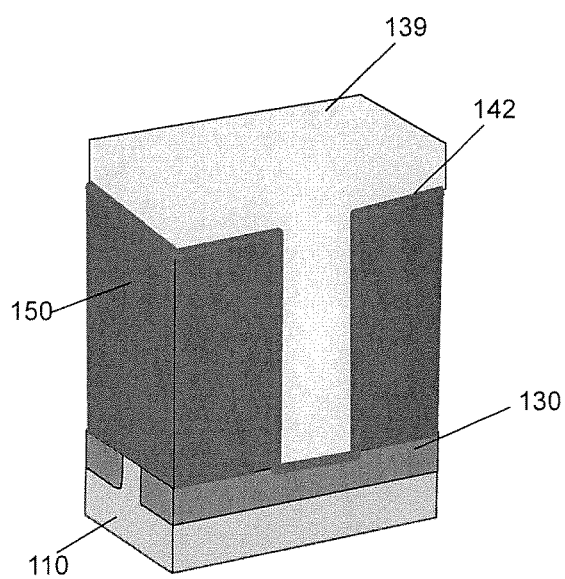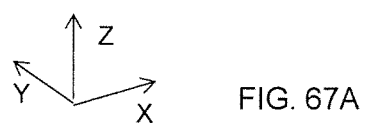
FIG. 67A
FIG. 68A
FIG. 67B
FIG. 68B

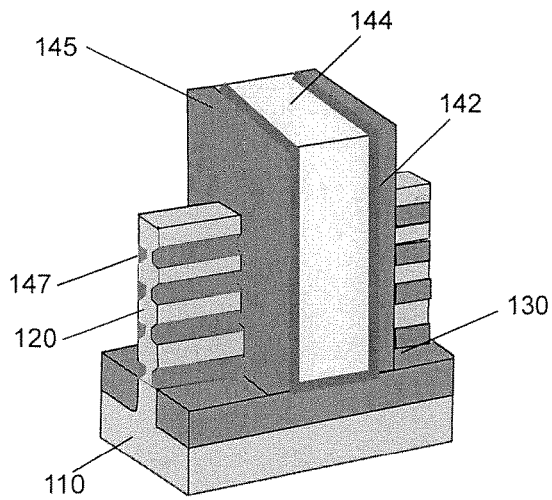 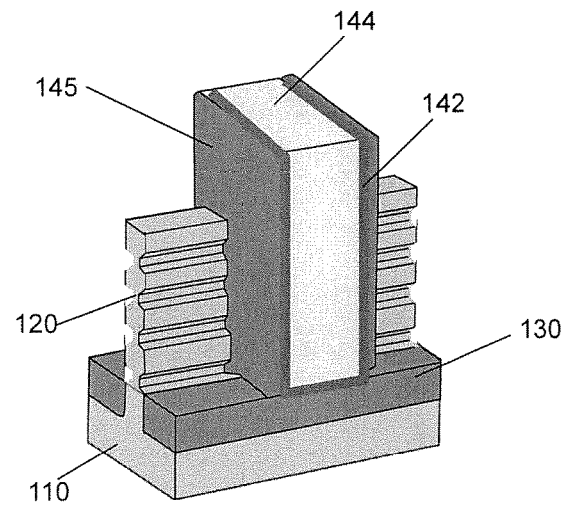
FIG. 71A    FIG. 72A
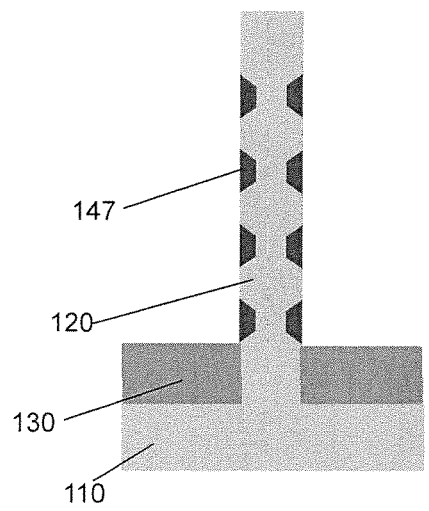 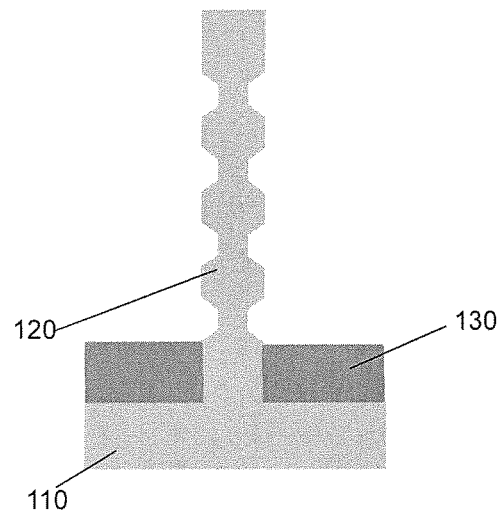
FIG. 71B    FIG. 72B

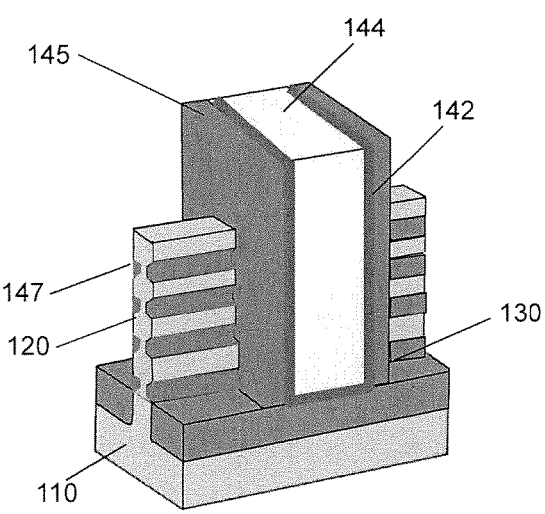 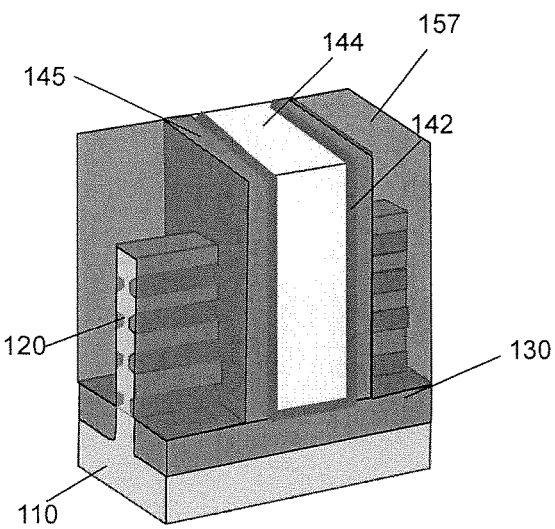
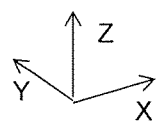 FIG. 79A 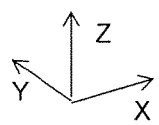 FIG. 80A
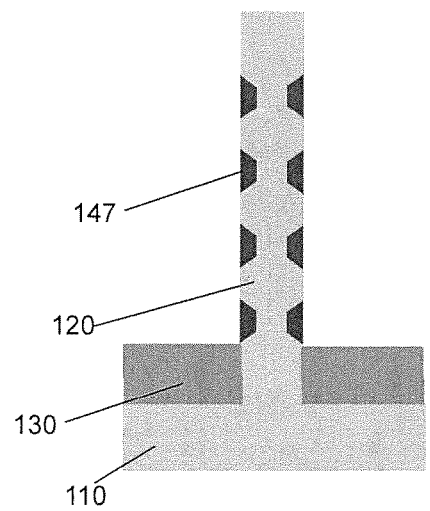 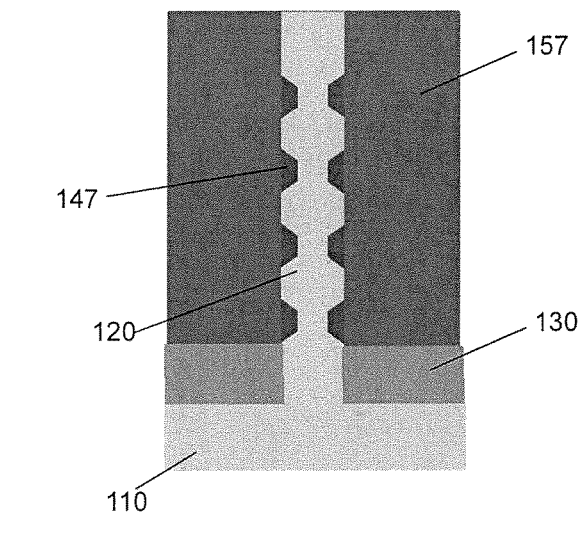
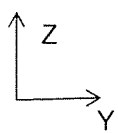 FIG. 79B 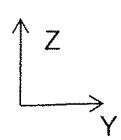 FIG. 80B

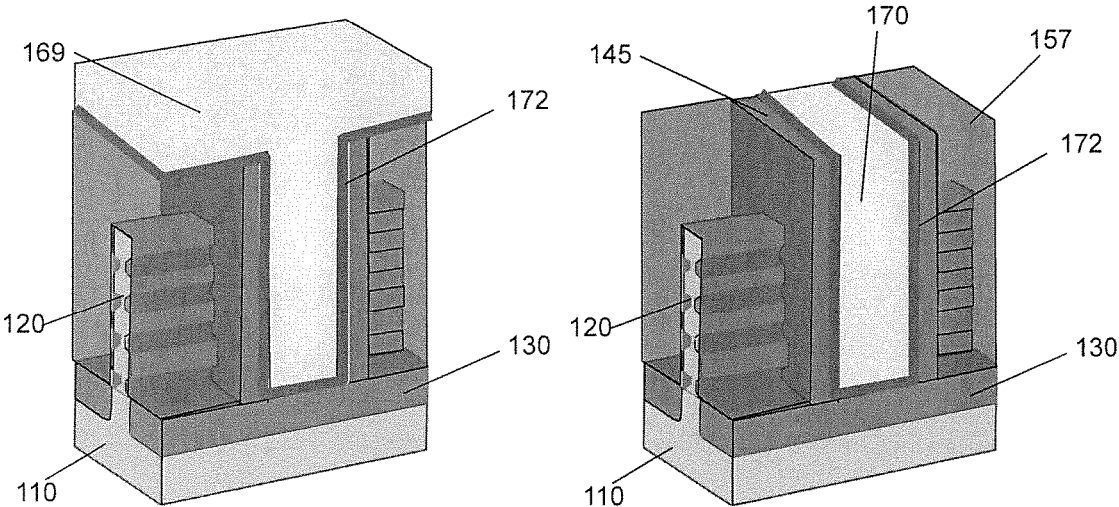
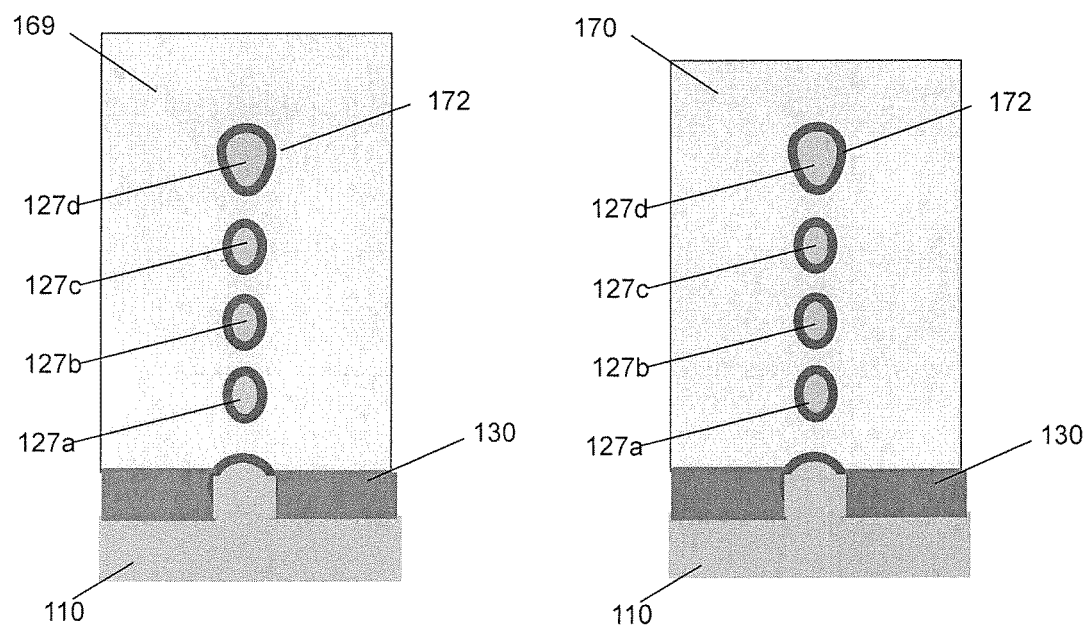
FIG. 83A  FIG. 84A
FIG. 83B  FIG. 84B

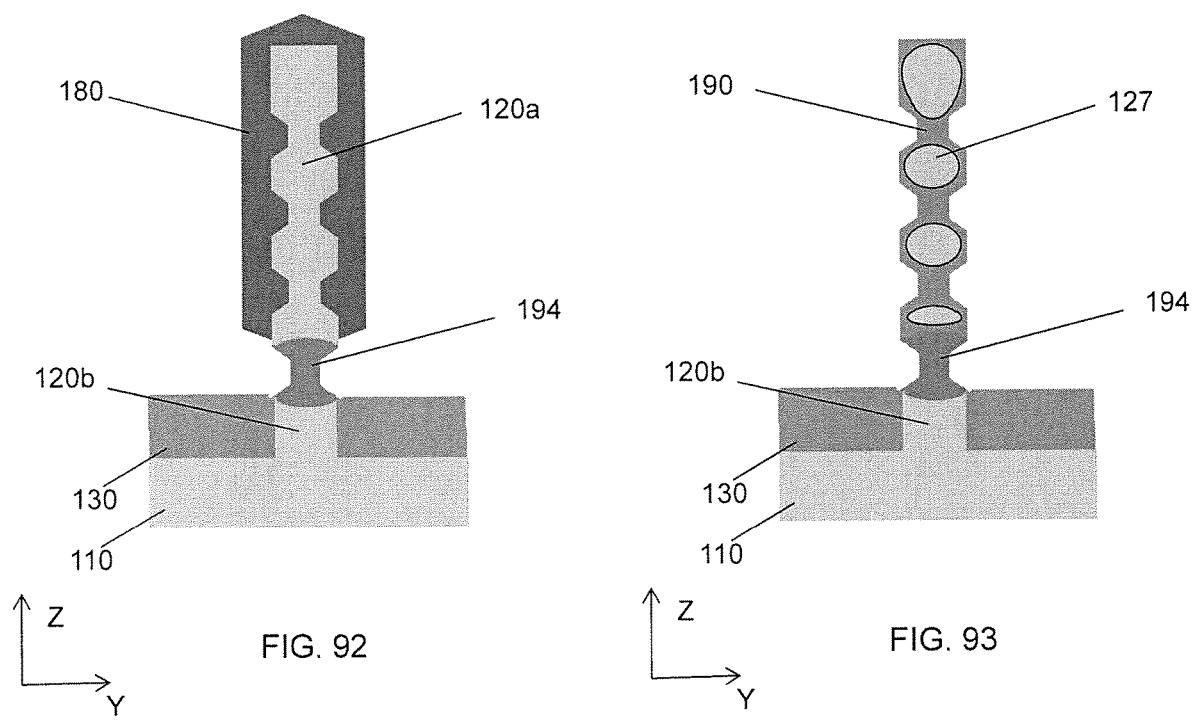

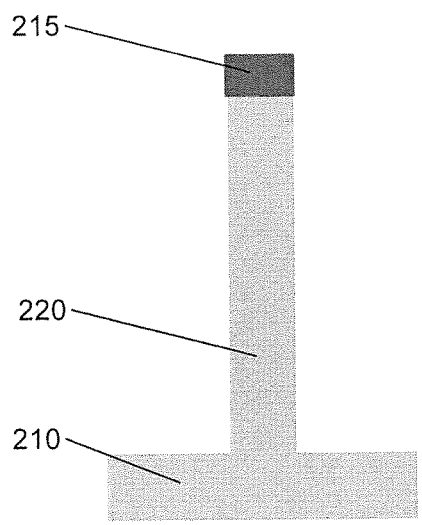
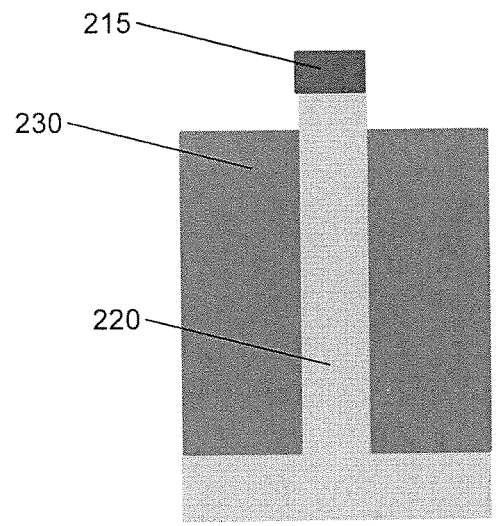
FIG. 94
FIG. 95
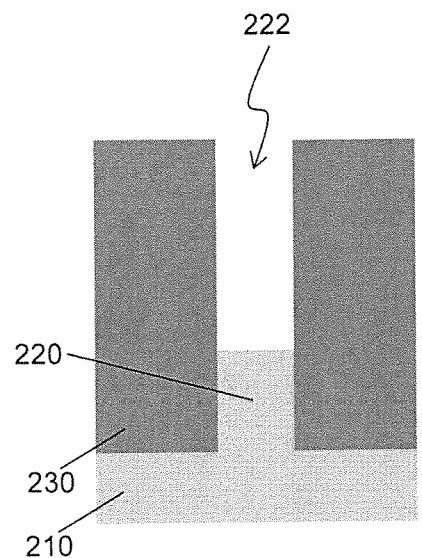
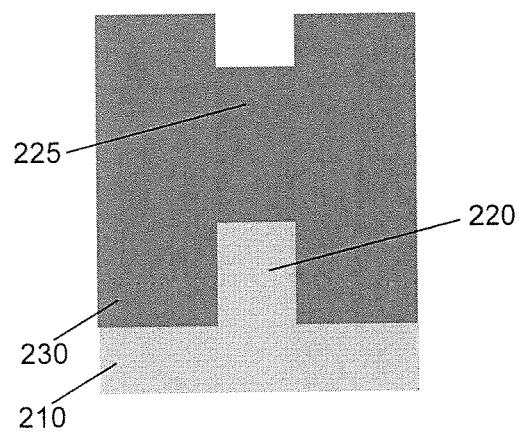
FIG. 96
FIG. 97

METHOD OF MANUFACTURING A SEMICONDUCTOR DEVICE

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 shows one of the various stages of manufacturing a semiconductor FET device according to embodiments of the present disclosure.

FIG. 2 shows one of the various stages of manufacturing a semiconductor FET device according to embodiments of the present disclosure.

FIG. 3 shows one of the various stages of manufacturing a semiconductor FET device according to embodiments of the present disclosure.

FIG. 4 shows one of the various stages of manufacturing a semiconductor FET device according to embodiments of the present disclosure.

FIG. 9A is a perspective view and FIG. 9B is a cross sectional view along the Y direction.

FIG. 10A is a perspective view and FIG. 10B is a cross sectional view along the Y direction.

FIGS. 11A and 11B show one of the various stages of manufacturing a semiconductor FET device according to embodiments of the present disclosure. FIG. 11A is a perspective view and FIG. 11B is a cross sectional view along the Y direction.

FIGS. 12A and 12B show one of the various stages of manufacturing a semiconductor FET device according to embodiments of the present disclosure. FIG. 12A is a perspective view and FIG. 12B is a cross sectional view along the Y direction.

FIGS. 13A and 13B show one of the various stages of manufacturing a semiconductor FET device according to embodiments of the present disclosure. FIG. 13A is a perspective view and FIG. 13B is a cross sectional view along the Y direction.

FIGS. 14A and 14B show one of the various stages of manufacturing a semiconductor FET device according to embodiments of the present disclosure. FIG. 14A is a perspective view and FIG. 14B is a cross sectional view along the Y direction.

FIGS. 15A-15C show one of the various stages of manufacturing a semiconductor FET device according to embodiments of the present disclosure. FIG. 15A is a perspective view, FIG. 15B is a cross sectional view along the Y direction and FIG. 15C is a cross sectional view along the X direction.

FIG. 16A is a perspective view, FIG. 16B is a cross sectional view along the Y direction and FIG. 16C is a cross sectional view along the X direction.

FIG. 17A is a perspective view, FIG. 17B is a cross sectional view along the Y direction and FIG. 17C is a cross sectional view along the X direction.

FIG. 18A is a perspective view, FIG. 18B is a cross sectional view along the Y direction and FIG. 18C is a cross sectional view along the X direction.

FIGS. 19A and 19B show one of the various stages of manufacturing a semiconductor FET device according to embodiments of the present disclosure. FIG. 19A is a perspective view and FIG. 19B is a cross sectional view along the Y direction.

FIGS. 20A and 20B show one of the various stages of manufacturing a semiconductor FET device according to embodiments of the present disclosure. FIG. 20A is a perspective view and FIG. 20B is a cross sectional view along the Y direction.

FIGS. 21A and 21B show one of the various stages of manufacturing a semiconductor FET device according to embodiments of the present disclosure. FIG. 21A is a perspective view and FIG. 21B is a cross sectional view along the Y direction.

FIGS. 22A and 22B show one of the various stages of manufacturing a semiconductor FET device according to embodiments of the present disclosure. FIG. 22A is a perspective view and FIG. 22B is a cross sectional view along the Y direction.

FIG. 23A is a perspective view and FIG. 23B is a cross sectional view along the Y direction.

FIG. 24A is a perspective view and FIG. 24B is a cross sectional view along the Y direction.

FIGS. 25A and 25B show one of the various stages of manufacturing a semiconductor FET device according to embodiments of the present disclosure. FIG. 25A is a perspective view and FIG. 25B is a cross sectional view along the Y direction.

FIGS. 26A and 26B show one of the various stages of manufacturing a semiconductor FET device according to embodiments of the present disclosure. FIG. 26A is a perspective view and FIG. 26B is a cross sectional view along the Y direction.

FIG. 27A is a perspective view and FIG. 27B is a cross sectional view along the Y direction.

FIG. 28A is a perspective view and FIG. 28B is a cross sectional view along the Y direction.

FIG. 29A is a perspective view and FIG. 29B is a cross sectional view along the Y direction.

FIG. 30A is a perspective view and FIG. 30B is a cross sectional view along the Y direction.

FIGS. 31A and 31B show one of the various stages of manufacturing a semiconductor FET device according to embodiments of the present disclosure. FIG. 31A is a perspective view and FIG. 31B is a cross sectional view along the Y direction.

FIGS. 32A and 32B show one of the various stages of manufacturing a semiconductor FET device according to embodiments of the present disclosure. FIG. 32A is a perspective view and FIG. 32B is a cross sectional view along the Y direction.

FIGS. 33A and 33B show one of the various stages of manufacturing a semiconductor FET device according to embodiments of the present disclosure. FIG. 33A is a perspective view and FIG. 33B is a cross sectional view along the Y direction.

FIGS. 34A and 34B show one of the various stages of manufacturing a semiconductor FET device according to embodiments of the present disclosure. FIG. 34A is a perspective view and FIG. 34B is a cross sectional view along the Y direction.

FIG. 35A is a perspective view and FIG. 35B is a cross sectional view along the Y direction.

FIG. 36A is a perspective view and FIG. 36B is a cross sectional view along the Y direction.

FIGS. 37A and 37B show one of the various stages of manufacturing a semiconductor FET device according to other embodiments of the present disclosure. FIG. 37A is a perspective view and FIG. 37B is a cross sectional view along the Y direction.

FIGS. 38A and 38B show one of the various stages of manufacturing a semiconductor FET device according to other embodiments of the present disclosure. FIG. 38A is a perspective view and FIG. 38B is a cross sectional view along the Y direction.

FIGS. 39A and 39B show one of the various stages of manufacturing a semiconductor FET device according to other embodiments of the present disclosure. FIG. 39A is a perspective view and FIG. 39B is a cross sectional view along the Y direction.

FIGS. 40A and 40B show one of the various stages of manufacturing a semiconductor FET device according to other embodiments of the present disclosure. FIG. 40A is a perspective view and FIG. 40B is a cross sectional view along the Y direction.

FIG. 40A is a perspective view and FIG. 40B is a cross sectional view along the Y direction.

FIG. 51 shows one of the various stages of manufacturing a semiconductor FET device according to other embodiments of the present disclosure.

FIG. 52 shows one of the various stages of manufacturing a semiconductor FET device according to other embodiments of the present disclosure.

FIG. 53A is a perspective view and FIG. 53B is a cross sectional view along the Y direction.

FIG. 54A is a perspective view and FIG. 54B is a cross sectional view along the Y direction.

FIGS. 55A and 55B show one of the various stages of manufacturing a semiconductor FET device according to other embodiments of the present disclosure. FIG. 55A is a perspective view and FIG. 55B is a cross sectional view along the Y direction.

FIGS. 56A and 56B show one of the various stages of manufacturing a semiconductor FET device according to other embodiments of the present disclosure. FIG. 56A is a perspective view and FIG. 56B is a cross sectional view along the Y direction.

FIG. 57A is a perspective view and FIG. 57B is a cross sectional view along the Y direction.

FIG. 58A is a perspective view and FIG. 58B is a cross sectional view along the Y direction.

FIG. 59A is a perspective view and FIG. 59B is a cross sectional view along the Y direction.

FIG. 60A is a perspective view and FIG. 60B is a cross sectional view along the Y direction.

FIG. 61A is a perspective view and FIG. 61B is a cross sectional view along the Y direction.

FIG. 62A is a perspective view and FIG. 62B is a cross sectional view along the Y direction.

FIG. 63A is a perspective view and FIG. 63B is a cross sectional view along the Y direction.

FIG. 64A is a perspective view and FIG. 64B is a cross sectional view along the Y direction.

FIG. 65A is a perspective view and FIG. 65B is a cross sectional view along the Y direction.

FIG. 66A is a perspective view and FIG. 66B is a cross sectional view along the Y direction.

FIGS. 67A and 67B show one of the various stages of manufacturing a semiconductor FET device according to other embodiments of the present disclosure. FIG. 67A is a perspective view and FIG. 67B is a cross sectional view along the Y direction.

FIGS. 68A and 68B show one of the various stages of manufacturing a semiconductor FET device according to other embodiments of the present disclosure. FIG. 68A is a perspective view and FIG. 68B is a cross sectional view along the Y direction.

FIG. 69A is a perspective view and FIG. 69B is a cross sectional view along the Y direction.

FIG. 70A is a perspective view and FIG. 70B is a cross sectional view along the Y direction.

FIGS. 71A and 71B show one of the various stages of manufacturing a semiconductor FET device according to other embodiments of the present disclosure. FIG. 71A is a perspective view and FIG. 71B is a cross sectional view along the Y direction.

FIGS. 72A and 72B show one of the various stages of manufacturing a semiconductor FET device according to other embodiments of the present disclosure. FIG. 72A is a perspective view and FIG. 72B is a cross sectional view along the Y direction.

FIG. 73A is a perspective view and FIG. 73B is a cross sectional view along the Y direction.

FIG. 74A is a perspective view and FIG. 74B is a cross sectional view along the Y direction.

FIG. 75A is a perspective view and FIG. 75B is a cross sectional view along the Y direction.

FIG. 76A is a perspective view and FIG. 76B is a cross sectional view along the Y direction.

FIG. 77A is a perspective view and FIG. 77B is a cross sectional view along the Y direction.

FIGS. 79A and 79B show one of the various stages of manufacturing a semiconductor FET device according to other embodiments of the present disclosure. FIG. 79A is a perspective view and FIG. 79B is a cross sectional view along the Y direction.

FIGS. 80A and 80B show one of the various stages of manufacturing a semiconductor FET device according to other embodiments of the present disclosure. FIG. 80A is a perspective view and FIG. 80B is a cross sectional view along the Y direction.

FIG. 81A is a perspective view and FIG. 81B is a cross sectional view along the Y direction.

FIG. 82A is a perspective view and FIG. 82B is a cross sectional view along the Y direction.

FIGS. 83A and 83B show one of the various stages of manufacturing a semiconductor FET device according to other embodiments of the present disclosure. FIG. 83A is a perspective view and FIG. 83B is a cross sectional view along the Y direction.

FIGS. 84A and 84B show one of the various stages of manufacturing a semiconductor FET device according to other embodiments of the present disclosure. FIG. 84A is a perspective view and FIG. 84B is a cross sectional view along the Y direction.

FIG. 85A is a perspective view and FIG. 85B is a cross sectional view along the Y direction.

FIG. 86A is a perspective view and FIG. 86B is a cross sectional view along the Y direction.

FIG. 87A is a perspective view, and FIGS. 87B and 87C are cross sectional views along the Y direction.

FIG. 92 shows one of the various stages of manufacturing a semiconductor FET device according to other embodiments of the present disclosure.

FIG. 93 shows one of the various stages of manufacturing a semiconductor FET device according to other embodiments of the present disclosure.

FIG. 94 shows one of the various stages of manufacturing a semiconductor FET device according to other embodiments of the present disclosure.

FIG. 95 shows one of the various stages of manufacturing a semiconductor FET device according to other embodiments of the present disclosure.

FIG. 96 shows one of the various stages of manufacturing a semiconductor FET device according to other embodiments of the present disclosure.

FIG. 97 shows one of the various stages of manufacturing a semiconductor FET device according to other embodiments of the present disclosure.

DETAILED DESCRIPTION

Figure 5:
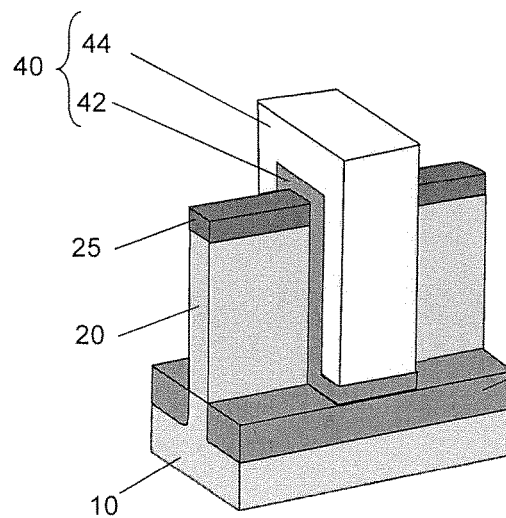
FIG. 5 shows one of the various stages of manufacturing a semiconductor FET device according to embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of."

In the present disclosure, GAA FETs and methods for fabricating the same are provided. In this disclosure, nanowire structures for channel regions are formed without making a stack of semiconductor layers.

FIGS. 1-34B show an exemplary sequential operation for manufacturing the GAA FET according to an embodiment of the present disclosure. It is understood that additional operations can be provided before, during, and after processes shown by FIGS. 1-34B, and some of the operations described below can be replaced or eliminated, for additional embodiments of the method. The order of the operations/processes may be interchangeable.

As shown in FIGS. 1 and 2, a semiconductor fin structure 20 is formed over a semiconductor substrate 10. Although one fin structure 20 is provided over the substrate 10, the number of fin structures is not limited to one, and may be two or more. In some embodiments, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 1 atomic % germanium for the bottom-most buffer layer to 99 atomic % germanium for the top-most buffer layer. In some embodiments, the germanium concentration of the SiGe buffer layers may increase from 30 atomic % germanium for the bottom-most buffer layer to 70 atomic % germanium for the top-most buffer layer.

The fin structure 20 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure.

In some embodiments, a hard mask pattern 25 is formed over the substrate 10 as shown in FIG. 1 and then the substrate 10 is patterned by one or more lithography and etching operations as set forth above.

In some embodiments, the hard mask 25 includes a first mask layer and a second mask layer. The first mask layer is a pad oxide layer made of a silicon oxide, which can be for lied by a thermal oxidation. The second mask layer is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer is patterned into the hard mask pattern 25 by using patterning operations including photo-lithography and etching. As shown in FIG. 2, the fin structure 20 extends in the X direction. In some embodiments, one or more dummy fin structures are formed on both sides of the fin structure 20 to improve pattern fidelity in the patterning operations. The width of the fin structure along the Y direction is in a range from about 10 nm to about 40 nm in some embodiments, and is in a range from about 20 nm to about 30 nm in other embodiments. The height along the Z direction of the fin structure 20 is in a range from about 10 nm to about 200 nm.

After the fin structure 20 is formed, an insulating material layer including one or more layers of insulating material is formed over the substrate so that the fin structure is fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer.

Then, a planarization operation, such as a chemical mechanical polishing (CMP) method and/or an etch-back method, is performed such that the upper surface of the hard mask 25 is exposed from the insulating material layer. In some embodiments, one or more fin liner layers are formed over the fin structure before forming the insulating material layer. The fin liner layers include one or more of SiN or a silicon nitride-based material (e.g., SiON, SiCN or SiOCN). In some embodiments, the liner layers may be deposited through one or more processes such as physical vapor deposition (PVD), chemical vapor deposition (CVD), or atomic layer deposition (ALD), although any acceptable process may be utilized.

Then, as shown in FIG. 3, the insulating material layer is recessed to form an isolation insulating layer 30 so that the upper portion of the fin structure 20 is exposed. The isolation insulating layer 30 is also called a shallow trench isolation (STI).

After the isolation insulating layer 40 is formed, a sacrificial (dummy) gate structure 40 is formed, as shown in FIGS. 4 and 5. FIG. 5 illustrates a structure after a first sacrificial gate structure 40 is formed over the exposed fin structure 20. The first sacrificial gate structure 40 is formed over a portion of the fin structure which is to be a channel region. The sacrificial gate structure defines the channel region of the GAA FET. The first sacrificial gate structure 40 includes a sacrificial gate dielectric layer 42 and a first sacrificial gate electrode layer 44. The sacrificial gate dielectric layer 42 includes one or more layers of insulating material, such as a silicon oxide-based material. In one embodiment, silicon oxide formed by CVD is used. The thickness of the sacrificial gate dielectric layer 42 is in a range from about 1 nm to about 5 nm in some embodiments. In some embodiments, the hard mask 25 is removed before the first sacrificial gate structure 40 is formed.

The first sacrificial gate structure 40 is formed by first blanket depositing the sacrificial gate dielectric layer 42 over the fin structures. A first sacrificial gate electrode layer 44 is then blanket deposited on the sacrificial gate dielectric layer and over the fin structures, such that the fin structures are fully embedded in the first sacrificial gate electrode layer, as shown in FIG. 4. The first sacrificial gate electrode layer includes silicon such as polycrystalline silicon or amorphous silicon. The thickness of the first sacrificial gate electrode layer is in a range from about 10 nm to about 200 nm in some embodiments. In some embodiments, the first sacrificial gate electrode layer is subjected to a planarization operation. The sacrificial gate dielectric layer and the first sacrificial gate electrode layer are deposited using CVD, including LPCVD and PECVD, PVD, ALD, or other suitable process. Subsequently, a mask layer (not shown) is formed over the first sacrificial gate electrode layer. The mask layer includes a pad SiN layer and a silicon oxide mask layer in some embodiments.

Next, a patterning operation is performed on the mask layer and the first sacrificial gate electrode layer is patterned into the first sacrificial gate structure 40, as shown in FIG. 5. By patterning the sacrificial gate structure, the fin structure 20 is partially exposed on opposite sides of the first sacrificial gate structure 40, thereby defining source/drain (S/D) regions, as shown in FIG. 5. In this disclosure, a source and a drain are interchangeably used and the structures thereof are substantially the same. In FIG. 5, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 6:
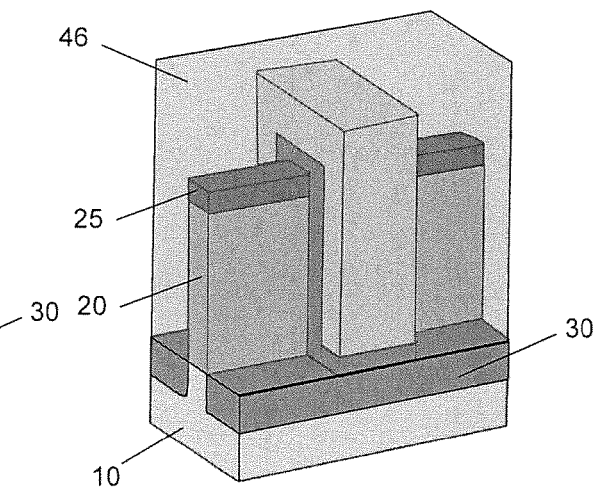
FIG. 6 shows one of the various stages of manufacturing a semiconductor FET device according to embodiments of the present disclosure.
Figure 7:
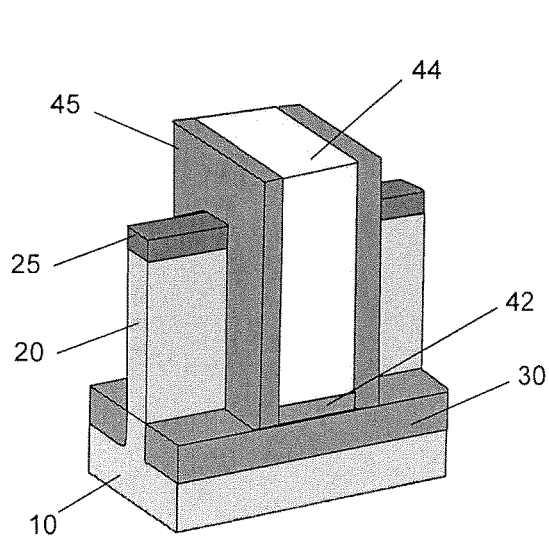
FIG. 7 shows one of the various stages of manufacturing a semiconductor FET device according to embodiments of the present disclosure.

After the sacrificial gate structure is formed, a first insulating layer 46 for sidewall spacers is formed as shown in FIG. 6. In some embodiments, the first insulating layer 46 is conformally formed over the exposed fin structure 20 and the first sacrificial gate structure 40. The first insulating layer 46 includes one or more layers of insulating material, such as SiN, SiON, SiOC, SiOCN and SiCN or any other suitable insulating material. SiC may be used as well. The insulating layer 46 can be formed by ALD or CVD, or any other suitable method. Then, as shown in FIG. 7, anisotropic etching is performed to form sidewall spacers 45.

Figure 8:
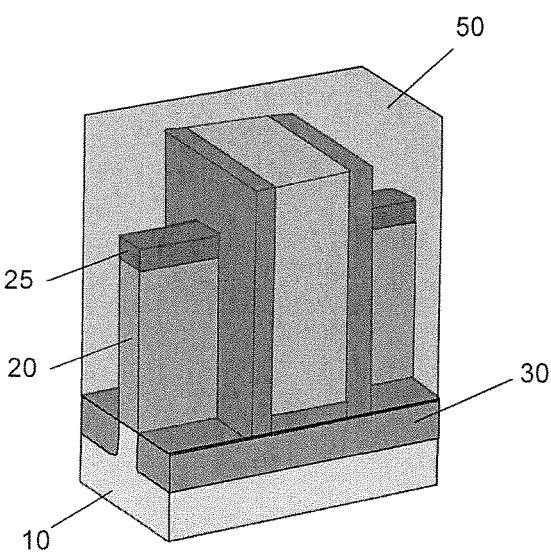
FIG. 8 shows one of the various stages of manufacturing a semiconductor FET device according to embodiments of the present disclosure.
Figure 9A:
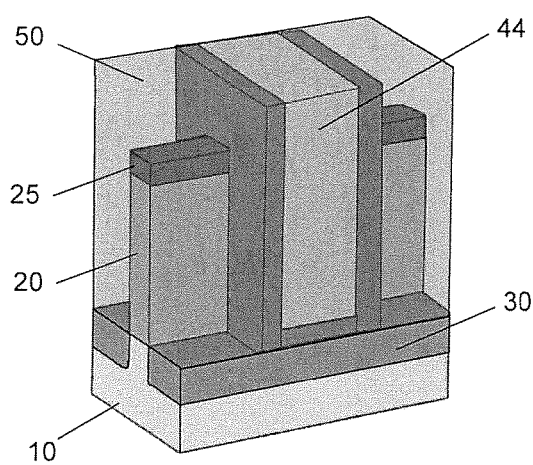
FIGS. 9A and 9B show one of the various stages of manufacturing a semiconductor FET device according to embodiments of the present disclosure.
Figure 9B:
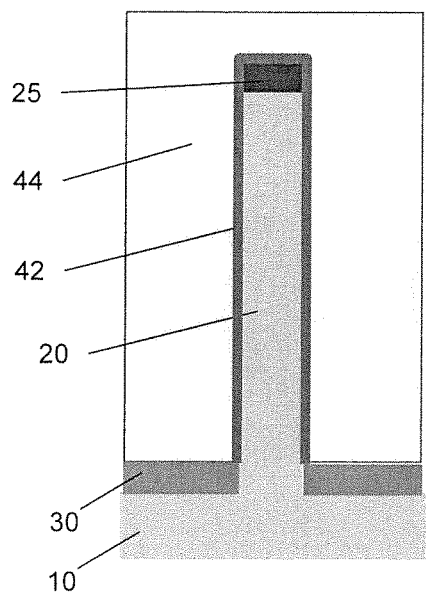

Further, as shown in FIG. 8, a SD (source/drain) cover layer 50 is forming as shown in FIG. 8. In some embodiments, the SD cover layer 50 includes one or more layers of SiN, SiCN, SiON and SiC. Next, as shown in FIGS. 9A and 9B, the SD cover layer 50 is planarized by using an etch-back operation and/or a CMP operation, to expose the upper surface of the first sacrificial gate electrode layer 44. FIG. 9B is a cross sectional view along the Y direction cutting the sacrificial gate structure. In some embodiments, the SD cover layer 50 is made of a different material than the sidewall spacers 45.

Figure 10A:
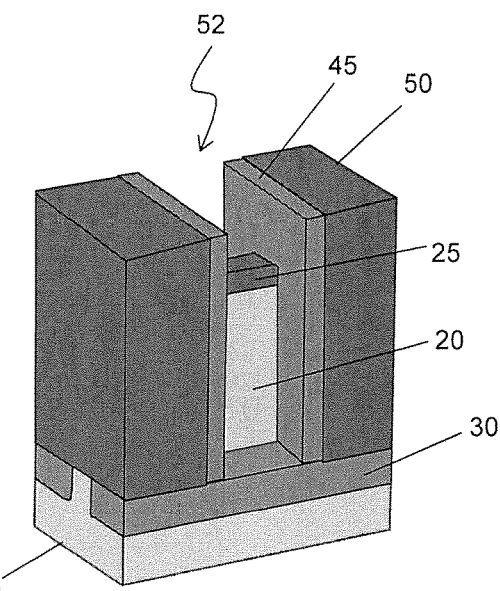
FIGS. 10A and 10B show one of the various stages of manufacturing a semiconductor FET device according to embodiments of the present disclosure.
Figure 10B:
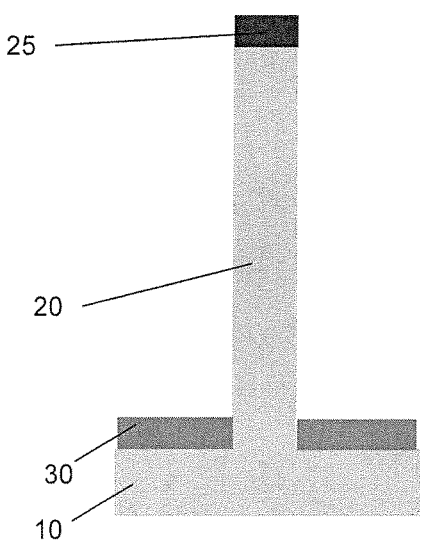

Then, as shown in FIGS. 10A and 10B, the first sacrificial gate electrode layer 44 and the sacrificial gate dielectric layer 42 are removed to form a gate space 52. In the gate space 52, the fin structure 20 with the hard mask 25 is exposed in some embodiments. When the first sacrificial gate electrode layer 44 is polysilicon, a wet etchant such as a TMAH (tetramethylammonium hydroxide) solution can be used to selectively remove the first sacrificial gate electrode layer 44. The sacrificial gate dielectric layer 42 is thereafter removed using plasma dry etching and/or wet etching operations.

Next, as shown in FIGS. 11A and 11B, a second insulating layer 55 is formed over the gate space and the SD cover layer, and the gate space 52 is filled with the second insulating layer 55. The second insulating layer 55 is made of a different material than the SD cover layer and is made of a silicon oxide based material, such as silicon oxide, SiON and SiOC in some embodiments. In some embodiments, the second insulating layer 55 is made of a different material than the sidewall spacers 45.

Further, as shown in FIGS. 12A and 12B, the second insulating layer 55 is recessed such that an upper portion of the fin structure and the hard mask 25 are exposed. The recess etching includes one or more dry etching and/or wet etching operations. The exposed amount D1, which is a distance between the top of the fin structure 20 and the upper surface of the recessed second insulating layer 55, is about 5 nm to about 30 nm in some embodiments.

Then, a first channel cover layer 60 made of one of SiN, SiCN, SiON and SiC is formed as shown in FIGS. 13A and 13B. In some embodiments, the first channel cover layer 60 is made of the same material as the SD cover layer 50. In other embodiments, the first channel cover layer 60 is made of the different material from the SD cover layer 50.

Further, as shown in FIGS. 14A and 14B, anisotropic etching is performed to form first channel sidewall spacers 61. Then, as shown in FIGS. 15A-15C, the second insulating layer 55 is further recessed by one or more dry etching and/or wet etching to expose a part of the fin structure 20. FIG. 15B is a cross sectional view along the Y direction cutting the fin structure 20 and FIG. 15C is a cross sectional view along the X direction at the interface between the fin structure 20 and the second insulating layer 55. The exposed amount D2, which is a distance between the bottom of the first channel sidewall spacers 61 and the upper surface of the recessed second insulating layer 55, is about 5 nm to about 30 nm in some embodiments.

Figure 16A:
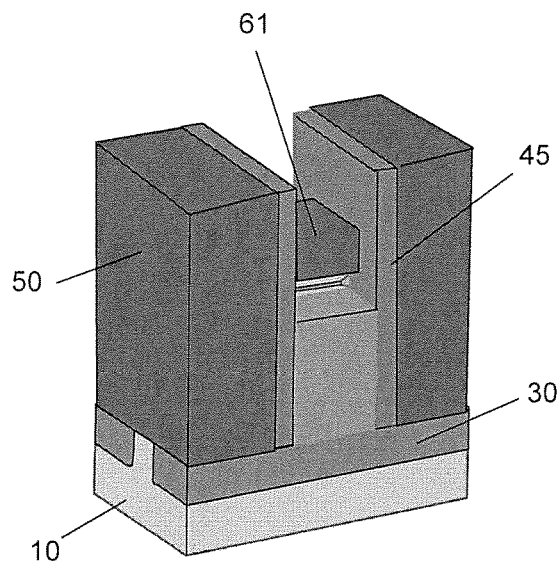
FIGS. 16A-16C show one of the various stages of manufacturing a semiconductor FET device according to embodiments of the present disclosure.
Figure 16C:
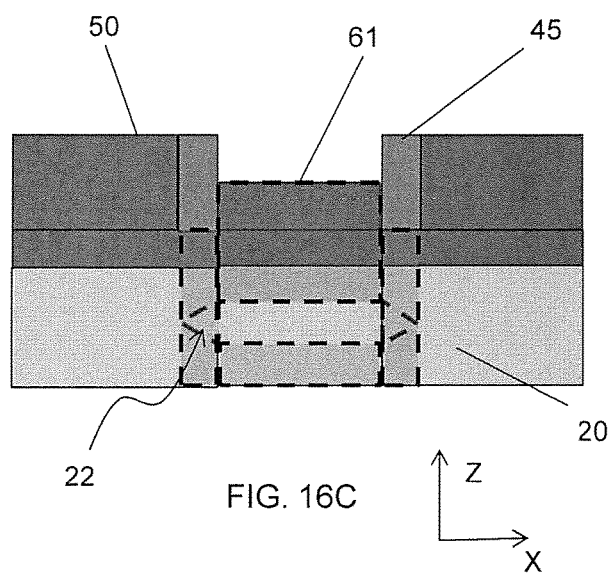
Figure 16B:
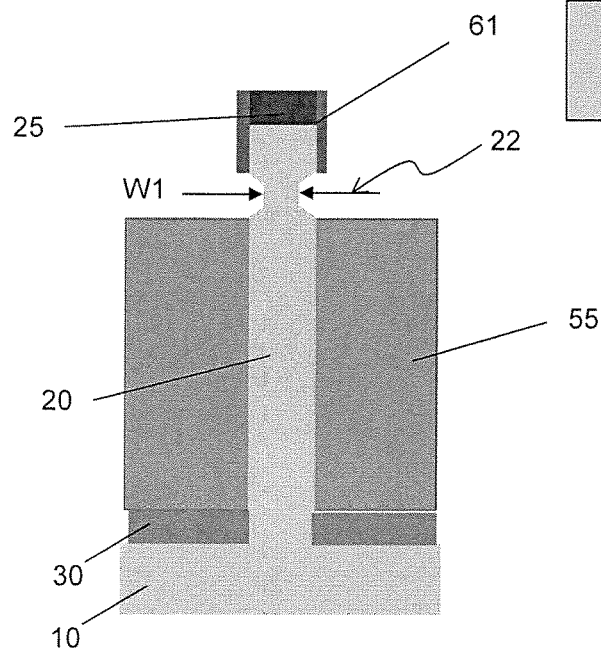

Next, as shown in FIGS. 16A-16B, the exposed portion of the fin structure 20 is sculpted by etching to reduce the width of the exposed portion. In some embodiments, wet etching using TMAH or KOH is used to etch the exposed portion. In other embodiments, dry etching is used. By this etching, the narrowest portion 22 of the sculpted fin structure 20 has a width W1 which is about 30% to about 70% of the original width of the fin structure 20 in some embodiments. Further, as shown in FIG. 16C, portions of the fin structures under the sidewall spacers 45 are also horizontally etched in the X direction.

Figure 17A:
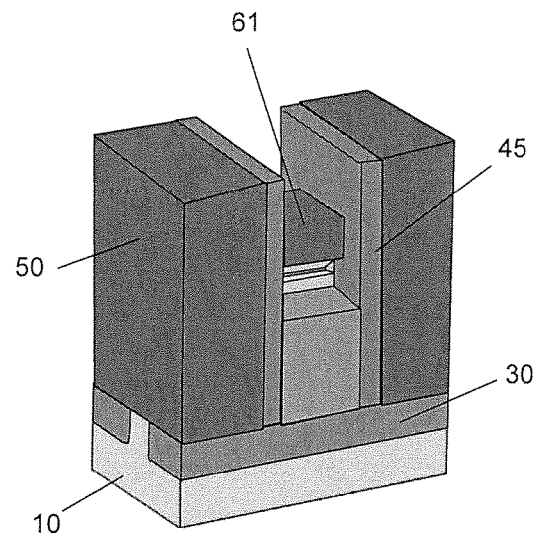
FIGS. 17A-17C show one of the various stages of manufacturing a semiconductor FET device according to embodiments of the present disclosure.
Figure 17C:
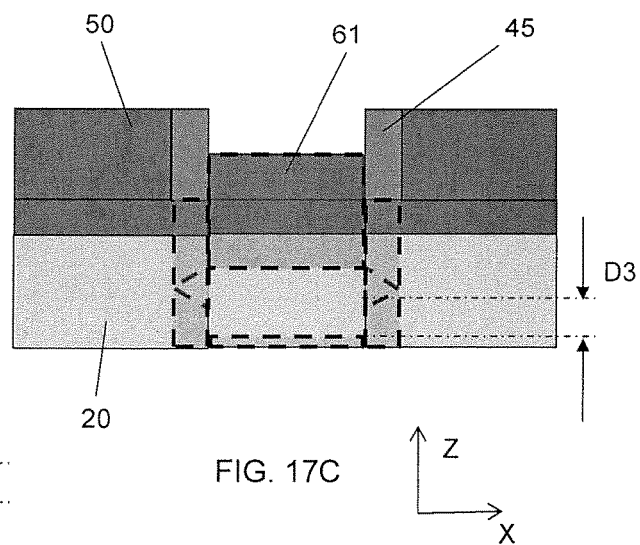
Figure 17B:
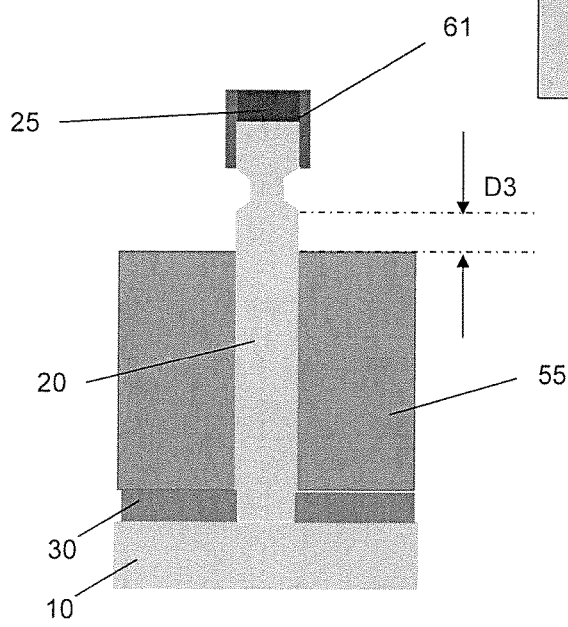

Then, as shown in FIGS. 17A-17C, the second insulating layer 55 is further recessed to further expose a portion of the fin structure 20. The recess etching includes one or more dry etching and/or wet etching operations. The exposed amount D3 is substantially equal to or smaller than D1 in some embodiments. The exposed amount D3 is about 5 nm to about 20 nm in some embodiments.

Figure 18A:
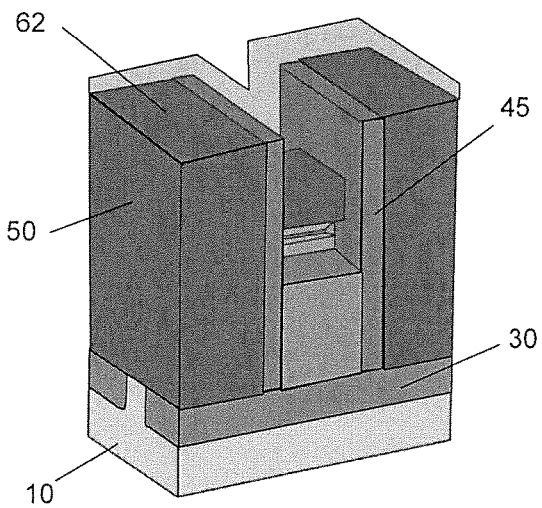
FIGS. 18A-18C show one of the various stages of manufacturing a semiconductor FET device according to embodiments of the present disclosure.
Figure 18B:
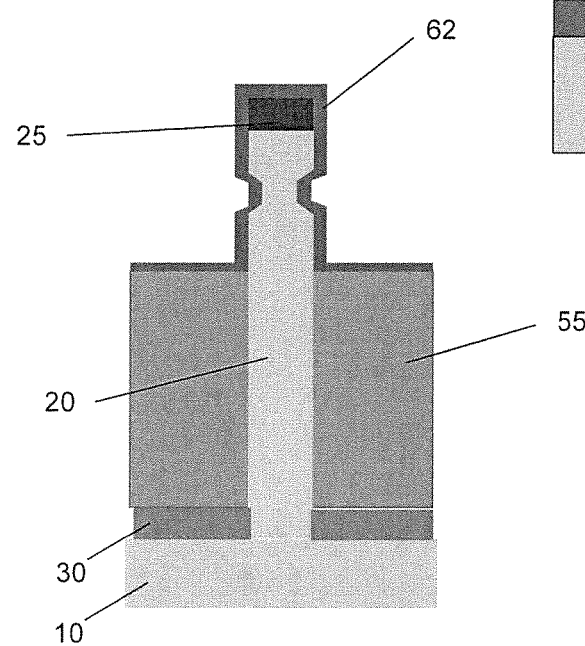
Figure 18C:
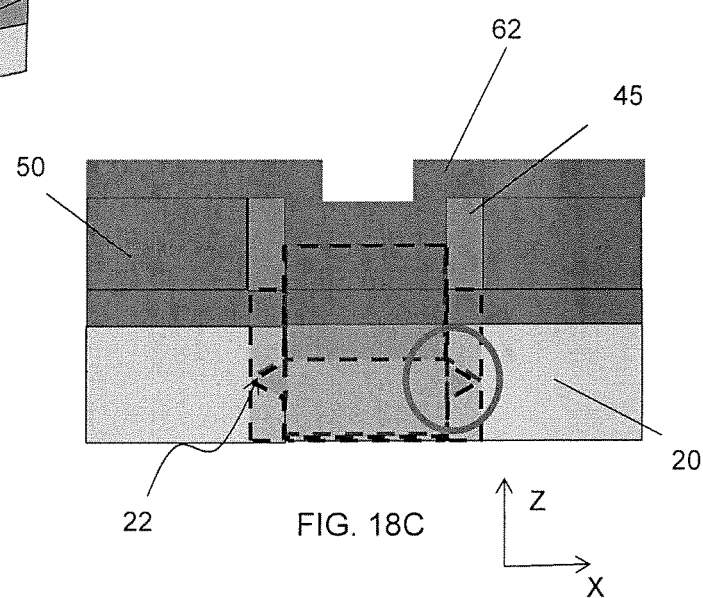

Then, a second channel cover layer 62 made of one of SiN, SiCN, SiON and SiC is formed as shown in FIGS. 18A-18C. In some embodiments, the second channel cover layer 62 is made of the same material as the first channel cover layer 60. As shown in FIG. 18C, the second channel cover layer 62 is filled in the recessed portion 22 of the fin structure under the sidewall spacers 45. In some embodiments, the first channel sidewall spacer 61 is removed before the formation of the second cover layer 62. In other embodiments, the first channel sidewall spacer 61 is not removed before the formation of the second cover layer 62.

Further, as shown in FIGS. 19A and 19B, anisotropic etching is performed to form second channel sidewall spacers 63. Then, as shown in FIGS. 20A and 20B, the second insulating layer 55 is further recessed by one or more dry etching and/or wet etching to expose a part of the fin structure 20. The exposed amount D4, which is a distance between the bottom of the second channel sidewall spacers 63 and the upper surface of the recessed second insulating layer 55, is about 5 nm to about 20 nm in some embodiments. In some embodiments, D4 is substantially equal to D2.

Next, as shown in FIGS. 21A and 21B, the exposed portion of the fin structure 20 is partially etched to reduce the width of the exposed portion, similar to FIGS. 17A-17C. Then, as shown in FIGS. 22A and 22B, the second insulating layer 55 is further recessed to further expose a portion of the fin structure 20, similar to FIGS. 18A and 18B. The exposed amount D5 is substantially equal to D3 in some embodiments.

Figures 23A, 24A:
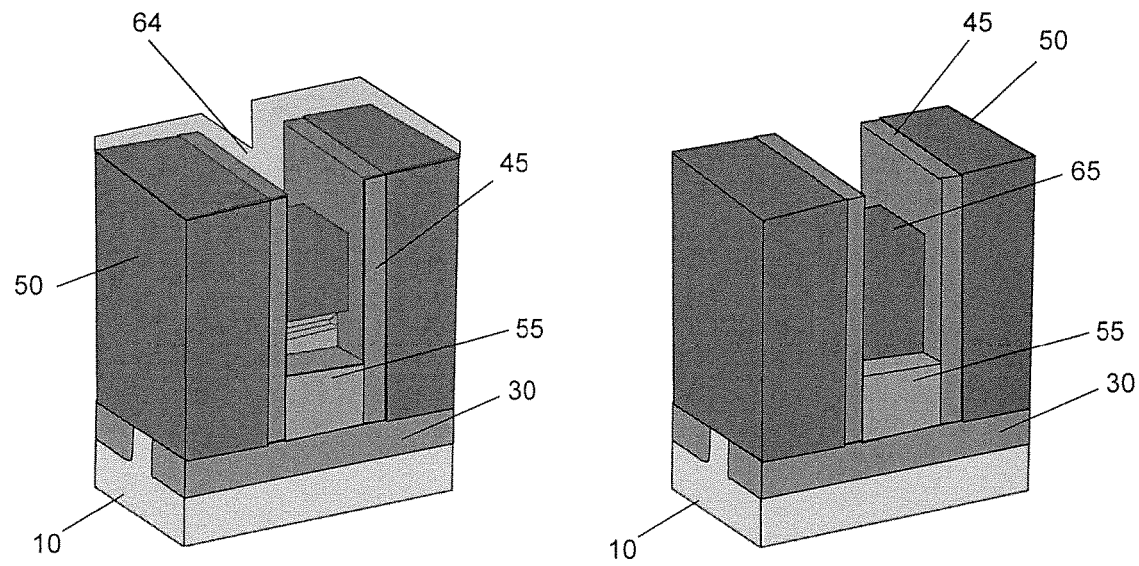
FIGS. 23A and 23B show one of the various stages of manufacturing a semiconductor FET device according to embodiments of the present disclosure.
FIGS. 24A and 24B show one of the various stages of manufacturing a semiconductor FET device according to embodiments of the present disclosure.
Figures 23B, 24B:
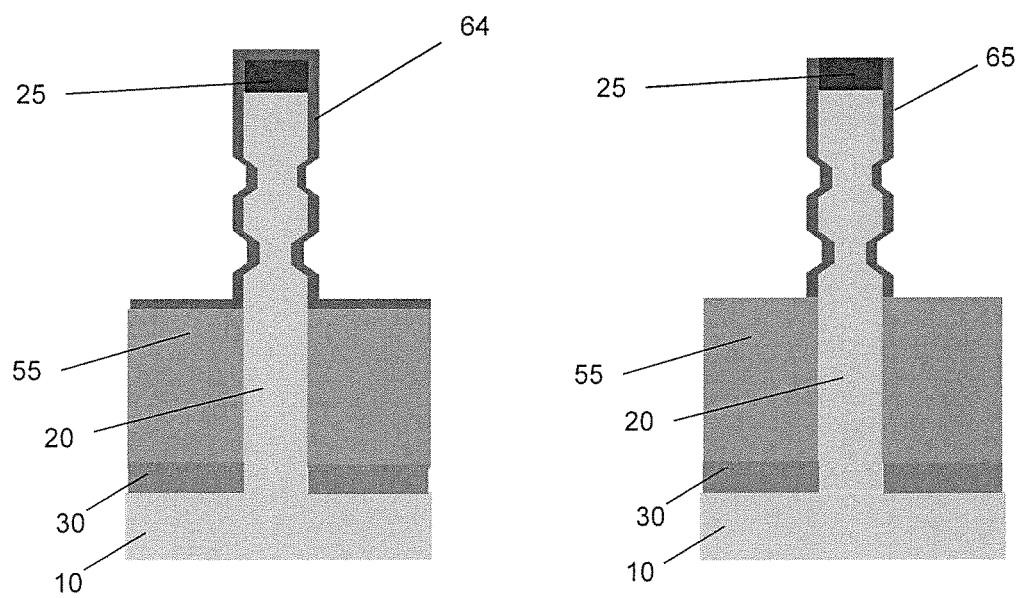

Then, a third channel cover layer 64 made of one of SiN, SiCN, SiON and SiC is formed as shown in FIGS. 23A and 23B, similar to FIGS. 18A-18C. In some embodiments, the third channel cover layer 64 is made of the same material as the first channel cover layer 60. In some embodiments, the second channel sidewall spacer 63 is removed before the formation of the third channel cover layer 64. In other embodiments, the second channel sidewall spacer 63 is not removed before the formation of the third channel cover layer 64. Further, as shown in FIGS. 24A and 24B, anisotropic etching is performed to form third channel sidewall spacers 65, similar to FIGS. 19A and 19B. Then, as shown in FIGS. 25A and 25B, the second insulating layer 55 is further recessed by one or more dry etching and/or wet etching to expose a part of the fin structure 20, similar to FIGS. 20A and 20B. The exposed amount D6, which is a distance between the bottom of the third channel sidewall spacers 65 and the upper surface of the recessed second insulating layer 55, is about 5 nm to about 20 nm in some embodiments. In some embodiments, D6 is substantially equal to D2. Next, as shown in FIGS. 26A and 26B, the exposed portion of the fin structure 20 is etched to reduce the width of the exposed portion, similar to FIGS. 17A-17C.

The operations of forming a channel cover layer, recessing the second insulating layer and etching the exposed fin structure are repeated by the desired number of times, for example 3-10 times in total. Thus, a sculpted fin structure is formed in the channel region.

Figure 27A:
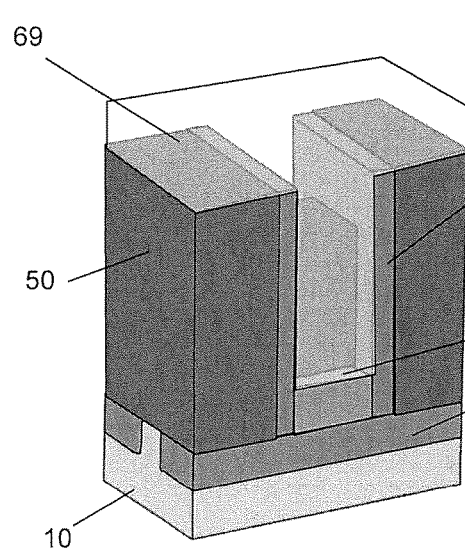
FIGS. 27A and 27B show one of the various stages of manufacturing a semiconductor FET device according to embodiments of the present disclosure.
Figure 28A:
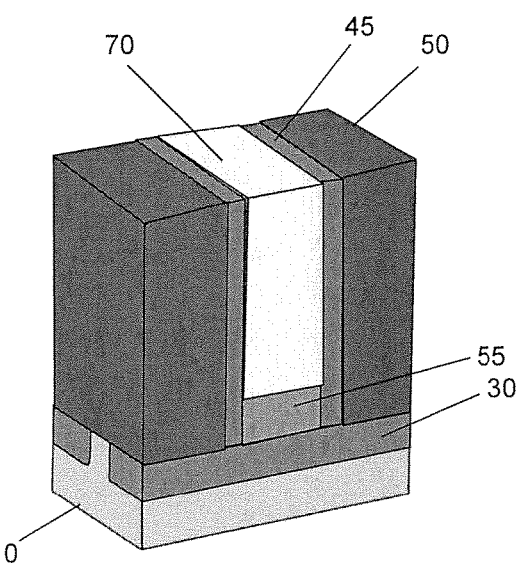
FIGS. 28A and 28B show one of the various stages of manufacturing a semiconductor FET device according to embodiments of the present disclosure.
Figure 27B:
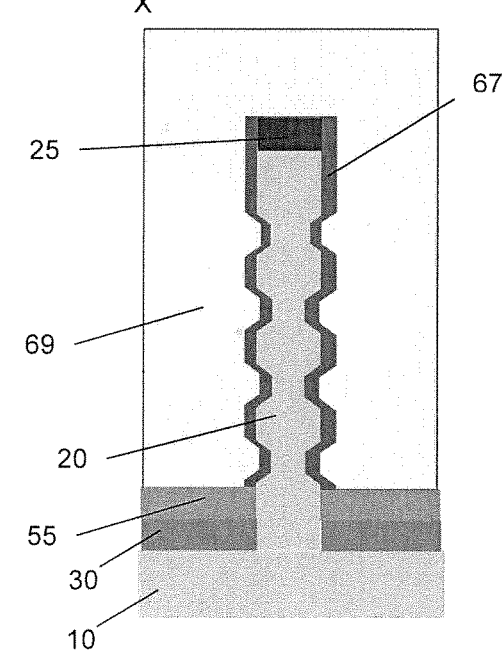
Figure 28B:
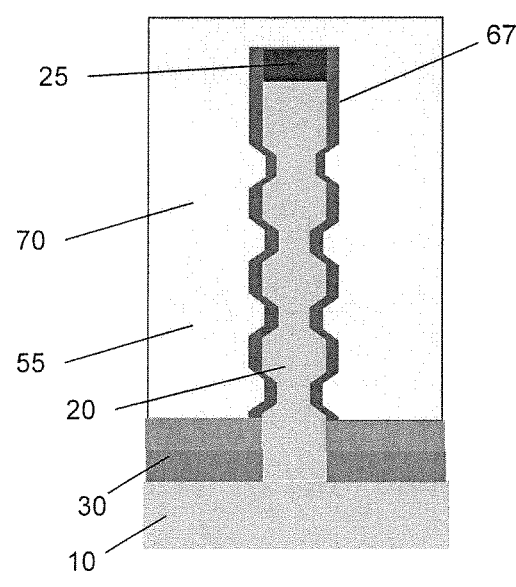

Subsequently, as shown in FIGS. 27A and 27B, after the last channel cover layer is formed over the sculpted fin structure and last channel sidewall spacers 67 are formed, a sacrificial layer 69 is formed, and then one or more planarization operations, such as an etch back operation and a CMP operation, are performed to form a second sacrificial gate structure 70, as shown in FIGS. 28A and 28B. In some embodiments, the second sacrificial gate structure 70 is made of polysilicon or amorphous silicon formed by CVD.

Figure 29A:
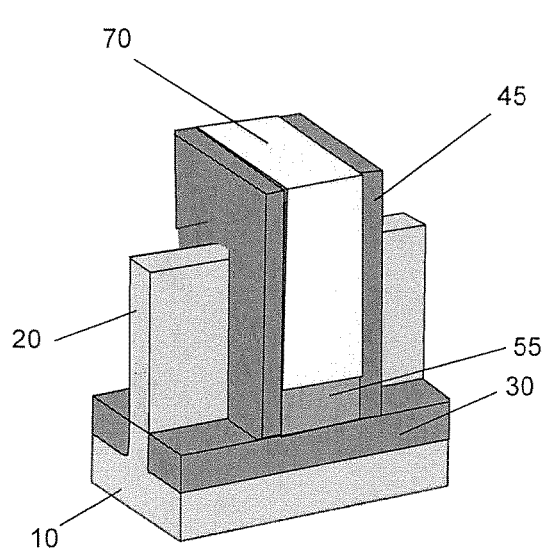
FIGS. 29A and 29B show one of the various stages of manufacturing a semiconductor FET device according to embodiments of the present disclosure.
Figure 30A:
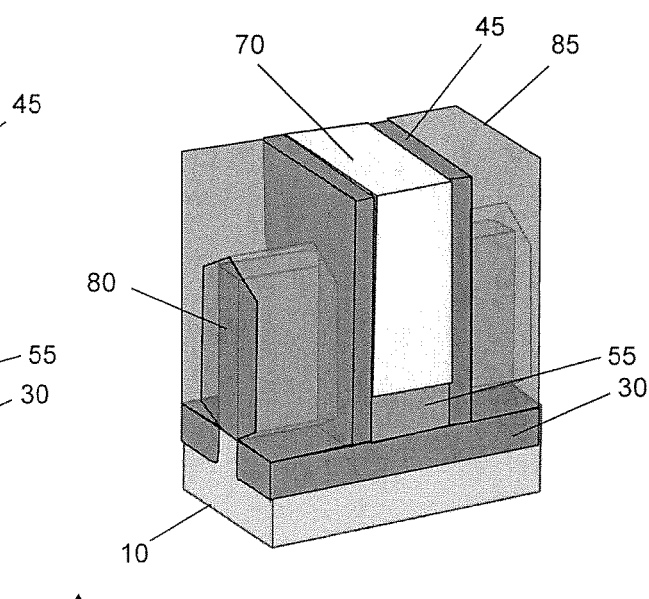
FIGS. 30A and 30B show one of the various stages of manufacturing a semiconductor FET device according to embodiments of the present disclosure.
Figure 29B:
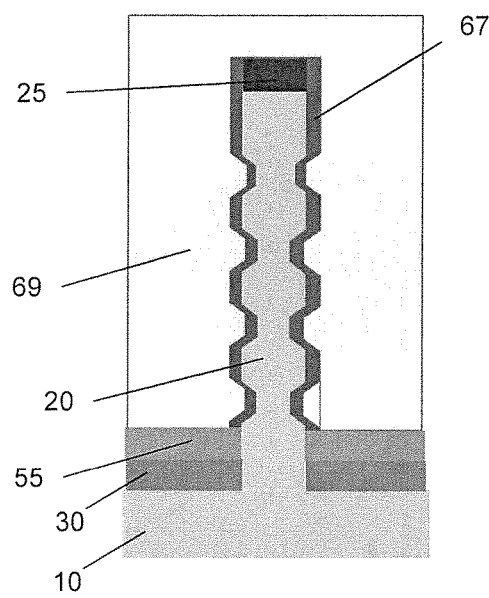
Figure 30B:
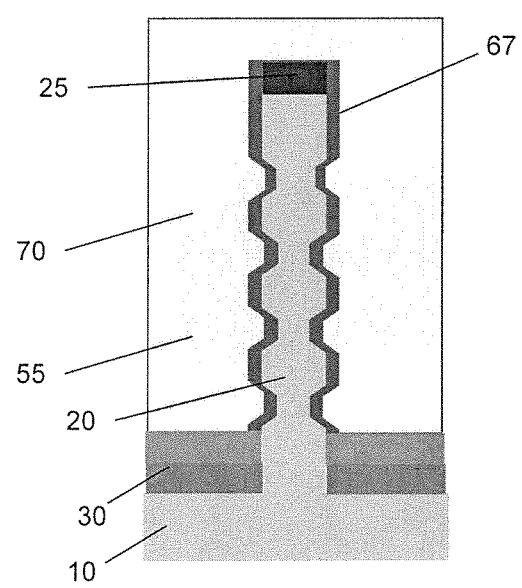

Then, as shown in FIGS. 29A and 29B, the SD cover layer 50 and hard mask 25 are removed to expose a source/drain region of the fin structure 20. After a source/drain epitaxial layer 80 is formed over the source/drain region of the fin structure 20, an interlayer dielectric (ILD) layer 85 is formed, as shown in FIGS. 30A and 30B. The source/drain epitaxial layer 80 includes one or more layers of Si, SiP, SiC and SiCP for an n-channel FET or Si, SiGe and Ge for a p-channel FET. For the n-channel FET, phosphorus (P) may also be contained in the source/drain. For the p-channel FET, boron (B) may also be contained in the source/drain. The source/drain epitaxial layer 80 is formed by an epitaxial growth method using CVD, ALD or molecular beam epitaxy (MBE). In some embodiments, the fin structures of the source/drain regions are recessed down to about the upper surface of the isolation insulating layer 30, and then the source/drain epitaxial layer 80 is formed. The materials for the ILD layer 85 include compounds comprising Si, O, C and/or H, such as silicon oxide, SiON, SiCOH and SiOC. Organic materials, such as polymers, may be used for the ILD layer 85. After the material for the ILD layer 85 is formed, a planarization operation, such as CMP, is performed, so that the top portion of the second sacrificial gate structure 70 is exposed. Then, the second sacrificial gate structure 70 is removed, and the hard mask 25 is removed, as shown in FIGS. 31A and 31B.

Next, the exposed sculpted fin structure 20 with etched portions is oxidized to form nanowires 27 separated by an oxide 90. In some embodiments, as shown in FIGS. 32A and 32B, four nanowires 27a-27d are formed, but the number of nanowires is not limited to four. The oxidization process is performed such that the etched narrow portions of the sculpted fin structure 20 are fully oxidized, while non-etched portions of the sculpted fin structure 20 are only partially oxidized. In some embodiments, one or more of a thermal oxidization process, a plasma oxidization process and/or a chemical oxidization process are utilized. In some embodiments, a process temperature of the thermal oxidization is in a range from about 500° C. to about 800° C. In some embodiments, a process temperature of the plasma oxidization is in a range from about 300° C. to about 500° C. The ILD layer 85 protects the source/drain structures 80 during the oxidation of the exposed fin structure 20.

Then, as shown in FIGS. 33A and 33B, the oxide 90 is removed to release the semiconductor nanowires 27. The oxide 90 can be removed by suitable dry etching and/or wet etching operations. After the semiconductor nanowires 27 are formed, a gate dielectric layer 102 is formed around each nanowire 27 (channel), and a gate electrode layer 104 is formed on the gate dielectric layer 102, as shown in FIGS. 34A and 34B.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 includes an interfacial layer formed between the channel layers and the dielectric material.

The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layer. The thickness of the gate dielectric layer 102 is in a range from about 1 nm to about 6 nm in one embodiment.

The gate electrode layer 104 is formed on the gate dielectric layer 102 to surround each channel layer. The gate electrode 104 includes one or more layers of a conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate electrode layer 104 is also deposited over the upper surface of the ILD layer 85. The gate dielectric layer and the gate electrode layer formed over the ILD layer 85 are then planarized by using, for example, CMP, until the top surface of the ILD layer 85 is revealed.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

As shown in FIGS. 34A and 34B, a cross sectional shape and an area of at least one of the nanowires 27 is different from the remaining nanowires in some embodiments. In certain embodiments, the uppermost nanowire 27d has a largest cross sectional area among the nanowires 27. In some embodiments, the uppermost nanowire 27d has a teardrop shape, which is not point symmetric, while the remaining nanowires have an oval shape which is point symmetric. In other embodiments, cross sectional shapes and areas of the nanowires 27 are different from each other.

It is understood that the GAA FETs undergoes further CMOS processes to form various features such as contacts/vias, interconnect metal layers, dielectric layers, passivation layers, etc.

FIGS. 35A-41B show an exemplary sequential operation for manufacturing the GAA FET according to another embodiment of the present disclosure. It is understood that additional operations can be provided before, during, and after processes shown by FIGS. 35A-41B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-34B may be employed in the following embodiments, and detailed explanation thereof may be omitted.

Figures 35A, 36A:
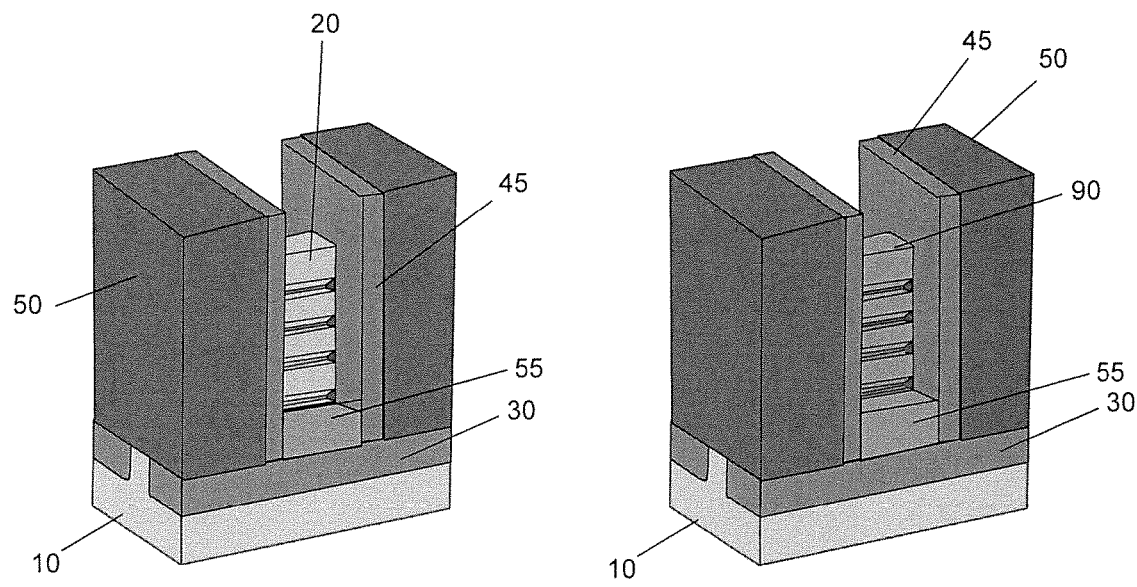
FIGS. 35A and 35B show one of the various stages of manufacturing a semiconductor FET device according to other embodiments of the present disclosure.
FIGS. 36A and 36B show one of the various stages of manufacturing a semiconductor FET device according to other embodiments of the present disclosure.
Figures 35B, 36B:
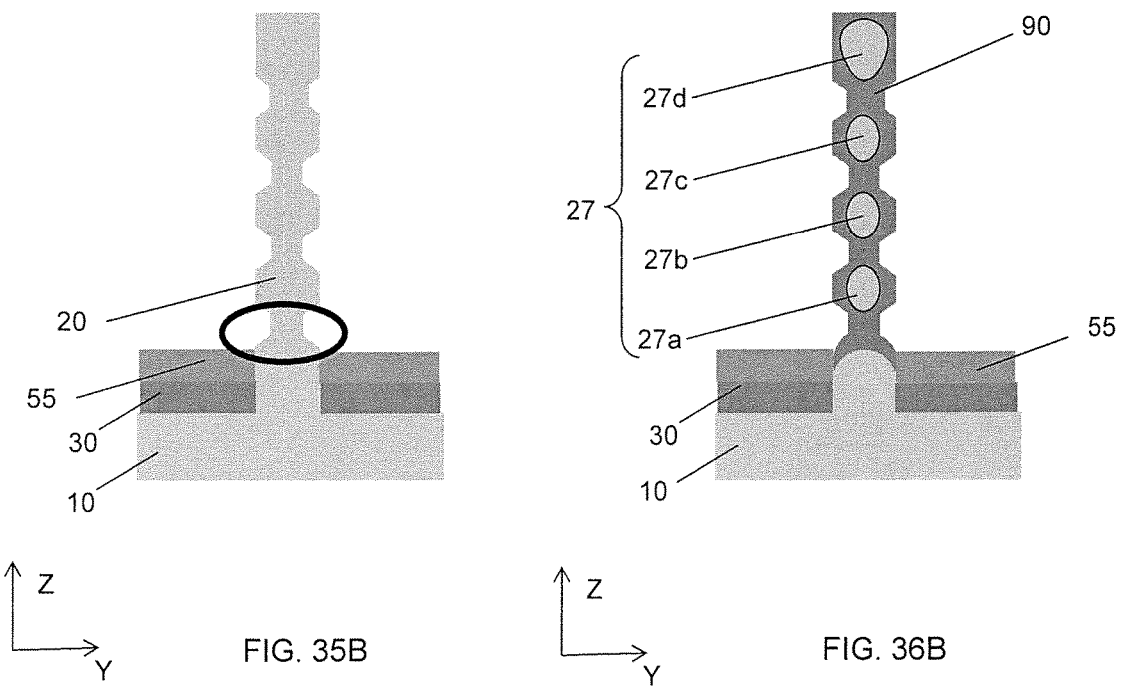

In this embodiment, before the source/drain epitaxial layer 80 is formed, the nanowires 27 are formed. After the structure shown in FIGS. 15A-15C is formed, the processes as set forth in FIGS. 16A-26B are repeated to form the fin structure 20 with several etched narrow portions. Then, the last channel cover layer and the hard mask 25 are removed, thereby the structure shown in FIGS. 35A and 35B is obtained. Then, the exposed fin structure 20 with etched portions is oxidized to form nanowires 27 separated by oxide 90, by the operations the same as or similar to those explained with respect to FIGS. 32A and 32B. FIGS. 36A and 36B show the structure after the oxide 90 is formed.

Then, as shown in FIGS. 37A and 37B, the oxide 90 is removed to release the semiconductor nanowires 27, by the operations the same as or similar to those explained with respect to FIGS. 33A and 33B. After the semiconductor nanowires 27 are formed, a second sacrificial gate dielectric layer 72 is formed around each nanowire 27 (channel), and a second sacrificial gate electrode 71 is formed on the gate dielectric layer 72, as shown in FIGS. 38A and 38B. The second sacrificial gate dielectric layer 72 is made of silicon oxide formed by CVD and the second sacrificial gate electrode 71 is made of polysilicon or amorphous silicon formed by CVD, in some embodiments.

Figure 41A:
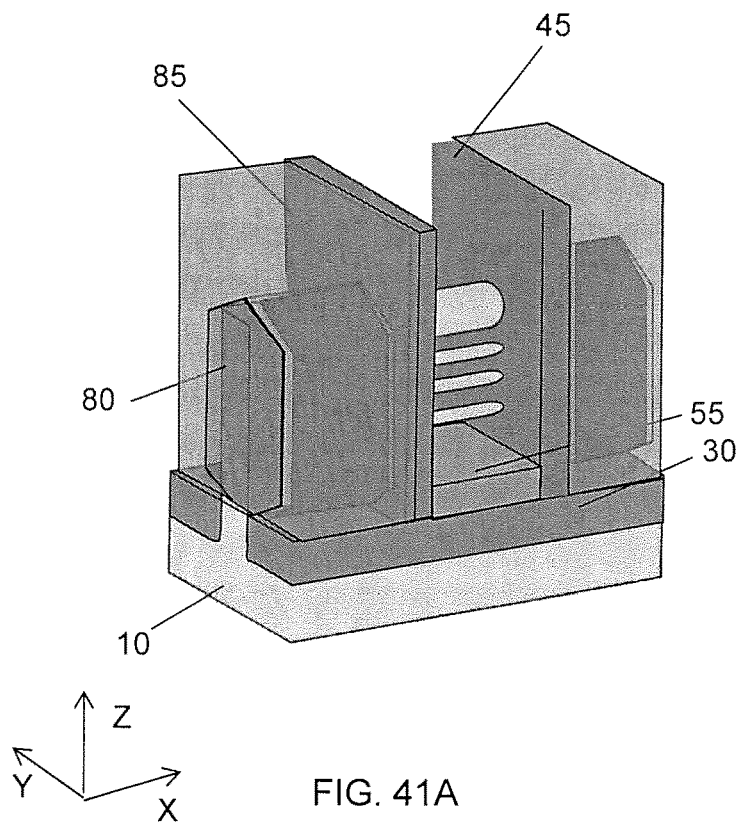
FIGS. 41A and 41B show one of the various stages of manufacturing a semiconductor FET device according to other embodiments of the present disclosure.
Figure 41B:
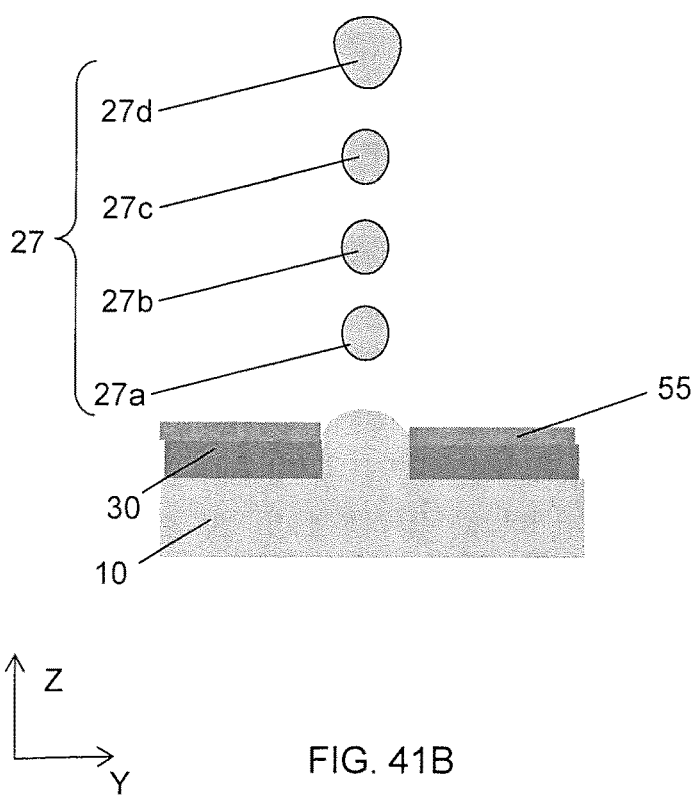

Then, similar to FIGS. 29A and 29B, the SD cover layer 50 and hard mask 25 are removed to expose a source/drain region of the fin structure 20, as shown in FIGS. 39A and 39B. Similar to FIGS. 30A and 30B, after a source/drain epitaxial layer 80 is formed over the source/drain region of the fin structure 20, an interlayer dielectric (ILD) layer 85 is formed, as shown in FIGS. 40A and 40B. The source/drain epitaxial layer 80 includes one or more layers of Si, SiP, SiC and SiCP for an n-channel FET or Si, SiGe and Ge for a p-channel FET. For the n-channel FET, phosphorus (P) may also be contained in the source/drain. For the p-channel FET, boron (B) may also be contained in the source/drain. The source/drain epitaxial layer 80 is foliated by an epitaxial growth method using CVD, ALD or molecular beam epitaxy (MBE). In some embodiments, the fin structures of the source/drain regions are recessed down to about the upper surface of the isolation insulating layer 30, and then the source/drain epitaxial layer 80 is formed. After the material for the ILD layer 85 is formed, a planarization operation, such as CMP, is performed, so that the top portion of the second sacrificial gate electrode 71 is exposed. Then, the second sacrificial gate electrode 71 is removed, and the sacrificial gate dielectric layer 72 is removed, as shown in FIGS. 41A and 41B. Then, a gate dielectric layer and metal gate electrode are formed similar to FIGS. 34A and 34B.

FIGS. 42-46 show an exemplary sequential operation for manufacturing the GAA FET according to another embodiment of the present disclosure. It is understood that additional operations can be provided before, during, and after processes shown by FIGS. 42-46, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-41B may be employed in the following embodiments, and detailed explanation thereof may be omitted.

Figure 42:
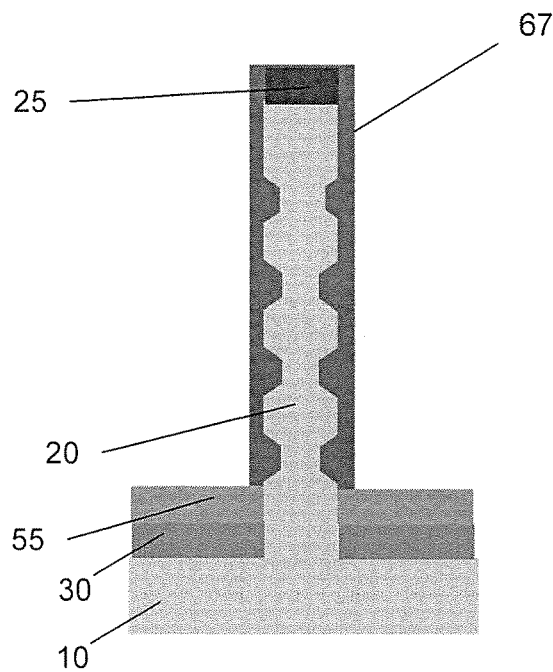
FIG. 42 shows one of the various stages of manufacturing a semiconductor FET device according to other embodiments of the present disclosure.
Figure 43:
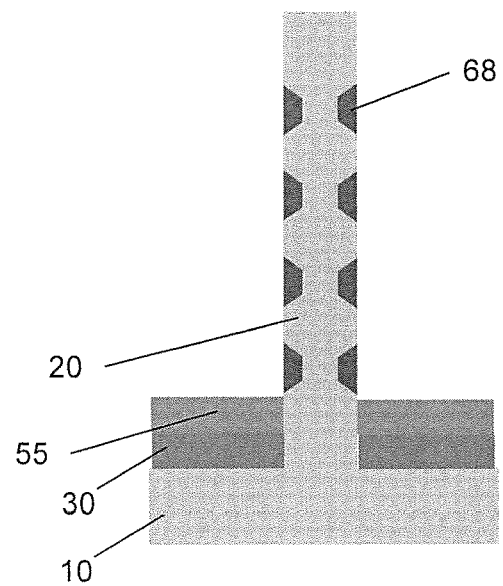
FIG. 43 shows one of the various stages of manufacturing a semiconductor FET device according to other embodiments of the present disclosure.

After the structure shown in FIGS. 15A-15C are formed, the processes as set forth are repeated to form the fin structure 20 with several etched narrow portions. FIG. 42 shows a structure after the last channel sidewall spacers 67 are formed. Then, as shown in FIG. 43, part of the channel sidewall spacers 67 is removed so that part of the channel sidewall spacers 67 remains only at narrowed portions of the fin structure 20 as remaining sidewalls 68. In some embodiments, one or more isotropic etching operations are utilized.

Figure 44:
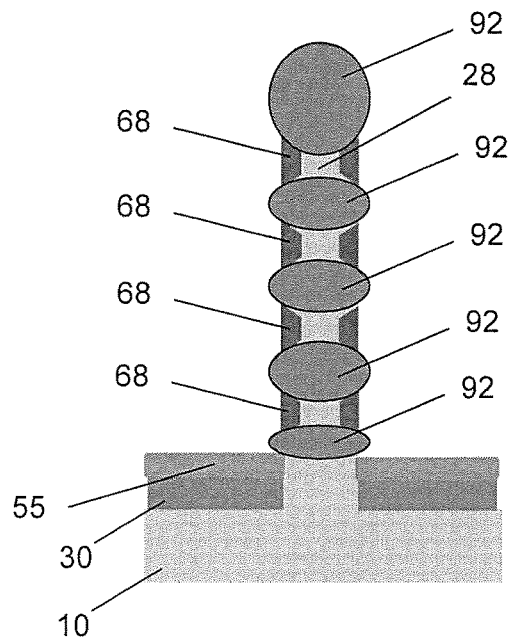
FIG. 44 shows one of the various stages of manufacturing a semiconductor FET device according to other embodiments of the present disclosure.

Then, the exposed fin structure 20 with the remaining channel sidewalls 68 is oxidized to form nanowires 28 separated by oxide 92 as shown in FIG. 44. In some embodiments, one or more of a thermal oxidization process, a plasma oxidization process and/or a chemical oxidization process are utilized. In some embodiments, a process temperature of the thermal oxidization is in a range from about 500° C. to about 800° C. In some embodiments, a process temperature of the plasma oxidization is in a range from about 300° C. to about 500° C. The remaining channel sidewalls 68 protect the portions of the fin structure to be nanowires 28 during the oxidation of the fin structure 20.

Figure 45:
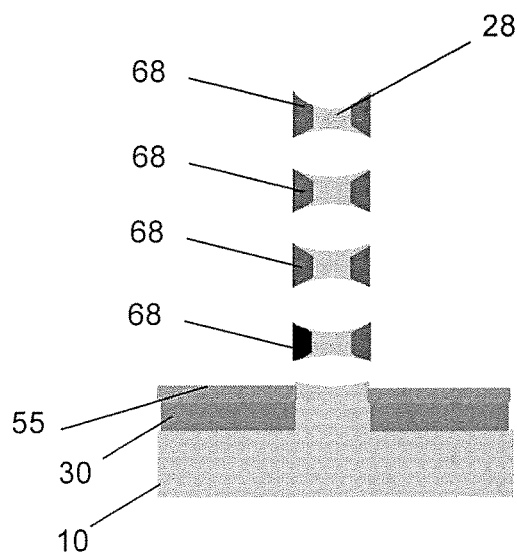
FIG. 45 shows one of the various stages of manufacturing a semiconductor FET device according to other embodiments of the present disclosure.
Figure 46:
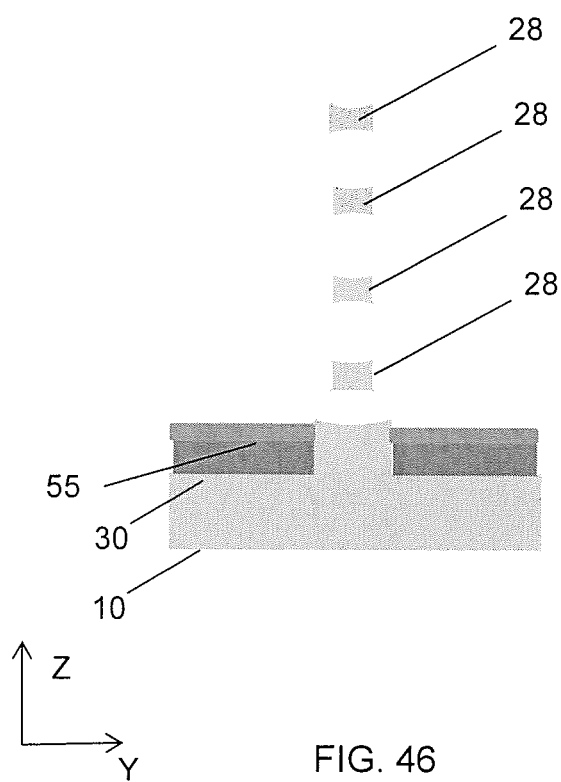
FIG. 46 shows one of the various stages of manufacturing a semiconductor FET device according to other embodiments of the present disclosure.

Next, as shown in FIG. 45, the oxides 92 are removed, and further the remaining channel sidewalls 68 are removed as shown in FIG. 46, thereby releasing the nanowires. In some embodiments, one or more additional etching operations are performed on the nanowires 28 to round corners of the nanowires 28.

In some embodiments, after the structure shown in FIGS. 30A and 30B is formed and then the sacrificial layer 70 is removed to obtain the structure shown in FIG. 42. In such a case, after the nanowires 28 are formed, the operations explained with respect to FIGS. 34A and 34B are performed. In other words, after the source/drain epitaxial layer 80 is formed, the nanowires 28 are formed. In other embodiments, before the sacrificial layer 69 shown in FIGS. 27A and 27B is formed, the structure shown in FIG. 42 is obtained and the nanowires 28 are formed as set forth above. In such a case, the operations explained with respect to FIGS. 38A-41B are performed. In other words, before the source/drain epitaxial layer 80 is formed, the nanowires 28 are formed in some embodiments.

FIGS. 47-52 show an exemplary sequential operation for manufacturing the GAA FET according to another embodiment of the present disclosure. It is understood that additional operations can be provided before, during, and after processes shown by FIGS. 47-52, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-46 may be employed in the following embodiments, and detailed explanation thereof may be omitted.

Figure 47:
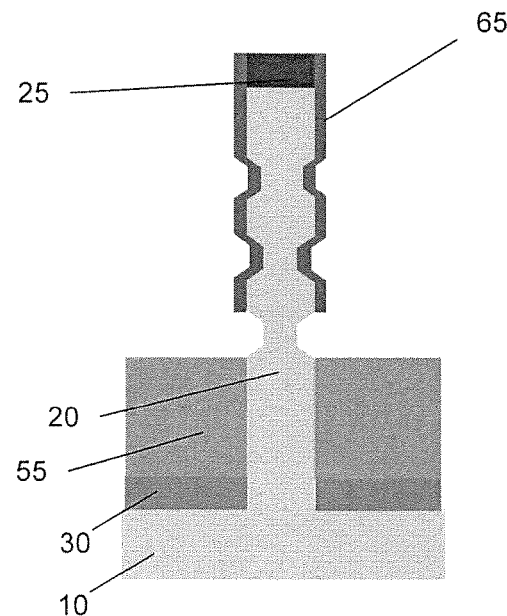
FIG. 47 shows one of the various stages of manufacturing a semiconductor FET device according to other embodiments of the present disclosure.
Figure 48:
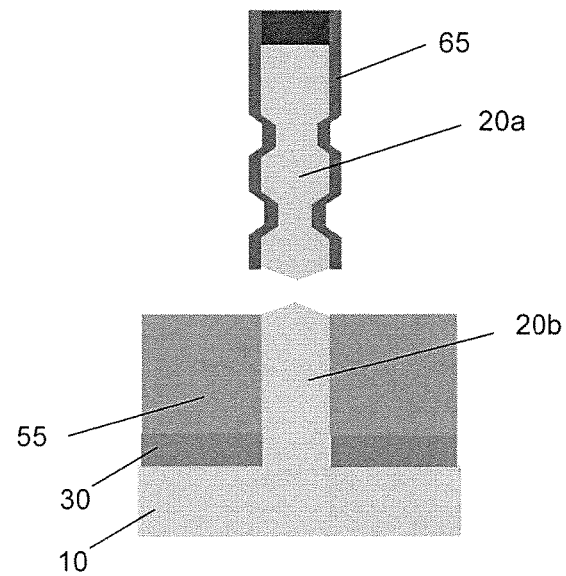
FIG. 48 shows one of the various stages of manufacturing a semiconductor FET device according to other embodiments of the present disclosure.
Figure 49:
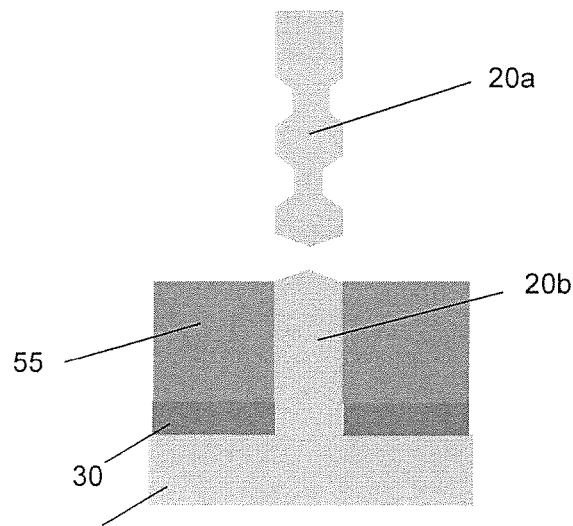
FIG. 49 shows one of the various stages of manufacturing a semiconductor FET device according to other embodiments of the present disclosure.
Figure 50:
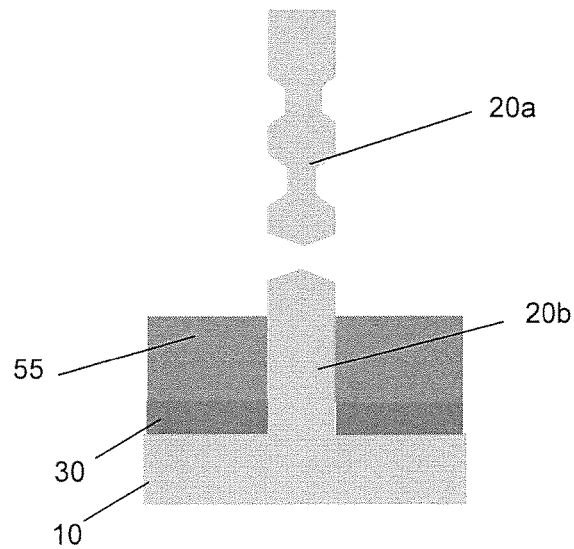
FIG. 50 shows one of the various stages of manufacturing a semiconductor FET device according to other embodiments of the present disclosure.

FIG. 47 is the same as FIG. 26B. In this embodiment, the etching to reduce the width of the fin structures is performed such that the upper portion 20a of the fin structure 20 is separated from the bottom portion 20b as shown in FIG. 48. Then, the third channel sidewall spacers 65 are removed as shown in FIG. 49. It is noted that the upper portion 20a of the fin structure is supported at least by the sidewall spacers 45. Then, the second insulating layer is optionally recessed to expose an upper portion of the bottom portion 20b of the fin structure as shown in FIG. 50 in some embodiments. Next, an oxidization process is performed to form nanowires 27 as shown in FIG. 51, by the same or similar operations explained with respect to FIGS. 32A and 32B and FIGS. 36A and 36B. Then, the oxide 91 is removed, thereby releasing the nanowires 27 as shown in FIG. 52. In the foregoing embodiment, after the third channel sidewall spacers 65 are formed, the separation process to separate the upper portion 20a and the bottom portion 20b is performed. In other embodiments, after the last channel sidewall spacers, which may be the fourth, fifth, . . . , etc., are formed the separation process to separate the upper portion 20a and the bottom portion 20b is performed.

FIGS. 53A-77B show an exemplary sequential operation for manufacturing the GAA FET according to another embodiment of the present disclosure. It is understood that additional operations can be provided before, during, and after processes shown by FIGS. 53A-77B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-52 may be employed in the following embodiments, and detailed explanation thereof may be omitted.

In the following embodiments, a fin structure is sculpted before a sacrificial gate structure is formed.

Figure 53A:
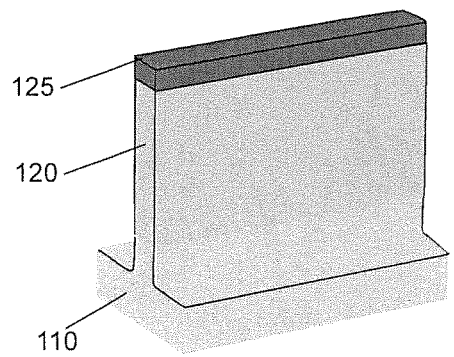
FIGS. 53A and 53B show one of the various stages of manufacturing a semiconductor FET device according to other embodiments of the present disclosure.
Figure 54A:
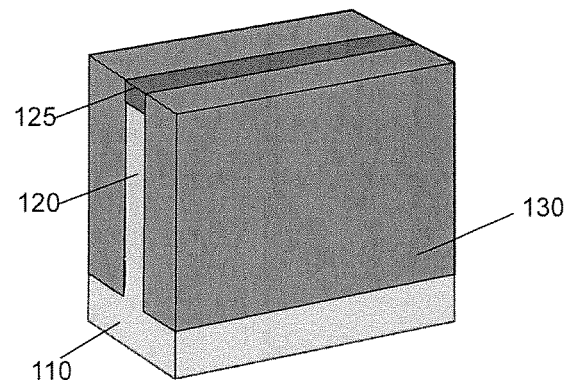
FIGS. 54A and 54B show one of the various stages of manufacturing a semiconductor FET device according to other embodiments of the present disclosure.
Figure 54B:
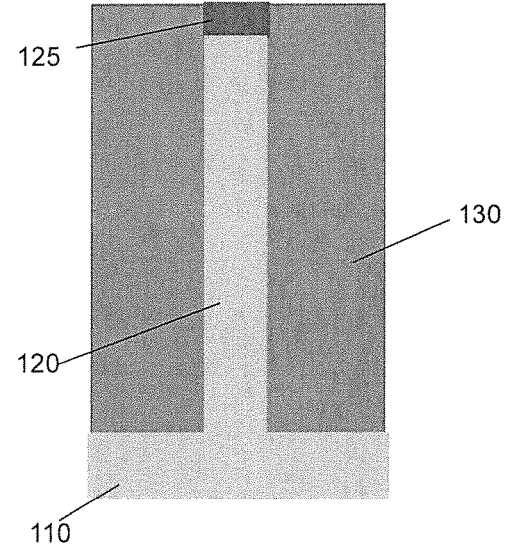

Similar to FIG. 2, a semiconductor fin structure 120 with a hard mask 125 is formed over a semiconductor substrate 110, as shown in FIG. 53A. Then, as shown in FIGS. 54A and 54B, a first insulating layer 130 is formed over the fin structure 120. A material for the first insulating layer 130 is formed to fully cover the fin structure 120 and a planarization operation, such as CMP, is performed to expose the hard mask 125. The first insulating layer 130 includes silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD.

Next, as shown in FIGS. 55A and 55B, the first insulating layer 130 is recessed to expose an upper portion of the fin structure 120. The recess etching includes one or more dry etching and/or wet etching operations. The exposed amount D11, which is a distance between the top of the fin structure 120 and the upper surface of the recessed first insulating layer 130, is about 5 nm to about 30 nm in some embodiments.

Then, a first cover layer 160 made of one of SiN, SiCN, SiON and SiC is formed as shown in FIGS. 56A and 56B. In some embodiments, the first cover layer 160 is made of the different material than the first insulating layer. In some embodiments, the first cover layer 160 is made of the same material as the hard mask 125.

Figure 57A:
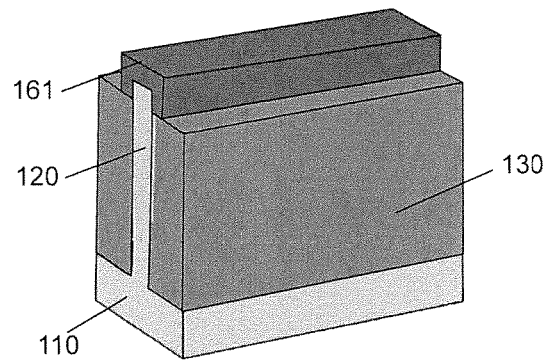
FIGS. 57A and 57B show one of the various stages of manufacturing a semiconductor FET device according to other embodiments of the present disclosure.
Figure 58A:
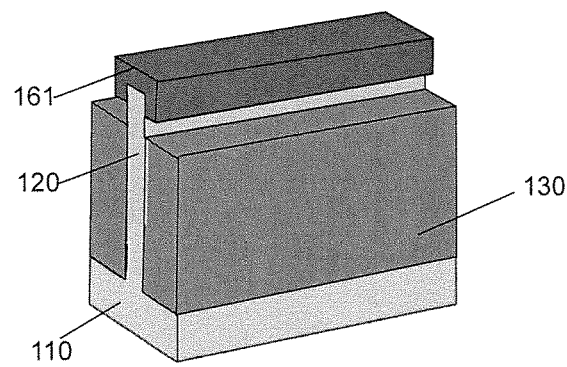
FIGS. 58A and 58B show one of the various stages of manufacturing a semiconductor FET device according to other embodiments of the present disclosure.
Figure 57B:
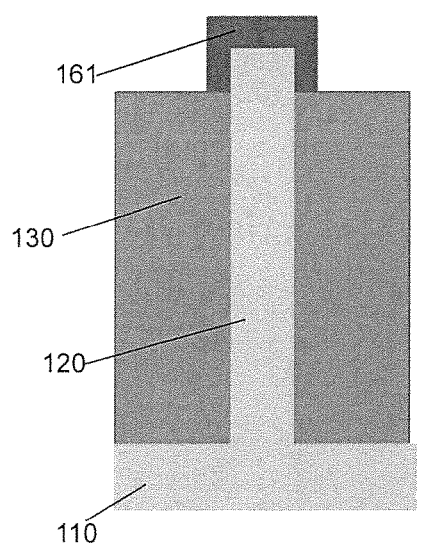
Figure 58B:
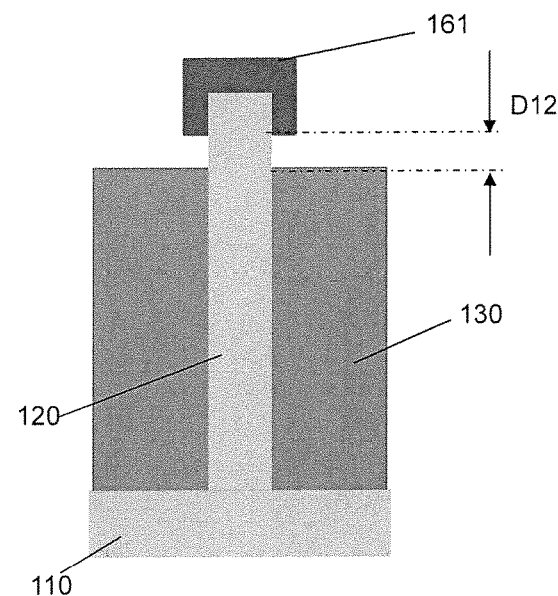

Further, as shown in FIGS. 57A and 57B, anisotropic etching is performed to form first sidewall spacers 161. Then, as shown in FIGS. 58A and 58B, the first insulating layer 130 is further recessed by one or more dry etching and/or wet etching operations to expose a part of the fin structure 120. The exposed amount D12, which is a distance between the bottom of the first sidewall spacers 161 and the upper surface of the recessed first insulating layer 130, is about 5 nm to about 30 nm in some embodiments.

Figure 59A:
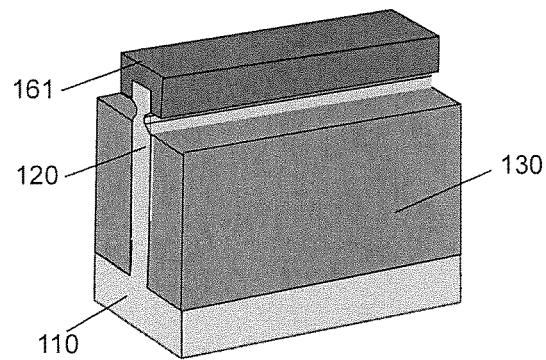
FIGS. 59A and 59B show one of the various stages of manufacturing a semiconductor FET device according to other embodiments of the present disclosure.
Figure 59B:
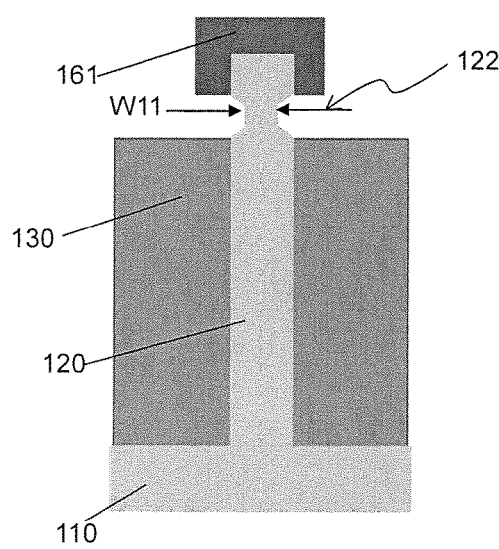

Next, as shown in FIGS. 59A-59B, the exposed portion of the fin structure 120 is sculpted by etching to reduce the width of the exposed portion. In some embodiments, wet etching using TMAH or KOH is used to etch the exposed portion. In other embodiments, dry etching is used. By this etching, the narrowest portion 122 of the sculpted fin structure 120 has a width W11 which is about 30% to about 70% of the original width of the fin structure 120 in some embodiments.

Figure 60A:
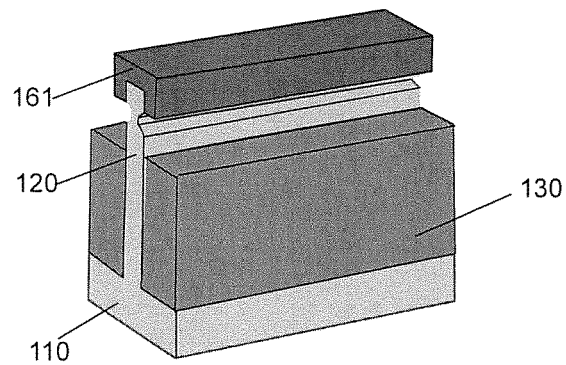
FIGS. 60A and 60B show one of the various stages of manufacturing a semiconductor FET device according to other embodiments of the present disclosure.
Figure 60B:
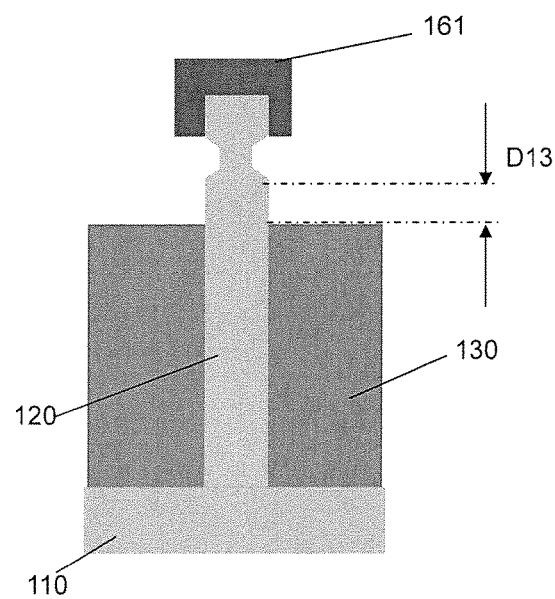

Then, as shown in FIGS. 60A and 60B, the first insulating layer 130 is further recessed to further expose a portion of the fin structure 120. The recess etching includes one or more dry etching and/or wet etching operations. The exposed amount D13 is substantially equal to or smaller than D11 in some embodiments. The exposed amount D13 is about 5 nm to about 20 nm in some embodiments.

Figure 61A:
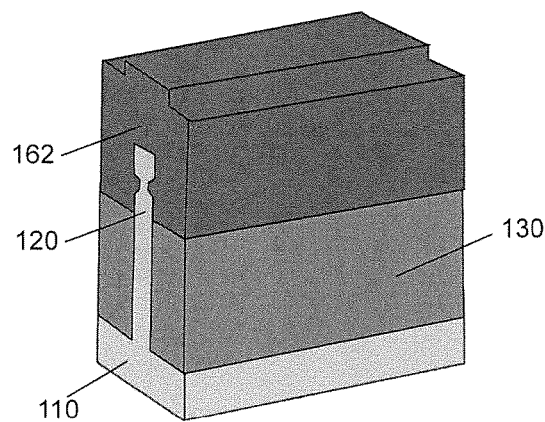
FIGS. 61A and 61B show one of the various stages of manufacturing a semiconductor FET device according to other embodiments of the present disclosure.
Figure 61B:
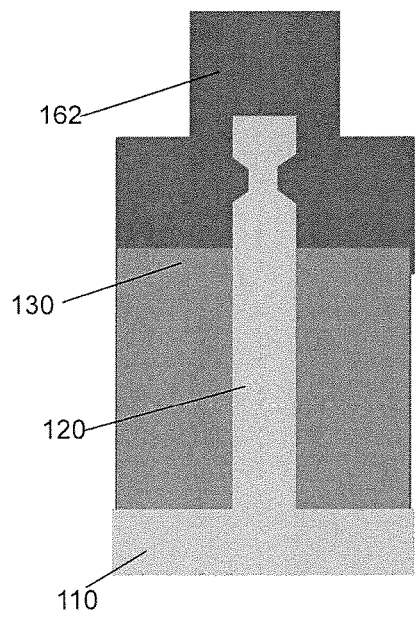

Then, a second cover layer 162 made of one of SiN, SiCN, SiON and SiC is formed as shown in FIGS. 61A and 61B. In some embodiments, the first channel sidewall spacer 161 is removed before the formation of the second cover layer 162. In other embodiments, the first channel sidewall spacer 161 is not removed before the formation of the second cover layer 162. In some embodiments, the second cover layer 162 is made of the same material as the first cover layer 160.

Figure 62A:
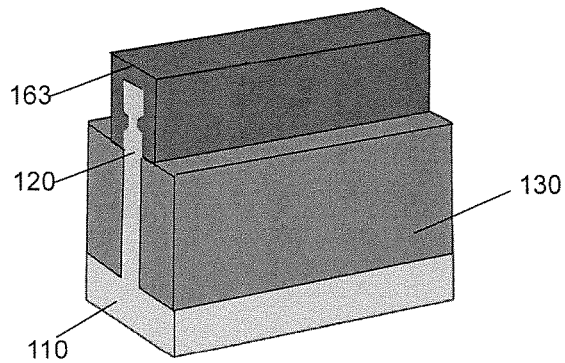
FIGS. 62A and 62B show one of the various stages of manufacturing a semiconductor FET device according to other embodiments of the present disclosure.
Figure 62B:
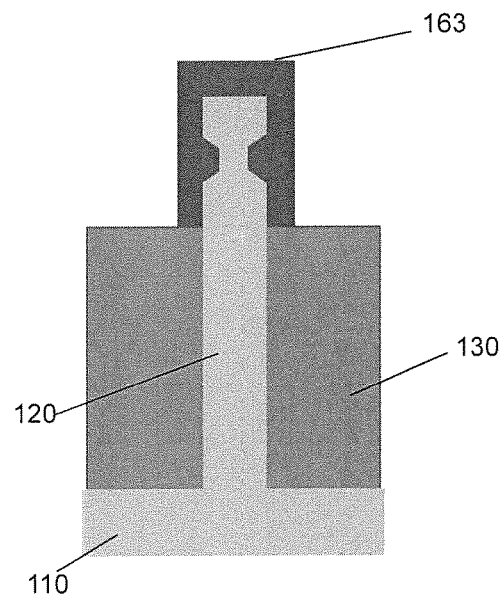
Figure 63A:
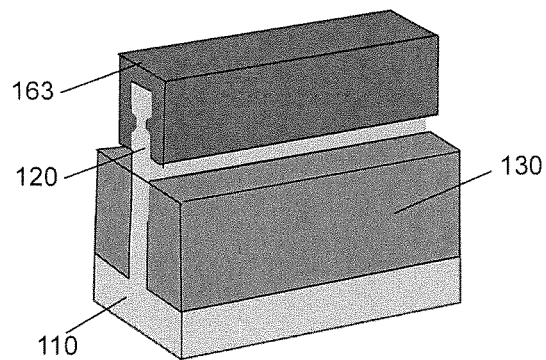
FIGS. 63A and 63B show one of the various stages of manufacturing a semiconductor FET device according to other embodiments of the present disclosure.
Figure 63B:
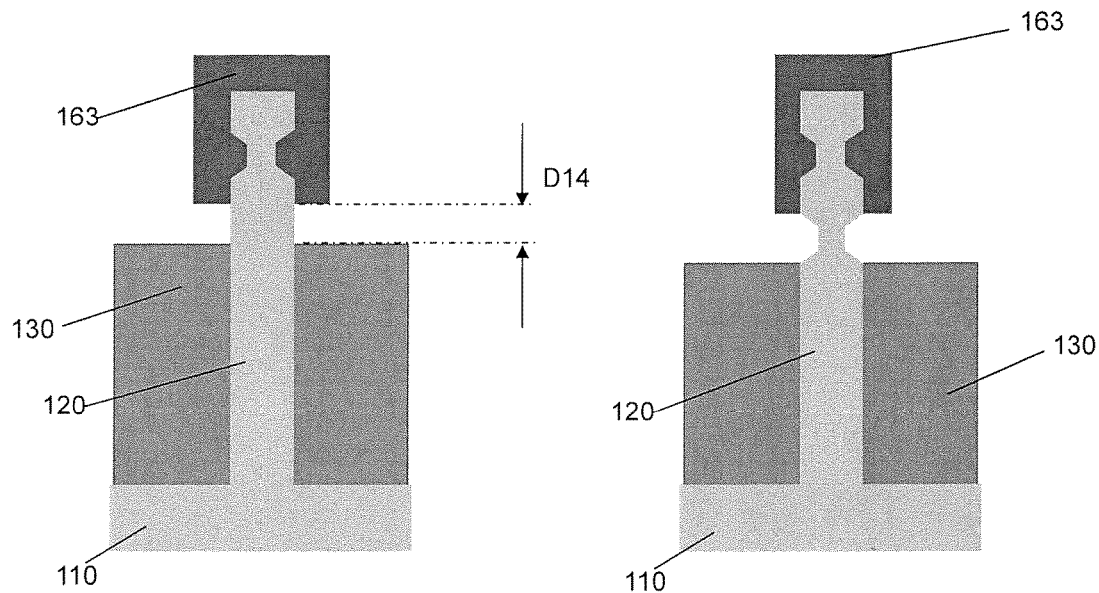

Further, as shown in FIGS. 62A and 62B, anisotropic etching is performed to form second sidewall spacers 163. Then, as shown in FIGS. 63A and 63B, the first insulating layer 130 is further recessed by one or more dry etching and/or wet etching operations to expose a part of the fin structure 120. The exposed amount D14, which is a distance between the bottom of the second sidewall spacers 163 and the upper surface of the recessed first insulating layer 130, is about 5 nm to about 20 nm in some embodiments. In some embodiments, D14 is substantially equal to D12.

Figure 64A:
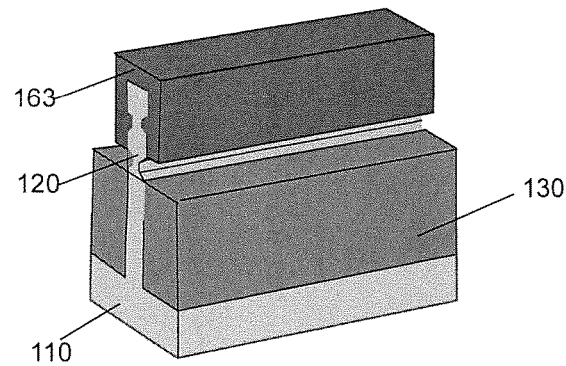
FIGS. 64A and 64B show one of the various stages of manufacturing a semiconductor FET device according to other embodiments of the present disclosure.
Figure 64B:
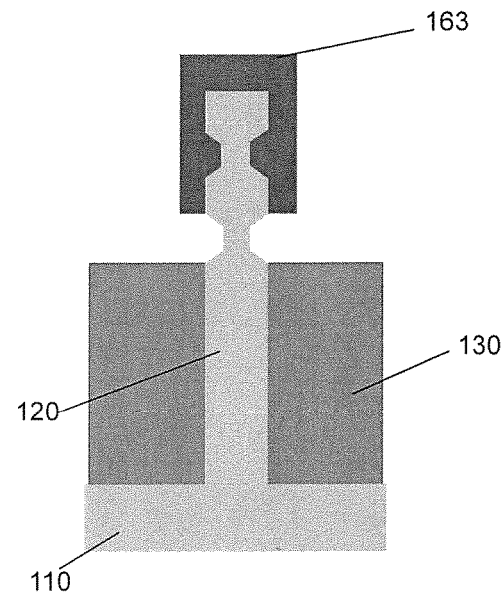

Next, as shown in FIGS. 64A and 64B, the exposed portion of the fin structure 120 is sculpted by being partially etched to reduce the width of the exposed portion, similar to FIGS. 59A and 59B.

The operations of forming a cover layer, recessing the first insulating layer and etching (sculpting) the exposed fin structure are repeated by the desired number of times, for example 3-10 times in total. Thus, a sculpted fin structure 120 is formed in the channel region and the source/drain regions.

Figure 65A:
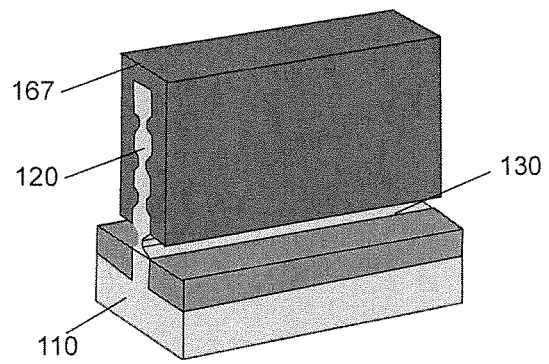
FIGS. 65A and 65B show one of the various stages of manufacturing a semiconductor FET device according to other embodiments of the present disclosure.
Figure 66A:
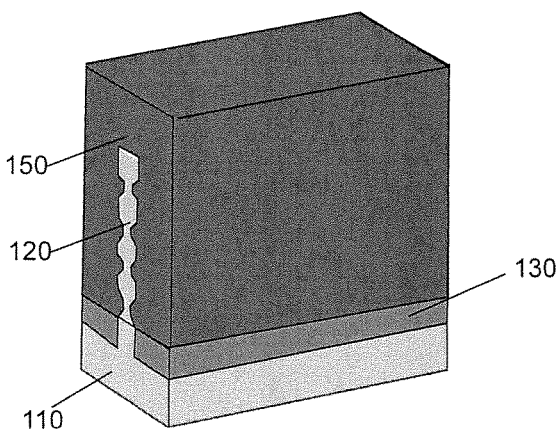
FIGS. 66A and 66B show one of the various stages of manufacturing a semiconductor FET device according to other embodiments of the present disclosure.
Figure 65B:
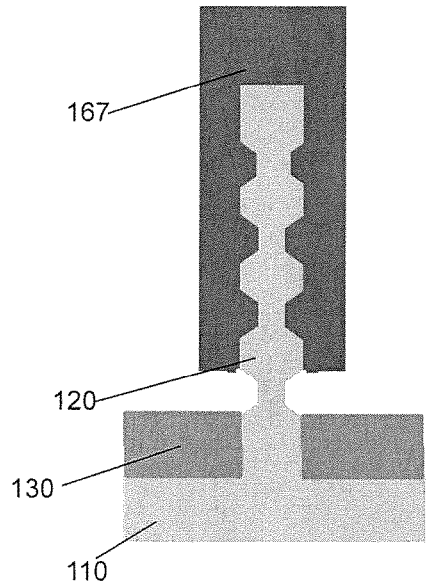
Figure 66B:
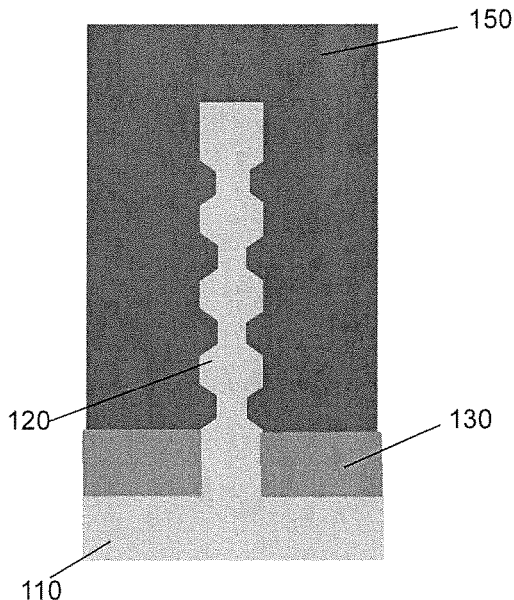

FIGS. 65A and 65B show a structure after the last cover layer 167 is formed and the last sculpting operation is performed. Then, a fin cover layer 149 is formed as shown in FIGS. 66A and 66B. In some embodiments, the fin cover layer 149 is made of the same material as the first to last cover layers, and includes one or more layers of SiN, SiCN, SiON and SiC. Next, as shown in FIGS. 67A and 67B, the fin cover layer is patterned to expose a channel region of the sculpted fin structure and to form an SD cover layer 150.

Figure 69A:
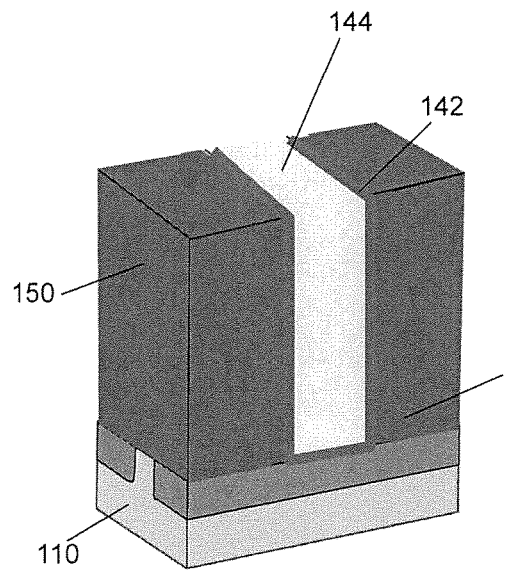
FIGS. 69A and 69B show one of the various stages of manufacturing a semiconductor FET device according to other embodiments of the present disclosure.
Figure 69B:
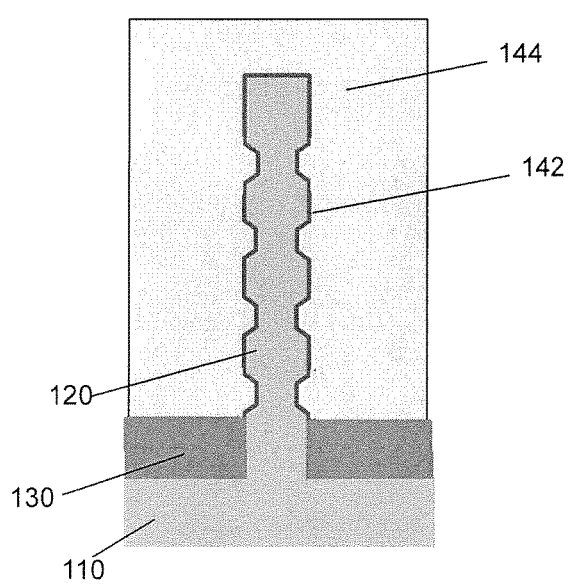

Then, as shown in FIGS. 68A and 68B, a sacrificial gate dielectric layer 142 is formed over the sculpted fin structure 120, and a sacrificial layer 139 is formed. Then, one or more planarization operations, such as an etch back operation and a CMP operation, are performed to form a first sacrificial gate electrode 144, as shown in FIGS. 69A and 69B. In some embodiments, the first sacrificial gate electrode 144 is made of polysilicon or amorphous silicon formed by CVD. The sacrificial gate dielectric layer 142 is made of silicon oxide by CVD.

Figure 70A:
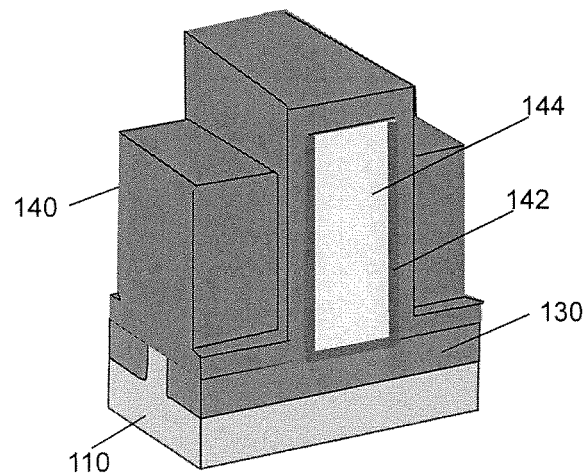
FIGS. 70A and 70B show one of the various stages of manufacturing a semiconductor FET device according to other embodiments of the present disclosure.
Figure 70B:
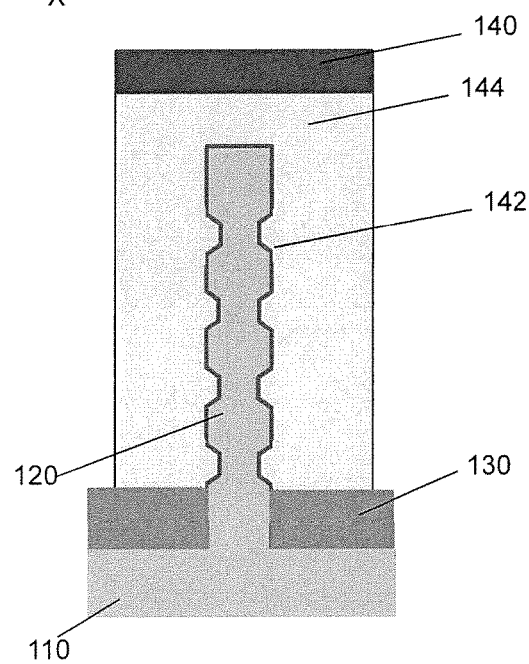

Then, the SD cover layer is removed, and an insulating material layer 140 for gate sidewall spacers is formed as shown in FIGS. 70A and 70B. The insulating material layer 140 includes one or more layers of insulating material, such as SiN, SiON, SiOC, SiOCN and SiCN or any other suitable insulating material. SiC may be used as well. The insulating material layer 140 can be formed by ALD or CVD, or any other suitable method. Then, as shown in FIGS. 71A and 71B, anisotropic etching is performed to form sidewall spacers 145. FIG. 71B shows a cross sectional view along the Y direction cutting the source/drain region. As shown in FIGS. 71A and 71B, remaining portions 147 of the insulating material layer 140 exist in the sculpted portions of the fin structure, and the remaining portions 147 are subsequently removed by one or more dry etching and/or wet etching operations, as shown in FIGS. 72A and 72B. FIG. 72B shows a cross sectional view along the Y direction cutting the source/drain region. In some embodiments, the sidewall spacers 145 are also slightly etched and thus the width thereof becomes smaller.

Figure 73A:
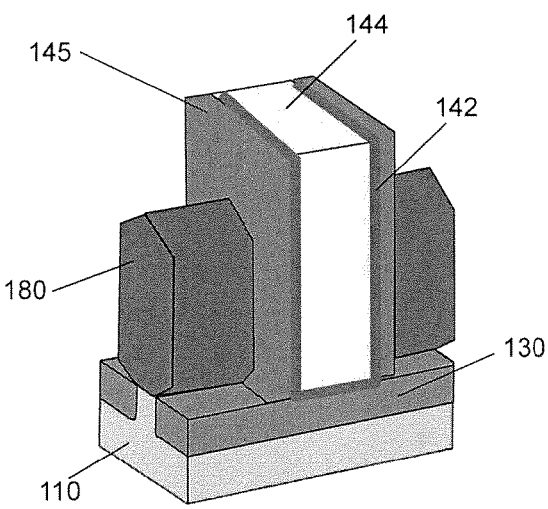
FIGS. 73A and 73B show one of the various stages of manufacturing a semiconductor FET device according to other embodiments of the present disclosure.
Figure 74A:
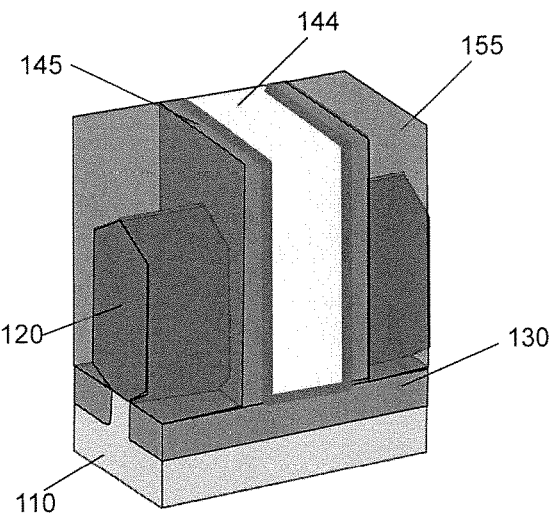
FIGS. 74A and 74B show one of the various stages of manufacturing a semiconductor FET device according to other embodiments of the present disclosure.
Figure 73B:
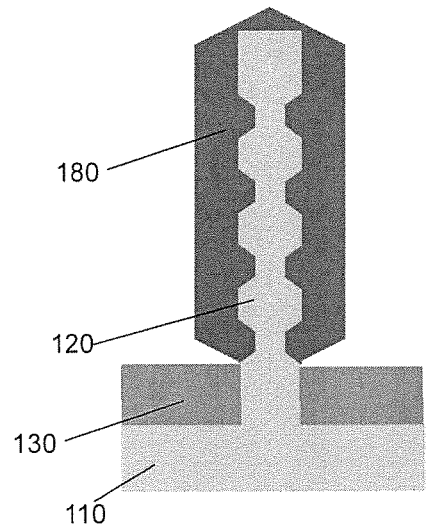
Figure 74B:
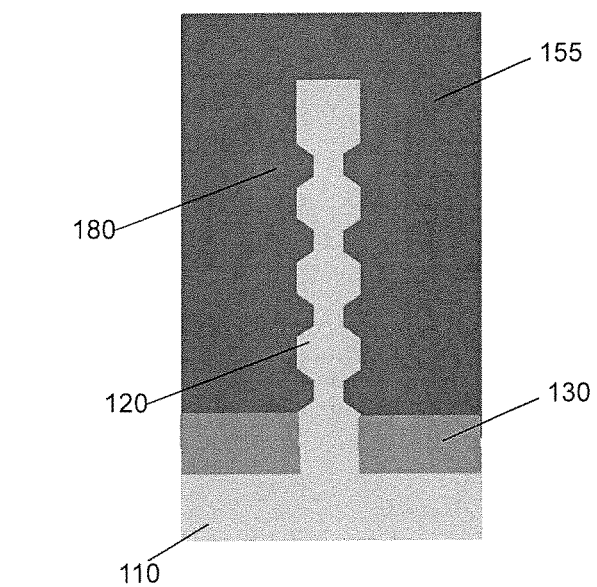
Figure 75A:
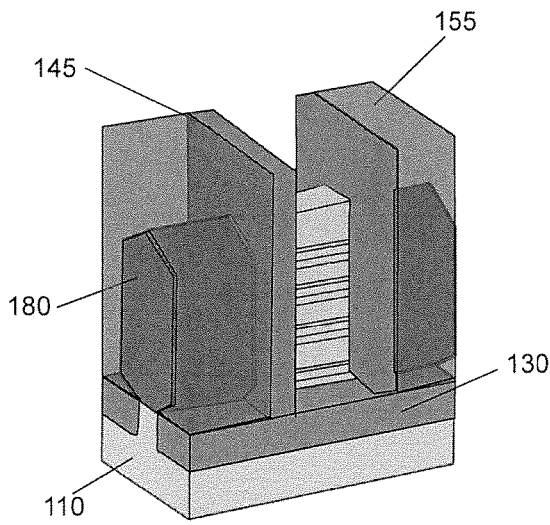
FIGS. 75A and 75B show one of the various stages of manufacturing a semiconductor FET device according to other embodiments of the present disclosure.
Figure 75B:
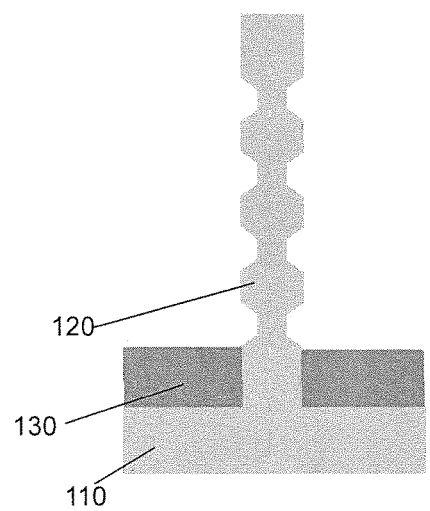

Then, as shown in FIGS. 73A and 73B, a source/drain epitaxial layer 180 is formed over the source/drain region of the sculpted fin structure 120. FIG. 73B shows a cross sectional view along the Y direction cutting the source/drain region. The source/drain epitaxial layer 180 includes one or more layers of Si, SiP, SiC and SiCP for an n-channel FET or Si, SiGe and Ge for a p-channel FET. For the n-channel FET, phosphorus (P) may also be contained in the source/drain. For the p-channel FET, boron (B) may also be contained in the source/drain. The source/drain epitaxial layer 180 is formed by an epitaxial growth method using CVD, ALD or molecular beam epitaxy (MBE). Further, as shown in FIGS. 74A and 74B, an ILD layer 155 is formed. FIG. 74B shows a cross sectional view along the Y direction cutting the source/drain region. The materials for the ILD layer 155 include compounds comprising Si, O, C and/or H, such as silicon oxide, SiON, SiCOH and SiOC. Organic materials, such as polymers, may be used for the ILD layer 155. After the material for the ILD layer 155 is formed, a planarization operation, such as CMP, is performed, so that the top portion of the first sacrificial gate electrode 144 and the sacrificial gate dielectric layer 142 are exposed. Then, the first sacrificial gate electrode 144 and the sacrificial gate dielectric layer 142 are removed, as shown in FIGS. 75A and 75B. FIG. 75B shows a cross sectional view along the Y direction cutting the channel region.

Figure 76A:
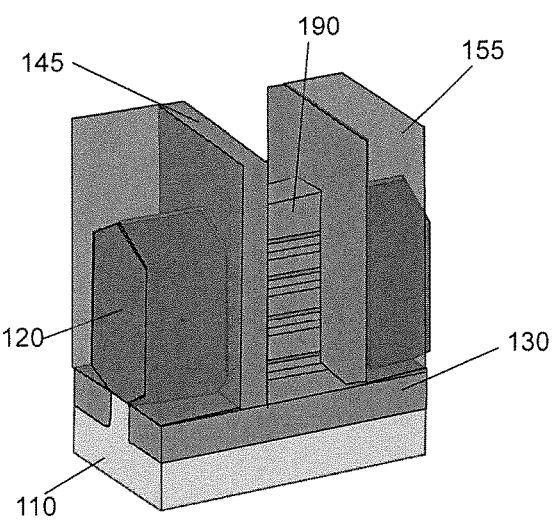
FIGS. 76A and 76B show one of the various stages of manufacturing a semiconductor FET device according to other embodiments of the present disclosure.
Figure 76B:
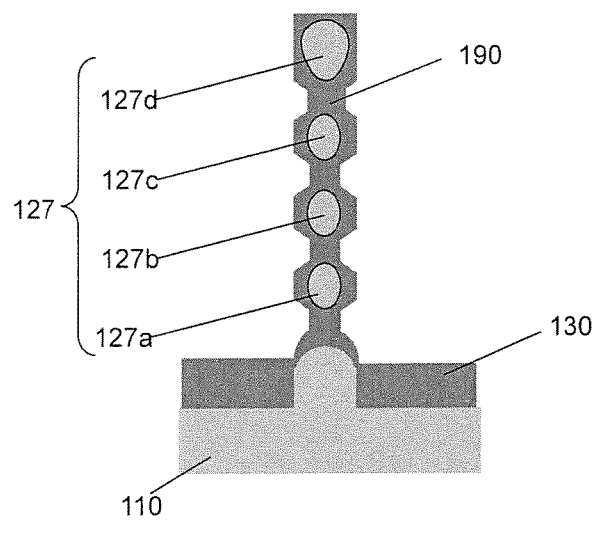

Next, the exposed sculpted fin structure 120 is oxidized to form nanowires 127 separated by oxide 190 as show in FIGS. 76A and 76B. FIG. 76B shows a cross sectional view along the Y direction cutting the channel region. In some embodiments, as shown in FIGS. 76A and 76B, four nanowires 127a-127d are formed, but the number of nanowires is not limited to four. The oxidization process is performed such that the etched narrow portions of the sculpted fin structure 120 are fully oxidized, while non-etched portions of the sculpted fin structure 120 are only partially oxidized. In some embodiments, one or more of a thermal oxidization process, a plasma oxidization process and/or a chemical oxidization process are utilized. In some embodiments, a process temperature of the thermal oxidization is in a range from about 500° C. to about 800° C. In some embodiments, a process temperature of the plasma oxidization is in a range from about 300° C. to about 500° C. The ILD layer 155 protects the S/D structures 180 during the oxidation of the exposed fin structure 120.

Figure 77A:
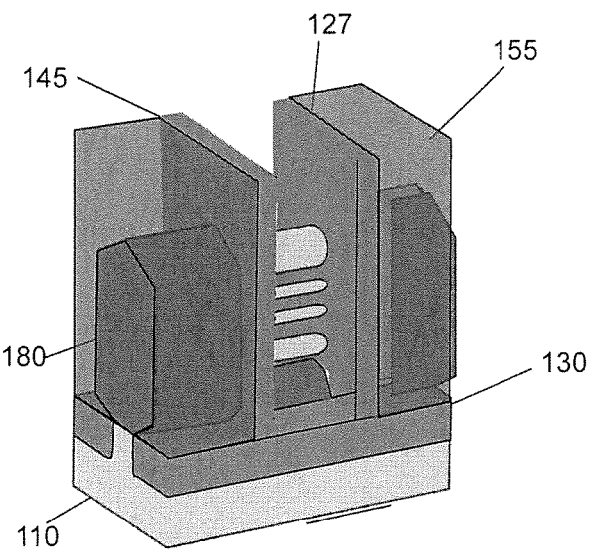
FIGS. 77A and 77B show one of the various stages of manufacturing a semiconductor FET device according to other embodiments of the present disclosure.
Figure 77B:
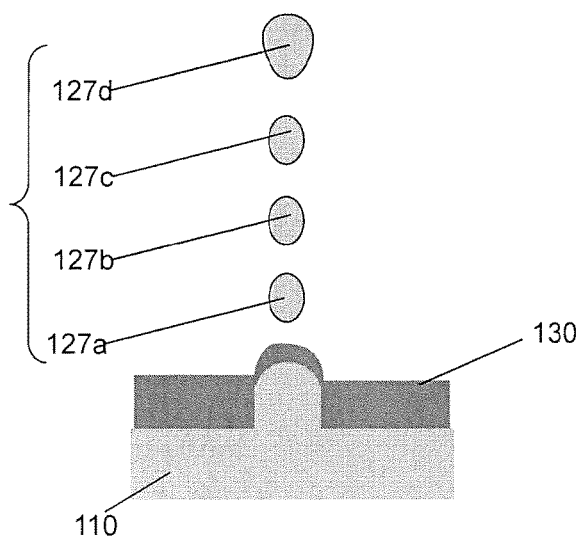

Then, as shown in FIGS. 77A and 77B, the oxide 190 is removed to release the semiconductor nanowires 127. FIG. 77B shows a cross sectional view along the Y direction cutting the channel region. After the semiconductor nanowires 127 are formed, a gate dielectric layer is formed around each nanowire 127 and a gate electrode layer is formed on the gate dielectric layer, similar to FIGS. 34A and 34B. It is understood that the GAA FETs undergoes further CMOS processes to form various features such as contacts/vias, interconnect metal layers, dielectric layers, passivation layers, etc.

Figure 78:
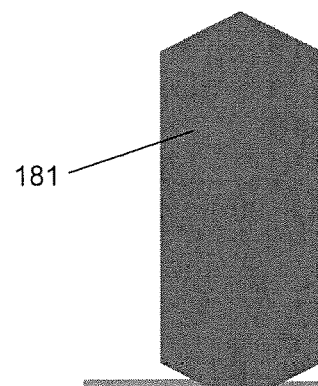
FIG. 78 shows one of the various stages of manufacturing a semiconductor FET device according to another embodiment of the present disclosure.

In some embodiments, before the source/drain epitaxial layer is formed, the sculpted fin structures of the source/drain regions are recessed down to about the upper surface of the first insulating layer 130, and then the source/drain epitaxial layer 181 is formed, as shown in FIG. 78, which shows a cross sectional view along the Y direction cutting the source/drain region.

FIGS. 79A-87C show an exemplary sequential operation for manufacturing the GAA FET according to another embodiment of the present disclosure. It is understood that additional operations can be provided before, during, and after processes shown by FIGS. 79A-87B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-78 may be employed in the following embodiments, and detailed explanation thereof may be omitted.

FIGS. 79A and 79B are the same as FIGS. 71A and 71B. Then, a second SD cover layer 157 is formed as shown in FIGS. 80A and 80B. FIG. 80B shows a cross sectional view along the Y direction cutting the source/drain region. In some embodiments, the SD cover layer 157 includes one or more layers of SiN, SiCN, SiON and SiC.

Figures 81A, 82A:
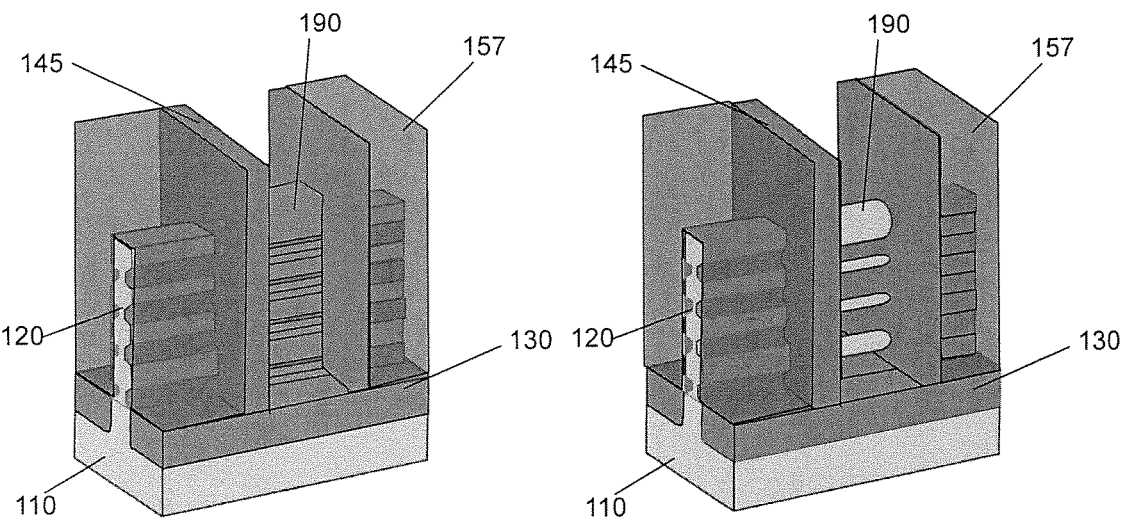
FIGS. 81A and 81B show one of the various stages of manufacturing a semiconductor FET device according to other embodiments of the present disclosure.
FIGS. 82A and 82B show one of the various stages of manufacturing a semiconductor FET device according to other embodiments of the present disclosure.
Figures 81B, 82B:
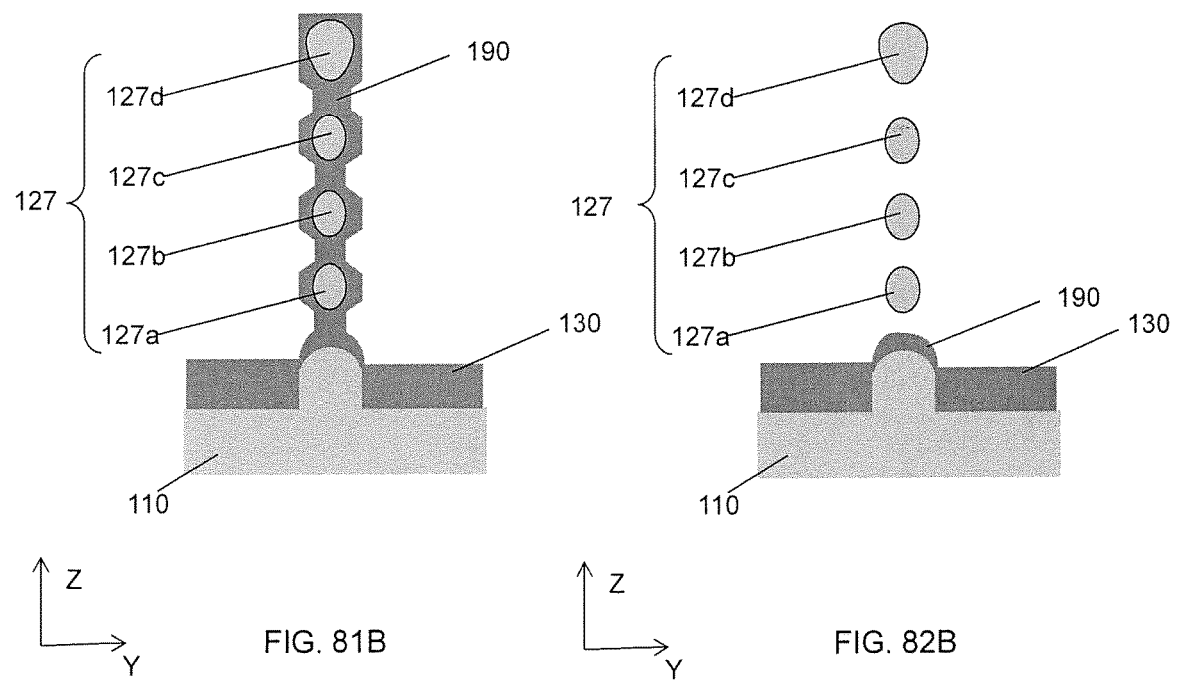

Then, the first sacrificial gate electrode 144 and the sacrificial gate dielectric layer 142 are removed to expose the sculpted fin structure 120. Next, the exposed sculpted fin structure 120 is oxidized to form nanowires 127 separated by oxide 190 as show in FIGS. 81A and 81B, similar to FIGS. 76A and 76B. FIG. 81B shows a cross sectional view along the Y direction cutting the channel region. In some embodiments, as shown in FIGS. 81A and 81B, four nanowires 127a-127d are formed, but the number of nanowires is not limited to four. The oxidization process is performed such that the etched narrow portions of the sculpted fin structure 120 are fully oxidized, while non-etched portions of the sculpted fin structure 120 are only partially oxidized. In some embodiments, one or more of a thermal oxidization process, a plasma oxidization process and/or a chemical oxidization process are utilized. In some embodiments, a process temperature of the thermal oxidization is in a range from about 500° C. to about 800° C. In some embodiments, a process temperature of the plasma oxidization is in a range from about 300° C. to about 500° C. The second SD cover layer 157 protects the source/drain regions of the fin structure 120 during the oxidation of the channel region of the exposed fin structure 120.

Then, as shown in FIGS. 82A and 82B, the oxide 190 is removed to release the semiconductor nanowires 127. FIG. 82B shows a cross sectional view along the Y direction cutting the channel region. After the semiconductor nanowires 127 are formed, a sacrificial gate dielectric layer 172 is formed around each nanowire 127 and a sacrificial layer 169 is formed on the gate dielectric layer 172, as shown in FIGS. 83A and 83B. Then, one or more planarization operations, such as an etch back operation and a CMP operation, are performed to form a second sacrificial gate electrode 170 over the sacrificial gate dielectric layer 172, as shown in FIGS. 84A and 84B.

Figure 85A:
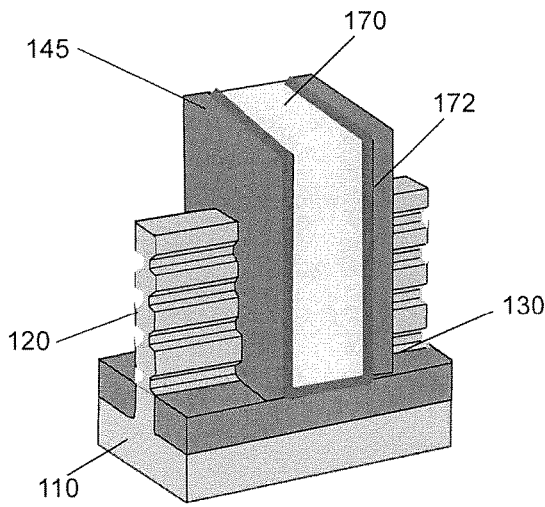
FIGS. 85A and 85B show one of the various stages of manufacturing a semiconductor FET device according to other embodiments of the present disclosure.
Figure 85B:
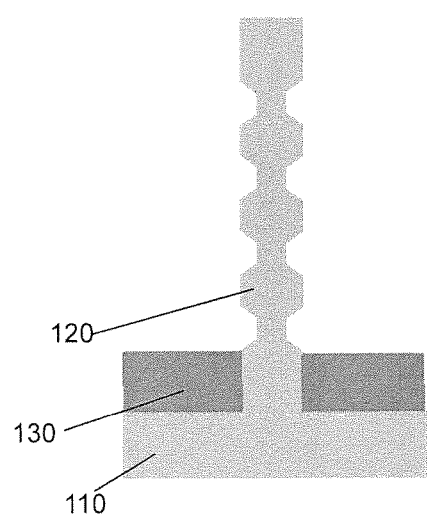

Subsequently, the second SD cover layer 157 is removed and the remaining portions 147 of the insulating material layer 140 are removed from the source/drain regions, as shown in FIGS. 85A and 85B. FIG. 85B shows a cross sectional view along the Y direction cutting the source/drain region. In some embodiments, the remaining portions 147 of the insulating material layer 140 remain under the sidewall spacers 145.

Figure 86A:
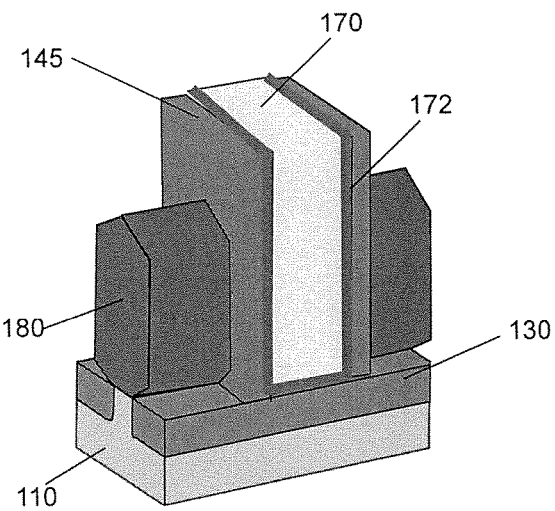
FIGS. 86A and 86B show one of the various stages of manufacturing a semiconductor FET device according to other embodiments of the present disclosure.
Figure 86B:
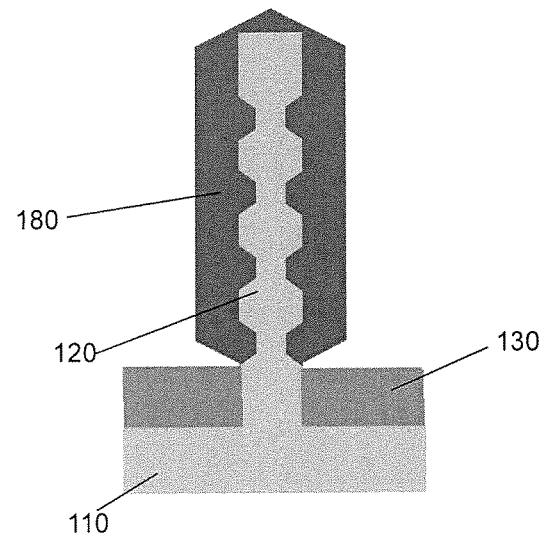

Then, similar to FIGS. 73A and 73B, a source/drain epitaxial layer 180 is formed over the source/drain region of the sculpted fin structure 120, as shown in FIGS. 86A and 86B. FIG. 86B shows a cross sectional view along the Y direction cutting the source/drain region.

Figure 87A:
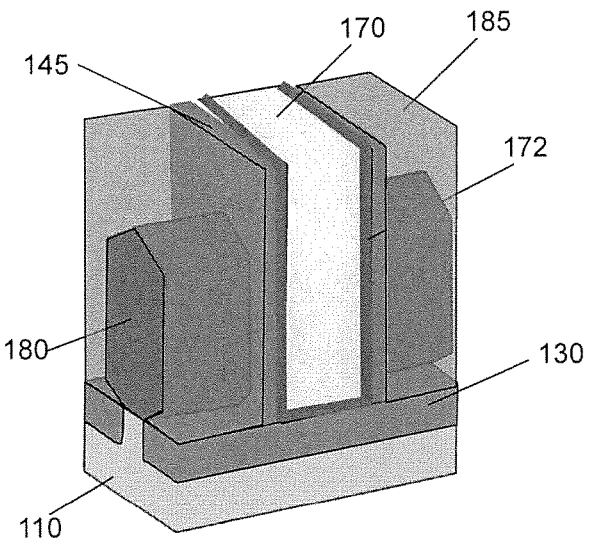
FIGS. 87A-87C show one of the various stages of manufacturing a semiconductor FET device according to other embodiments of the present disclosure.
Figure 87B:
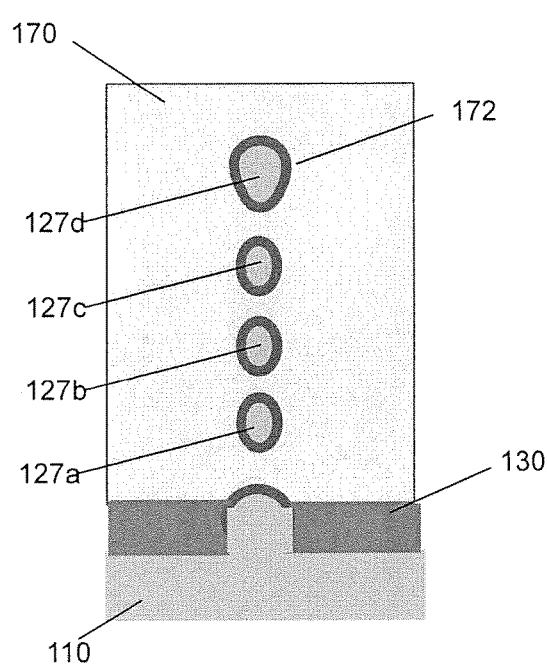
Figure 87C:
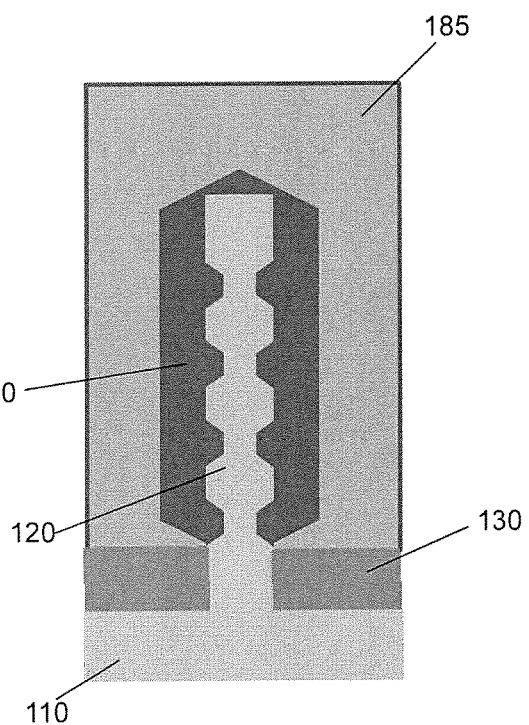

Further, as shown in FIGS. 87A-87C, an ILD layer 185 is formed over the source/drain epitaxial layer 180. FIG. 87B shows a cross sectional view along the Y direction cutting the channel region and FIG. 87C shows a cross sectional view along the Y direction cutting the channel region source/drain region. In some embodiments, before the source/drain epitaxial layer is formed, the sculpted fin structures of the source/drain regions are recessed down to about the upper surface of the first insulating layer 130, and then the source/drain epitaxial layer 181 is formed, similar to FIG. 78. Then, the second sacrificial gate electrode 170 and the sacrificial gate dielectric layer 172 are removed, and a gate dielectric layer and a metal gate electrode are framed, similar to FIGS. 34A and 34B.

FIGS. 88-93 show an exemplary sequential operation for manufacturing the GAA FET according to another embodiment of the present disclosure. It is understood that additional operations can be provided before, during, and after processes shown by FIGS. 88-93, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-87C may be employed in the following embodiments, and detailed explanation thereof may be omitted.

Figure 88:
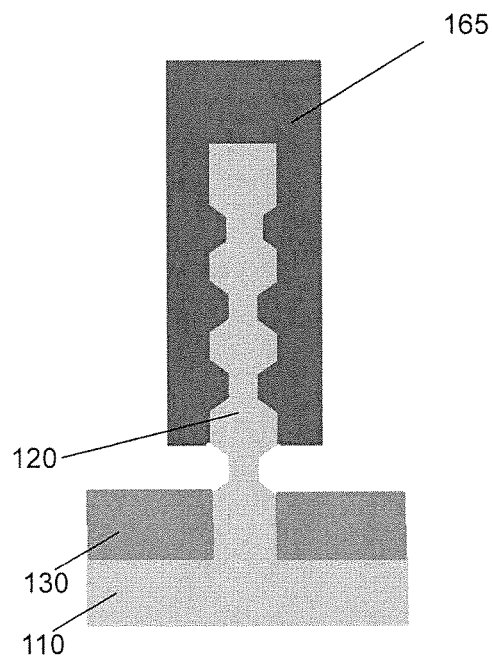
FIG. 88 shows one of the various stages of manufacturing a semiconductor FET device according to other embodiments of the present disclosure.
Figure 89:
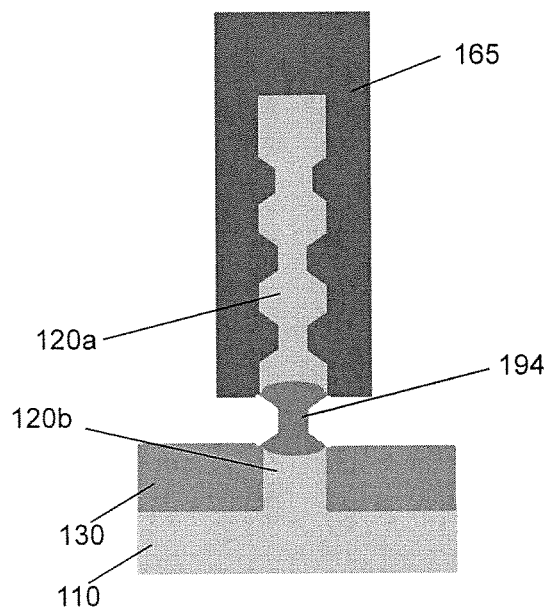
FIG. 89 shows one of the various stages of manufacturing a semiconductor FET device according to other embodiments of the present disclosure.
Figure 90:
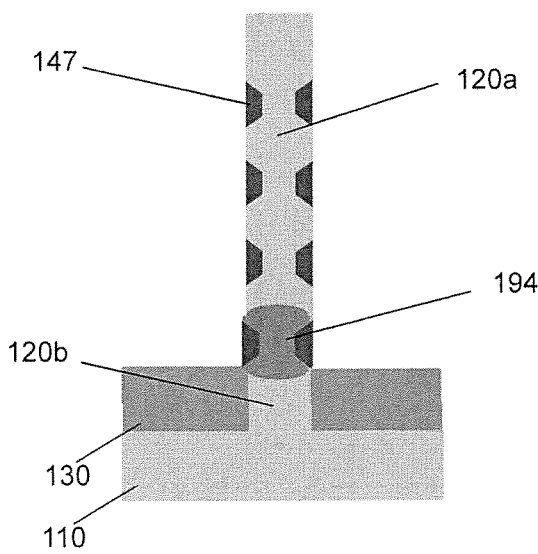
FIG. 90 shows one of the various stages of manufacturing a semiconductor FET device according to other embodiments of the present disclosure.
Figure 91:
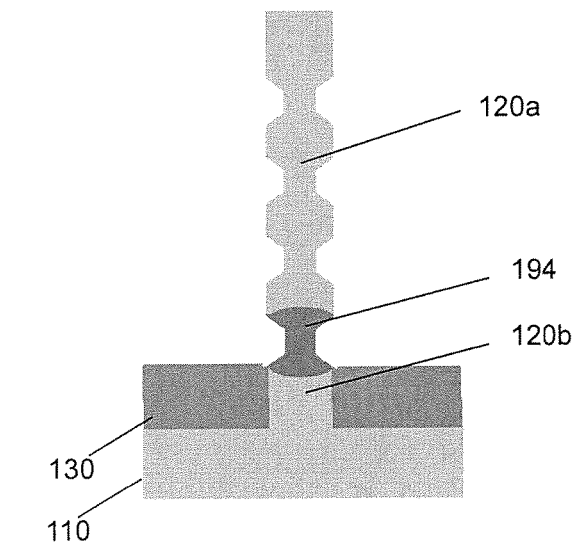
FIG. 91 shows one of the various stages of manufacturing a semiconductor FET device according to other embodiments of the present disclosure.

FIG. 88 shows a structure the same as that of FIGS. 65A and 65B. FIG. 88 is a cross sectional view along the Y direction cutting the source/drain region. Then, an oxidization operation is performed to fully oxidize the bottommost sculpted portion of the fin structure 120 to form oxide 194, as shown in FIG. 89. The oxidization operation is the same as or similar to that for making channel nanowires as set forth above. By the oxidation process, the fin structure 120 is divided into an upper portion 120a and a bottom portion 120b. Subsequently, the manufacturing operations explained with respect to FIGS. 66A-71B are performed. FIG. 90 shows a cross sectional view along the Y direction cutting the source/drain region, after the remaining portions 147 are formed. Then, as shown in FIG. 91, which is a cross sectional view along the Y direction cutting the source/drain region, the remaining portions 147 are removed, similar to FIGS. 72A and 72B. Further, as shown in FIG. 92, which is a cross sectional view along the Y direction cutting the source/drain region, a source/drain epitaxial layer 180 is formed to cover the upper portion 120a of the fin structure. In this embodiment, the source/drain region of the fin structure with the epitaxial layer is electrically separated by the oxide 194 from the bottom portion of the fin structure 120b and the substrate 110. At the channel region, an oxidation operation explained with respect to FIGS. 81A and 81B is performed and then semiconductor nanowires 127 are formed. FIG. 93 shows a cross sectional view along the Y direction cutting the channel region, after the oxide 190 is formed.

FIGS. 94-100 show an exemplary sequential operation for manufacturing the GAA FET according to another embodiment of the present disclosure. It is understood that additional operations can be provided before, during, and after processes shown by FIGS. 94-100, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1-93 may be employed in the following embodiments, and detailed explanation thereof may be omitted.

In the foregoing embodiments, the fin structures 20 and 120 are formed by etching a bulk silicon substrate (silicon wafer). In the forgoing embodiments, a silicon germanium (SiGe) channel is utilized for, in particular, a p-type GAA FET. A sculpted fin structure is formed from a SiGe fin structure.

Figure 53B:
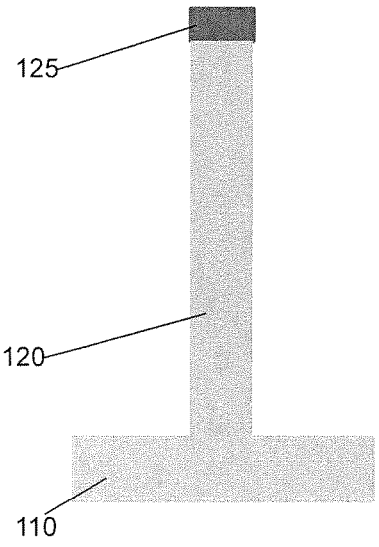

FIG. 94 shows the same structure as FIGS. 2, 53A and 53B, in which a fin structure 220 formed by etching a silicon substrate 210 using a hard mask 215 is shown. Then, an insulating layer 230 is formed as shown in FIG. 95. The insulating layer 230 is the same as or similar to the isolation insulating layer 30 or the first insulating layer 130.

Next, the hard mask 215 and an upper portion of the fin structure 220 is removed by etching to form a space 222, as shown in FIG. 96. Then, a SiGe fin structure 225 is epitaxially formed in the space 222, as shown in FIG. 97. In some embodiments, the SiGe fin structure is made of $Si_{1-x}Ge_x$, where x is more than about 0.1 to about 1.0. In some embodiments, one or more buffer layers made of $Si_{1-y}Ge_y$, where y<x is formed between the etched fin structure 220 and the SiGe fin structure 225.

Figure 98:
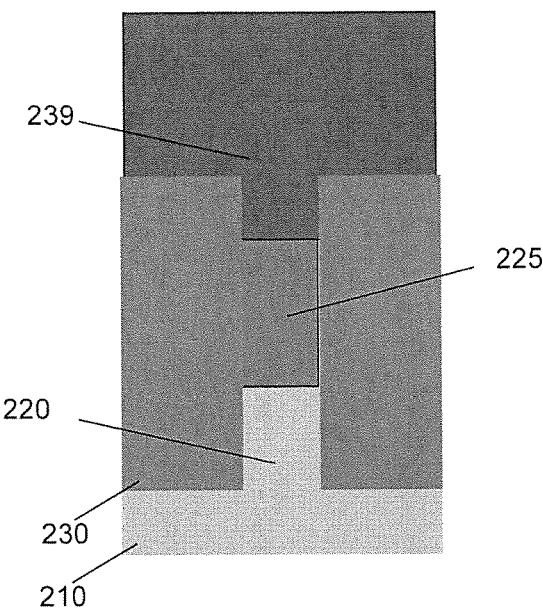
FIG. 98 shows one of the various stages of manufacturing a semiconductor FET device according to other embodiments of the present disclosure.
Figure 99:
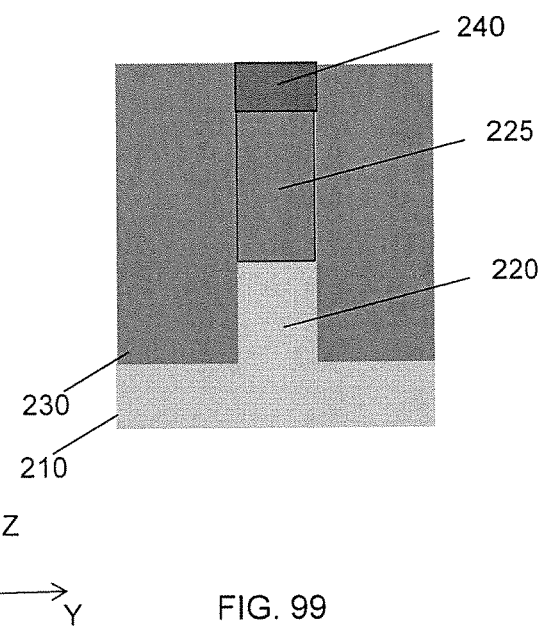
FIG. 99 shows one of the various stages of manufacturing a semiconductor FET device according to other embodiments of the present disclosure.

Next, an insulating layer 239 is formed over the SiGe fin structure 235 and the insulating layer 230 as shown in FIG. 98, and then one or more planarization operations, such as CMP, are performed to expose the insulating layer 230 as shown in FIG. 99. With this operation, a cap insulating layer 240 is formed on the SiGe fin structure 235.

Figure 100:
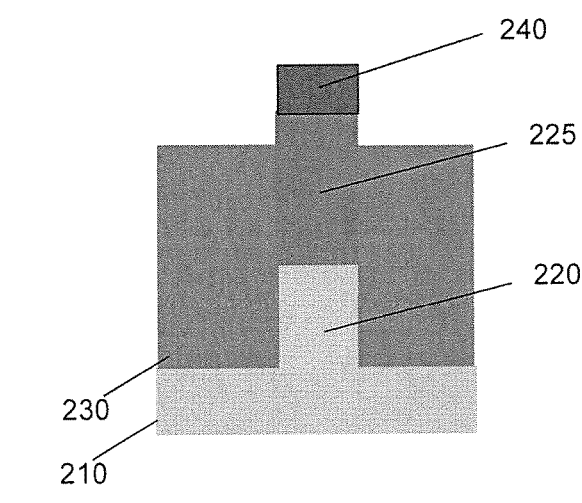
FIG. 100 shows one of the various stages of manufacturing a semiconductor FET device according to other embodiments of the present disclosure.

Then, the insulating layer 230 is recessed as shown in FIG. 100, which corresponds to the structure of FIGS. 55A and 55B. In some embodiments, the insulating layer 230 is further recessed to expose the entire SiGe fin structure, which corresponds to the structure of FIG. 3. Subsequently, the operations to form a sculpted fin structure and semiconductor nanowires are performed to manufacture a GAA FET.

In some embodiments, after at least two structures of FIG. 95 are formed, one of the structures is processed to manufacture a SiGe fin structure for a p-type GAA FET with the operations explained with respect to FIGS. 96-100. On the other hand, one of the structures is covered by a cover layer during the operations to form a p-type GAA FET, and after the cover layer is removed, the operations for manufactures an n-type GAA FET are performed.

The various embodiments or examples described herein offer several advantages over the existing art. For example, in the present disclosure, nanowires can be manufactured without using a stacked layer structure, such as Si/SiGe, and thus it is possible to simplify a manufacturing process and to reduce manufacturing cost.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin structure is formed over a substrate. The fin structure is sculpted to have a plurality of non-etched portions and a plurality of etched portions having a narrower width than the plurality of non-etched portions. The sculpted fin structure is oxidized so that a plurality of nanowires are formed in the plurality of non-etched portions, respectively, and the plurality of etched portions are oxidized to form oxides. The plurality of nanowires are released by removing the oxides. In one or more of the foregoing and the following embodiments, the sculpting the fin structure includes (i) covering the fin structure except for an exposed portion corresponding to one of the plurality of etched portions, and (ii) etching the exposed portion to form the one of the plurality of etched portions. In one or more of the foregoing and the following embodiments, (i) and (ii) are repeated twice or more to form the plurality of etched portions. In one or more of the foregoing and the following embodiments, (i) and (ii) are repeated from a portion corresponding to an uppermost one of the plurality of etched portions to a portion corresponding to a bottommost one of the plurality of etched portions. In one or more of the foregoing and the following embodiments, in (i), a lower portion of the fin structure below the exposed portion is covered by a first insulating layer, and an upper portion of the fin structure above the exposed portion is covered by a channel cover layer. In one or more of the foregoing and the following embodiments, wherein the insulating layer includes silicon oxide. In one or more of the foregoing and the following embodiments, the channel cover layer includes one of SiN, SiCN, SiON and SiC. In one or more of the foregoing and the following embodiments, the fin structure includes a channel region and source/drain regions, and during the sculpting, the source/drain regions are covered by a source/drain cover layer. In one or more of the foregoing and the following embodiments, the source/drain cover layer and the channel cover layer are made of the same material. In one or more of the foregoing and the following embodiments, the source/drain cover layer and the channel cover layer are made of different material from each other. In one or more of the foregoing and the following embodiments, the source/drain cover layer includes one of SiN, SiCN, SiON and SiC. In one or more of the foregoing and the following embodiments, after the sculpting, a sacrificial gate structure is formed to cover the sculpted fin structure, the source/drain cover layer is removed, source/drain epitaxial layers are formed over the source/drain regions of the fin structure, the source/drain epitaxial layers are covered with a dielectric layer, and the sacrificial gate structure is removed. After the sacrificial gate structure is removed, the oxidizing and the releasing are performed, and a gate dielectric layer is formed over each of the released nanowires and a gate electrode layer is formed over the gate dielectric layer. In one or more of the foregoing and the following embodiments, a fin cover layer is disposed between the sacrificial gate structure and the sculpted fin structure. In one or more of the foregoing and the following embodiments, during the sculpting, the oxidizing and the releasing, the source/drain regions are covered by the source/drain cover layer. Further, after the releasing, a sacrificial gate structure is formed over the released nanowires, the source/drain cover layer is removed, source/drain epitaxial layers are formed over the source/drain regions of the fin structure, the source/drain epitaxial layers are covered with a dielectric layer, the sacrificial gate structure are removed, and a gate dielectric layer is formed over each of the nanowires and forming a gate electrode layer over the gate dielectric layer. In one or more of the foregoing and the following embodiments, the oxidizing is performed by one of thermal oxidation, plasma oxidation and chemical oxidation.

In accordance with another aspect of the present disclosure, in a method of manufacturing a semiconductor device, a fin structure is formed over a substrate. The fin structure is sculpted to have a plurality of non-etched portions and a plurality of etched portions having a narrower width than the plurality of non-etched portions. The sculpted fin structure is covered with a fin cover layer. Etching on the fin cover layer is performed so that remaining portions of the fin cover layer exist in the plurality of etched portions. The sculpted fin structure is oxidized so that a plurality of nanowires are formed in the plurality of etched portions, respectively, and the plurality of none-etched portions are oxidized to form oxides. The plurality of nanowires are released by removing the oxides. The remaining portions of the fin cover layer are removed. In one or more of the foregoing and the following embodiments, the sculpting the fin structure includes (i) covering the fin structure except for a portion corresponding to one of the plurality of etched portions, (ii) etching the exposed portion to form the one of the plurality of etched portions, and repeating (i) and (ii) twice or more to form the plurality of etched portions. In one or more of the foregoing and the following embodiments, in (i), a lower portion of the fin structure below the exposed portion is covered by a first insulating layer, and an upper portion of the fin structure above the exposed portion is covered by a channel cover layer. In one or more of the foregoing and the following embodiments, the insulating layer and the channel cover layer are made of different materials from each other.

In accordance with another aspect of the present disclosure, in a method of manufacturing a semiconductor device, a fin structure is formed over a substrate. The fin structure is sculpted to have a plurality of non-etched portions and a plurality of etched portions having a narrower width than the plurality of non-etched portions. A bottommost one of the plurality of etched portions is removed. The sculpted fin structure is oxidized so that a plurality of nanowires are formed in the plurality of non-etched portions, respectively, and the plurality of etched portions are oxidized to form oxides. The plurality of nanowires are released by removing the oxides.

In accordance with one aspect of the present disclosure, a semiconductor device includes a plurality of semiconductor wires, a gate dielectric layer wrapping around each of the plurality of semiconductor wires, and a gate electrode layer disposed over the gate dielectric layer. A cross sectional shape of an uppermost one of the plurality of semiconductor wires has a tear-drop shape and has a largest area among the plurality of semiconductor wires.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin structure over a substrate;
    forming a first insulating layer covering a bottom part of the fin structure;
    forming a second insulating layer over the first insulating layer;
    sculpting a side face of the fin structure protruding from the second insulating layer to have a plurality of non-etched portions and a plurality of etched portions having a narrower width than the plurality of non-etched portions;
    oxidizing the sculpted fin structure so that a plurality of nanowires are formed in the plurality of non-etched portions, respectively, and the plurality of etched portions are oxidized to form oxide, wherein adjacent nanowires are connected by the oxide; and
    releasing the plurality of nanowires by removing the oxide,
    wherein the sculpting the fin structure includes:
        (i) forming a cover layer on the side face and a top face of the fin structure, the cover layer being in contact with the second isolation insulating layer;
        (ii) etching the second insulating layer to expose a part of the side face of the fin structure corresponding to one of the plurality of etched portions;
        (iii) etching the exposed portion of the side face, while a part of the side face and the top of the fin structure is covered by the cover layer, to form the one of the plurality of etched portions; and
        (iv) after (iii), further etching the second insulating layer, and removing the cover layer.

2. The method of claim 1, wherein in (iii) the exposed portion is a portion between a bottom of the cover layer formed on the side face of the fin structure and an upper surface of the second insulating layer.

3. The method of claim 1, wherein (i) to (iv) are repeated twice or more to form the plurality of etched portions.

4. The method of claim 3, wherein (i) to (iv) are repeated from a portion corresponding to an uppermost one of the plurality of etched portions to a portion corresponding to a bottommost one of the plurality of etched portions.

5. The method of claim 1, wherein the fin structure includes a hard mask layer on the top of the fin structure, and the cover layer is formed on the hard mask layer.

6. The method of claim 1, wherein the first insulating layer includes silicon oxide.

7. The method of claim 5, wherein the channel cover layer includes one of SiN, SiCN, SiON and SiC.

8. The method of claim 1, wherein:
    the fin structure includes a channel region and source/drain regions, and
    during the sculpting, the source/drain regions are covered by a source/drain cover layer.

9. The method of claim 8, wherein the source/drain cover layer and the channel cover layer are made of the same material.

10. The method of claim 8, wherein the source/drain cover layer and the channel cover layer are made of different material from each other.

11. The method of claim 8, wherein the source/drain cover layer includes one of SiN, SiCN, SiON and SiC.

12. The method of claim 8, further comprising:
    after the sculpting, forming a sacrificial gate structure to cover the sculpted tin structure;
    removing the source/drain cover layer;
    forming source/drain epitaxial layers over the source/drain regions of the fin structure;
    covering the source/drain epitaxial layers with a dielectric layer; and
    removing the sacrificial gate structure, wherein:
    after the sacrificial gate structure is removed, the oxidizing and the releasing are performed, and
    a gate dielectric layer is formed over each of the released nanowires and a gate electrode layer is formed over the gate dielectric layer.

13. The method of claim 12, wherein a fin cover layer is disposed between the sacrificial gate structure and the sculpted fin structure.

14. The method of claim 8, wherein:
    during the sculpting, the oxidizing and the releasing, the source/drain regions are covered by the source/drain cover layer, and
    the method further comprises, after the releasing:
    forming a sacrificial gate structure over the released nanowires;
    removing the source/drain cover layer;
    forming source/drain epitaxial layers over the source/drain regions of the fin structure;
    covering the source/drain epitaxial layers with a dielectric layer;
    removing the sacrificial gate structure; and
    forming a gate dielectric layer over each of the nanowires and forming a gate electrode layer over the gate dielectric layer.

15. The method of claim 1, wherein the oxidizing is performed by one of thermal oxidation, plasma oxidation and chemical oxidation.

16. A method of manufacturing a semiconductor device, comprising:
    forming a fin structure over a substrate;
    forming an isolation insulating layer covering a bottom part of the fin structure;
    forming a first sacrificial gate structure over the fin structure;
    forming sidewall spacers on opposing side faces of the first sacrificial gate structure;
    removing the first sacrificial gate structure leaving the sidewall spacers;
    sculpting a side face of a channel region of the fin structure protruding from the isolation insulating layer to have a plurality of non-etched portions and a plurality of etched portions having a narrower width than the plurality of non-etched portions;
    oxidizing the sculpted fin structure so that a plurality of nanowires are formed in the plurality of non-etched portions, respectively, and the plurality of etched portions are oxidized to form oxide, wherein adjacent nanowires are connected by the oxide; and
    releasing the plurality of nanowires by removing the oxide,
    wherein the sculpting the fin structure includes:
        (i) forming an insulating layer over the isolation insulating layer;
        (ii) forming a cover layer on the side face and a top face of the fin structure and on the insulating layer;
        (iii) etching the insulating layer to expose a part of the side face of the fin structure corresponding to one of the plurality of etched portions;
        (iv) etching the exposed portion of the side face, while a part of the side face and the top of the fin structure is covered by the cover layer, to form the one of the plurality of etched portions; and (v) after (iv), further etching the insulating layer, and removing the cover layer.

17. The method of claim 16, wherein the fin structure includes a hard mask layer on the top of the fin structure, and the cover layer is formed on the hard mask layer.

18. The method of claim 16, further comprising forming a source/drain cover layer after the sidewall spacers are formed, wherein during the sculpting, source/drain regions of the tri structure are covered by the source/drain cover layer.

19. A method of manufacturing a semiconductor device, comprising:

forming a fin structure over a substrate;

forming a first sacrificial gate structure over the fin structure;

forming sidewall spacers on opposing side faces of the first sacrificial gate structure;

removing the first sacrificial gate structure leaving the sidewall spacers;

sculpting a channel region of the fin structure to have a plurality of non-etched portions and a plurality of etched portions having a narrower width than the plurality of non-etched portions;

forming a second sacrificial gate structure over the sculpted fin structure;

forming a source/drain epitaxial layer over a source/drain region of the fin structure;

covering the source/drain epitaxial layer;

removing the second sacrificial gate structure;

oxidizing the sculpted fin structure so that a plurality of nanowires are formed in the plurality of non-etched portions, respectively; and the plurality of etched portions are oxidized to form oxide; and releasing the plurality of nanowires by removing the oxide.

20. The method of claim 19, wherein:

the fin structure incudes a hard mask layer thereon, and the first sacrificial gate structure is formed over the fin structure with the hard mask layer.

* * * * *